United States Patent
Matsumoto et al.

(10) Patent No.: US 7,504,743 B2
(45) Date of Patent: Mar. 17, 2009

(54) POWER SUPPLY CONTROL DEVICE FOR ON-VEHICLE ELECTRICAL LOADS

(75) Inventors: Shuuiti Matsumoto, Tokyo (JP); Masao Motonobu, Tokyo (JP); Osamu Nishizawa, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 182 days.

(21) Appl. No.: 11/714,864

(22) Filed: Mar. 7, 2007

(65) Prior Publication Data
US 2008/0093924 A1    Apr. 24, 2008

(30) Foreign Application Priority Data
Oct. 24, 2006    (JP)    ............... 2006-288929

(51) Int. Cl.
*B60L 1/00* (2006.01)
(52) U.S. Cl. .................. 307/10.1; 361/87; 361/98; 361/18
(58) Field of Classification Search ............. 307/10.18; 361/98, 18, 101; 318/798
See application file for complete search history.

(56) References Cited

U.S. PATENT DOCUMENTS

| | | | | |
|---|---|---|---|---|
| 5,528,446 A | * | 6/1996 | Sankaran et al. ............. 361/25 |
| 5,994,790 A | * | 11/1999 | Nagashima et al. ........ 307/10.1 |
| 6,127,741 A | * | 10/2000 | Matsuda et al. ............... 307/36 |
| 6,785,106 B2 | * | 8/2004 | Nagata ........................ 361/86 |
| 6,831,433 B2 | * | 12/2004 | Furui ......................... 318/432 |
| 7,282,810 B2 | * | 10/2007 | Yoshida et al. ............... 307/9.1 |

FOREIGN PATENT DOCUMENTS

| JP | 2000-114039 A | 4/2000 |
|---|---|---|
| JP | 2003-75476 A | 3/2003 |

\* cited by examiner

*Primary Examiner*—Albert W Paladini
(74) *Attorney, Agent, or Firm*—Sughrue Mion, PLLC

(57) ABSTRACT

A power supply control device for on-vehicle electric loads is proposed, the control device being capable of detecting breakages at a plurality of electrical loads, a positive side wiring thereof, a negative side wiring thereof, and a commutation circuit. Energization of electrical loads from driving power supply is controlled using switching elements. Anode terminals of commutation diodes connected in parallel with the electrical loads are connected to a load ground by an external common negative line or external individual negative lines. A breakage abnormality at the external common negative line or external individual negative lines is detected by negative line breakage abnormality detection circuit. Load currents at the electrical loads are detected by current detection resistors and current detecting differential amplifier circuits, and it is determined that there is an individual abnormality when a detected current is greatly different from a target current.

17 Claims, 10 Drawing Sheets

POWER SUPPLY CONTROL DEVICE FOR ON-VEHICLE ELECTRICAL LOADS

BACKGROUND OF THE INVENTION

1. Field of the Invention

The present invention relates to a power supply control device for electrical loads used in an on-vehicle electronic control apparatus and, particularly, to a power supply control device which detects any breakage and shorting abnormality of a load power supply circuit for electrical loads connected to a vehicle body at a negative terminal thereof.

2. Description of the Related Art

There are various types of power supply control devices for on-vehicle electrical loads which control an on-off duty factor of a switching element connected between a driving power supply and an electrical load such that a target current to be passed agrees with a current detected by a current detection resistor. For example, such control devices include current control devices for linear solenoids which require a current constantly varying in a wide range and current control devices for fuel injection electromagnetic valves which are kept open by a constant low current after being opened rapidly.

Some of such current control devices employ an internal feedback control method in which a microprocessor generates a target current command and a switching drive command according to a deviation between the target current command a detected current, and others employ an external feedback control method in which a microprocessor only generates a target current command and in which a switching drive command is generated by a deviation integrating circuit provided outside the microprocessor in accordance with a deviation between the target command current and a detected current.

In either control method, a commutation diode is connected in parallel with a series circuit formed by a current detection resistor and an electrical load. When a switching element is turned off, the commutation diode returns a load current which has been passed through the electrical load until that time, whereby the load current is smoothed and the generation of a surge voltage is suppressed.

In any of the current control devices, a ground circuit inside the current control device and a DC driving power supply, which is an on-vehicle battery, are both connected to a vehicle both at negative terminals thereof. A negative terminal of an electrical load may be connected in various ways.

For example, in the case of a current detector for an inductive load disclosed in Patent Document 1 listed below, a switching element is connected to a positive terminal of a linear solenoid constituting an electrical load, and a negative terminal of the electrical load is first led into a current control device and is then connected to a vehicle body outside the current detector through a current detection resistor. An anode terminal of a commutation diode is connected to a ground circuit inside the current detector.

In the case of a linear solenoid fault detector disclosed in Patent Document 2 listed below, a switching element and a current detection resistor are connected to a positive terminal of a linear solenoid constituting an electrical load, and a negative terminal of the electrical load is connected to a vehicle body outside the fault detector. An anode terminal of a commutation diode is connected to a ground circuit inside the fault detector.

Patent Document 1: JP-2003-75476A, in particular, FIG. 1 and abstract

Patent Document 2: JP-2000-114039A, in particular, FIG. 1 and abstract

(01) Explanation of Technical Problems in the Prior Arts

In the case of the current detector disclosed in Patent Document 1, since the current detection resistor is connected to the negative terminal of the electrical load, a problem arises in that connectors are required for a positive pole side wiring for connecting the electrical load to the switching element and for a negative pole side wiring for connecting the load to the current detection resistor.

When there is a shorting fault of the electrical load or a ground fault that is interference or contact between the positive pole side wiring of the electrical load and the vehicle body, an over-current flows through the switching element because of a very small current limiting resistance incorporated in the switching element. Thus, even if the switching element is quickly turned off, a possibility of a temporary over-stress on the switching element still remains.

Further, when there is breakage of a wiring connecting the current detector connected to the negative terminal of the electrical load to the vehicle body or there is a contact failure of a connector, an excessive surge voltage is applied to the interior of the current detector, which can result in breakage of the current detector.

In the case of the fault detector disclosed in Patent Document 2, the number of wirings for the electrical load is reduced. In addition, even when a shorting fault of the electrical load or a ground fault of the positive pole side wiring occurs, the switching element can be safely protected by suppressing any over-current through the switching element with the current detection resistor and quickly turning the switching element off.

However, when the witching element opens, since the load current returned to the commutation diode returns through the ground circuit inside the fault detector, the ground potential in the fault detector can fluctuate to cause erroneous operations attributable to noises.

(02) Object of the Present Invention

It is an object of the invention to suggest a power supply control device for an on-vehicle electrical load which serves as simple measures to provide protection against a shorting fault of the electrical load or and a ground fault of a wiring on a positive pole side of the load and which is configured such that a load current will not be superimposed on an internal ground circuit of a power supply control unit.

SUMMARY OF THE INVENTION

The invention provides a power supply control device for on-vehicle electrical loads, comprising a power supply control unit including a plurality of load power supply circuits for supplying power from a DC driving power supply to a plurality of electrical loads respectively through switching elements, a plurality of load commutation circuits for commutating load currents to the electrical loads, and a power supply control circuit for supplying an energization command output to the switching elements. The load power supply circuits, the load commutation circuits, and the power supply control circuit are contained in a housing of the power supply control unit. The power supply control device is characterized as follows. Commutation diodes are provided in the respective commutation circuits and each of the commutation diodes is connected in parallel with the corresponding electrical load to cause a current which have been flowing through the electrical load to flow back when the switching element of the load power supply circuit is turned off. The commutation diodes are connected to a vehicle body outside the housing separately from an internal ground circuit of the power supply control unit by an external common negative line. The power supply control circuit includes an individual abnormality detection circuit, a negative line breakage abnormality detection circuit, abnormality processing means, and abnormality history storing means. The power supply control circuit is configured by using a microprocessor. The microprocessor is configured to operate in conjunction with a non-volatile program memory in which at least a control program serving as an energization command means for the switching elements is stored, a data memory, a RAM memory for arithmetic processes, and a multi-channel A-D converter. The individual abnormality detection circuit includes a plurality of power supply state detection circuits for detecting amounts of power supplied to the electrical loads and means for determining an individual abnormal state when the amount of power supplied to a certain electrical load among the electrical loads deviates from a target amount of supplied power, the individual abnormal state is either breakage or shorting of at least one of the electrical load, a positive side wiring of the electrical load, a negative side wiring of the electrical load, and the switching element associated with the electrical load. The negative line breakage abnormality detection circuit is a circuit for determining a breakage abnormality of the external common negative line by detecting that an electric potential on an anode side of each commutation diode is different from an electric potential at the internal ground circuit of the power supply control unit. The abnormality processing means is means for stopping the energization command output to the switching elements when at least either an individual abnormality or a breakage abnormality at the external common negative line is detected and for providing a notice of the abnormality. The abnormality history storing means is means for storing and saving the history of occurrence of individual abnormalities and breakage abnormalities at the external common negative line in the data memory with identification of the abnormalities.

In the power supply control device for on-vehicle electrical loads according to the invention, each of the commutation diodes is connected in parallel with the corresponding electrical load and the commutation diodes are connected to the vehicle body outside the power supply control unit separately from the internal ground circuit of the power supply control unit through the external negative line. As a result, neither load current nor commutation current flows to the internal ground circuit of the power supply control unit, which is advantageous in that the electrical potential at the internal ground circuit can be stabilized to allow the power supply control circuit of the power supply control unit to operate with stability. Any breakage abnormality and shorting abnormality at the electrical loads, the positive side wirings thereof, the negative side wirings thereof, and the switching elements is detected by the individual abnormality detection circuit. Any breakage at the external negative line associated with the commutation diodes is detected by the negative line breakage abnormality detection circuit. Measures are taken against those abnormalities, and the abnormalities are identified and stored by the abnormality history storing means. The efficiency of maintenance and inspection can therefore be advantageously improved by reading the history information at the time of maintenance and inspection.

The above-described object, features and advantages of the invention will be more clearly understood from the following detailed description of the invention with reference to the drawings.

DESCRIPTION OF THE PREFERRED EMBODIMENTS

Embodiment 1

(11) Configuration of Embodiment 1

Figure 1:
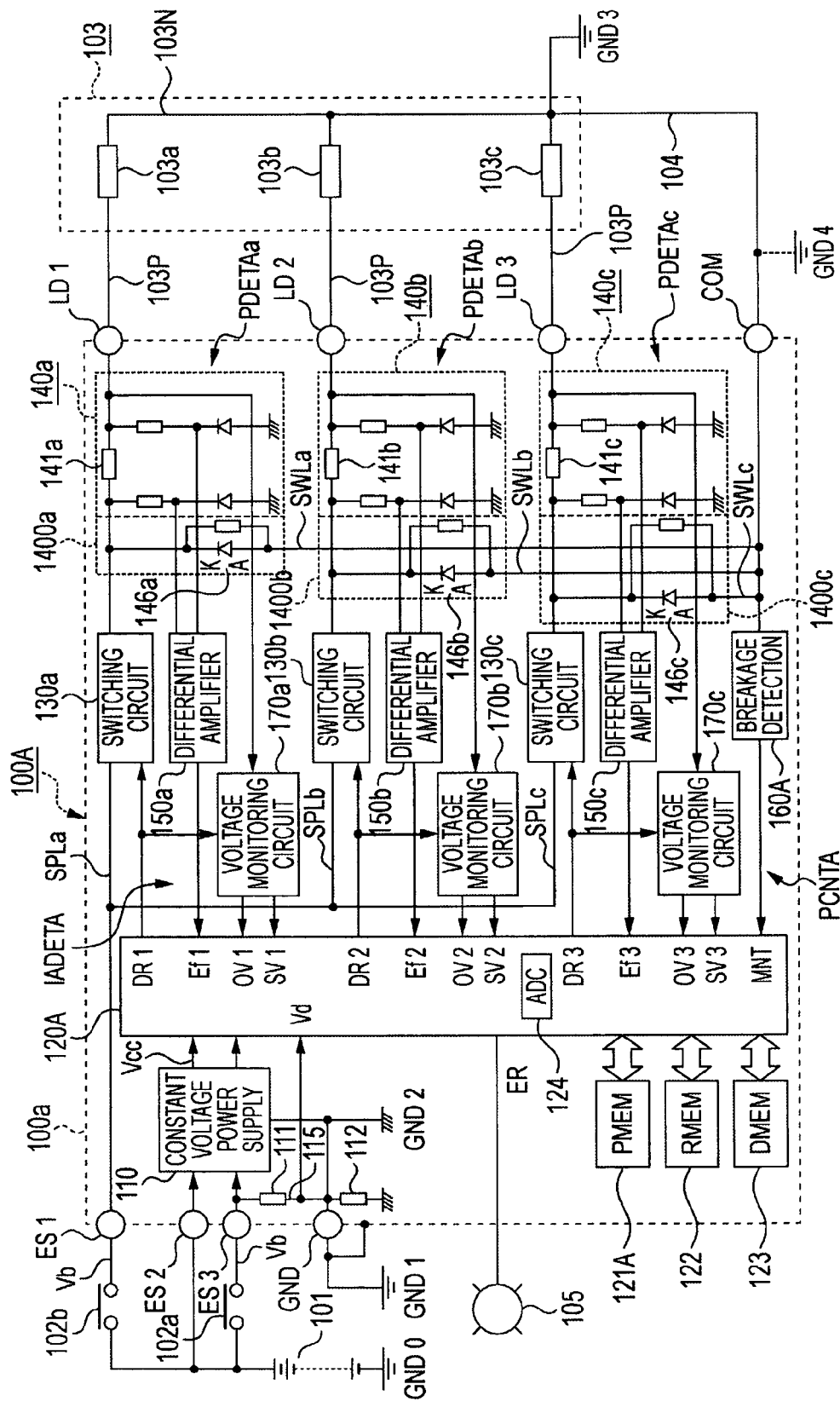
FIG. 1 is a general circuit diagram of Embodiment 1 of a power supply control device for on-vehicle electrical loads according to the invention.

A configuration of Embodiment 1 of a power supply control device for on-vehicle electrical loads according to the invention will now be described. FIG. 1 is a general circuit diagram of the power supply control device for on-vehicle electrical loads in Embodiment 1.

The power supply control device for on-vehicle electrical loads of Embodiment 1 shown in FIG. 1 includes a power supply control unit 100A, a DC driving power supply 101, and a load circuit 103. The DC driving power supply 101 is an on-vehicle battery which generates a driving power supply voltage Vb, for example, in the range from 10 to 16 volts. A negative terminal of the DC driving power supply 101 is connected to a vehicle body at a power supply ground GND0. The term "connection to a vehicle body" means connection to the body of a vehicle or common ground connection at a vehicle. The power supply control unit 100A is supplied with power from the DC driving power supply 101 and controls a group of on-vehicle electric loads. The group of on-vehicle electrical loads includes a load circuit 103. The load circuit 103 includes a plurality of electrical loads which are, for example, electrical loads 103a, 103b, and 103c in FIG. 1. The electrical loads 103a, 103b, and 103c are inductive on-vehicle electrical loads. A negative terminal of each of the electrical loads 103a, 103b, and 103c is connected to the vehicle body at a load ground GND3 through a negative side wiring 103N. The power supply control unit 100A controls supply of power from the DC driving power supply 101 to the electrical loads 103a, 103b, and 103c.

For example, the power supply control unit 100A constitutes a transmission control device for an automobile, and the electrical loads 103a, 103b, and 103c are linear solenoids used in a transmission for an automobile. The power supply control unit 100A includes a microprocessor 120A as a primarily element, controls load currents supplied from the DC driving power supply 101 to the electrical loads 103a, 103b, and 103c using energization command outputs DR1 to DR3, and drives an alarm indicator 105 for providing a notice of an abnormality using an abnormality notice output ER.

A group of inputs from switches such as sensor switches and operation switches which are not shown is connected to a digital input port of the microprocessor 120A of the power supply control unit 100A through a connector and an interface circuit which are not shown. A group of analog inputs from various analog sensors which are not shown is connected to an analog input port of the microprocessor 120A through a connector and an interface circuit which are not shown. A group of electrical loads such as actuators and indicators which are not shown is connected to an output port of the microprocessor 120A through a connector and an interface circuit which are not shown. The group of electrical loads includes the electrical loads 103a to 103c and the alarm indicator 105 for providing a notice of an abnormality.

The power supply control unit 100A is contained in a sealed housing 100a. The power supply control unit 100A includes a power supply input terminals ES1, ES2, and ES3, a unit ground terminal GND, three load output terminals LD1, LD2, and LD3, a common terminal COM, and an internal ground circuit GND2. The power supply input terminals ES1 to ES3, the unit ground terminal GND, the load output terminals LD1 to LD3, and the common terminal COM are disposed in the housing 100a, the elements being electrically insulated from the housing 100a.

The power supply input terminal ES1 is connected to a positive terminal of the DC driving power supply 101 through a load power supply relay contact 102b and supplied with power from the DC driving power supply 101 through the load power supply relay contact 102b. The power supply input terminal ES2 is directly connected to the positive terminal of the DC driving power supply 101. The power supply input terminal ES3 is connected to the positive terminal of the DC driving power supply 101 through a power supply switching relay contact 102a. The unit ground terminal GND is connected to the housing 100a and connected to the vehicle body along with the housing 100a at the unit ground GND1. The load output terminals LD1, LD2, and LD3 are directly connected to positive terminals of the electrical loads 103a, 103b, and 103c through positive side wirings 103P of the respective loads. Negative terminals of the electrical loads 103a, 103b, and 103c are connected to the vehicle body at the load ground GND3 through negative side wirings 103N of the loads. The common terminal COM is commonly connected with negative pole side wirings 103N of the electrical loads 103a to 103c by an external negative line, which is an external common negative line 104 in Embodiment 1, and the common terminal is connected to the vehicle body at the load ground GND3. The internal ground circuit GND2 is a common ground circuit which extends inside the power supply control unit 100A and which is disposed, for example, on a circuit substrate forming part of the power supply control unit 100A.

Instead of extending the external common negative line 104 from the common terminal COM to the negative pole side wirings 103N and connecting them, the wirings may be connected to the vehicle body at a separated ground GND4 provided in the vicinity of the common terminal COM through a shorter external common negative line 104. In this case, connection between the separated ground GND4 and the load ground GND3 is established by the vehicle body. The distance between the separated ground GND4 and the load ground GND3 is smaller than the distance between the separated ground GND4 and the unit ground GND2. As a result, resistance between the separated ground GND4 and the load ground GND3 is smaller than resistance between the separated ground GND4 and the unit ground GND2, and fluctuations of an electric potential at the vehicle body attributable to commutation at the electrical loads 103a to 103c can therefore be kept small.

A load power supply circuit SPLa and a load commutation circuit SWLa are formed in association with the electrical load 103a. Similarly, load power supply circuits SPLb and SPLc and load commutation circuits SWLb and SWLc are formed in association with the electrical loads 103b and 103c, respectively. The load power supply circuits SPLa, SPLb, and SPLc are circuits for supplying power from the DC driving power supply 101 to the electrical loads 103a, 103b, and 103c. In the power supply control unit 100A, the load power supply circuit SPLa is formed between the power supply input terminal ES1 and the load output terminal LD1; the load power supply circuit SPLb is formed between the power supply input terminal ES1 and the load output terminal LD2; and the load power supply circuit SPLc is formed between the power supply input terminal ES1 and the load output terminal LD3. The load commutation circuits SWLa, SWLb, and SWLc are commutation circuits for commutating a load current flowing through the electrical loads 103a, 103b, and 103c when the load current is interrupted. In the power supply control unit 100A, the load commutation circuit SWLa is formed between the load power supply circuit PSLa and the common terminal COM; the load commutation circuit SWLb is formed between the load power supply circuit SPLb and the common terminal COM; and the load commutation circuit SWLc is formed between the load power supply circuit SPLc and the common terminal COM.

The power supply control unit 100A incorporates a power supply control circuit PCNTA in addition to the load power supply circuits SPLa to SPLc and the load commutation circuits SWLa to SWLc. The power supply control circuit PCNTA is primarily constituted by the microprocessor 120A. The power supply control circuit PCNTA includes a control power supply circuit 110, switching circuits 130a to 130c, commutation circuits 1400a to 1400c, individual abnormality detection circuit IADETA, and a negative line breakage abnormality detection circuit 160A. The individual abnormality detection circuit IADETA detects individual abnormalities at the electrical loads 103a to 103c, and the negative line breakage abnormality detection circuit 160A detects abnormalities at the external common negative line 104.

The switching circuits 130a to 130c are disposed at the load power supply circuits SPLa to SPLc, respectively. The switching circuit 130a is connected in series with the electrical load 103a to the load power supply circuit SPLa provided between the power supply input terminal ES1 and the load output terminal LD1 to control a load current at the electrical load 103a. The switching circuit 130b is connected in series with the electrical load 103b to the load power supply circuit SPLb provided between the power supply input terminal ES1 and the load output terminal LD2 to control a load current at the electrical load 103b. The switching circuit 130c is connected in series with the electrical load 103c to the load power supply circuit SPLc provided between the power supply input terminal ES1 and the load output terminal LD3 to control a load current at the electrical load 103c.

The individual abnormality detection circuit IADETA is constituted by power supply state detection circuits PDETAa to PDETAc provided in association with the electrical loads 103a to 103c, respectively, and the microprocessor 120A. The power supply state detection circuit PDETAa associated with the electrical load 103a includes a current detection circuit 140a, a current detecting differential amplifier circuit 150a, and a load voltage monitoring circuit 170a. Similarly, the power supply state detection circuits PDETAb and PDETAc associated with the electrical loads 103b and 103c include current detection circuits 140b and 140c, current detecting differential amplifier circuits 150b and 150c, and load voltage monitoring circuits 170b and 170c, respectively.

The current detection circuits 140a to 140c include current detection resistors 141a to 141c. The current detection resistor 141a is connected in series with the electrical load 103a to the load power supply circuit SPLa provided between the switching circuit 130a and the load output terminal LD1 to detect the load current at the electrical load 103a. The current detection resistor 141b is connected in series with the electrical load 103b to the load power supply circuit SPLb provided between the switching circuit 130b and the load output terminal LD2 to detect the load current at the electrical load 103b. The current detection resistor 141c is connected in series with the electrical load 103c to the load power supply circuit SPLc provided between the switching circuit 130c and the load output terminal LD3 to detect the load current at the electrical load 103c. Details of the current detection circuit 140a will be described later with reference to FIG. 2.

The load commutation circuit SWLa is formed between a point of connection between the switching circuit 130a and the current detection resistor 141a and the common terminal COM. The load commutation circuit SWLb is formed between a point of connection between the switching circuit 130b and the current detection resistor 141b and the common terminal COM. The load commutation circuit SWLc is formed between a point of connection between the switching circuit 130c and the current detection resistor 141c and the common terminal COM.

The commutation circuits 1400a to 1400c are disposed in the load commutation circuits SWLa to SWLc, respectively. The commutation circuit 1400a includes a commutation diode 146a. The commutation diode 146a is connected in parallel with the series circuit formed by the current detection resistor 141a and the electrical load 103a to commutate the load current flowing through the electrical load 103a. The commutation circuit 1400b includes a commutation diode 146b. The commutation diode 146b is connected in parallel with the series circuit formed by the current detection resistor 141b and the electrical load 103b to commutate the load current flowing through the electrical load 103b. The commutation circuit 1400c includes a commutation diode 146c. The commutation diode 146c is connected in parallel with the series circuit formed by the current detection resistor 141c and the electrical load 103c to commutate the load current flowing through the electrical load 103c. The commutation diodes 146a to 146c are connected to the common terminal COM at respective anode terminals A and connected to the load power supply circuits SPLa, SPLb, and SPLc at respective cathode terminals K. Details of the commutation circuit 1400a will be described later with reference to FIG. 2.

The microprocessor 120A of the power supply control circuit PCNTA is supplied with power from the control power supply circuit 110. The control power supply circuit 110 is connected to the power supply input terminals ES2 and ES3. The power supply input terminal ES2 is directly connected to the positive terminal of the DC driving power supply 101, and the power supply input terminal ES3 is connected to the positive terminal of the DC driving power supply 101 through the power supply switching relay contact 102a. The control power supply circuit 110 generates a DC voltage Vcc of, for example, 5.0 volts and supplies it to the microprocessor 120A when the power supply switching relay contact 102a is on. When the power supply switching relay contact 102a is turned off, the circuit 110 generates a DC voltage of, for example, 2.8 volts and supplies it to a partial area of a RAM memory 122, no power being supplied to the microprocessor 120A.

The control power supply circuit 110 is connected to the internal ground circuit GND2 of the power supply control unit 100A. The circuit connecting the control power supply circuit 110 to the internal ground circuit GND2 is connected to the unit ground terminal GND. The unit ground terminal GND is also connected to the housing 100a and connected to the vehicle body through the ground GND1. Voltage dividing resistors 111 and 112 are connected in series with the power supply input terminal ES2. The voltage dividing resistors 111 and 112 form a power supply voltage measuring circuit 115 for the DC driving power supply 101, and a driving power supply voltage Vd measured by the same is supplied to the microprocessor 120A.

The microprocessor 120A is bus-connected to a non-volatile program memory 121A constituted by, for example, a non-volatile flash memory which can be electrically erased at once to allow writing and which can be read, a RAM memory 122 for arithmetic processes, a data memory 123 constituted by a non-volatile EEPROM which can be electrically written and read byte by byte, and a multi-channel A-D converter 124. The microprocessor is configured for mutual cooperation with those elements. The data memory 123 may be configured using part of the non-volatile program memory 121A.

The microprocessor 120A generates the digital energization command outputs DR1 to DR3 and the abnormality notice output ER. The microprocessor 120A receives monitoring voltages Ef1 to Ef3 and the driving power supply voltage Vd as analog inputs and receives alarm signals OV1 to OV3 and alarm signals SV1 to SV3 as digital inputs. The energization command outputs DR1 to DR3 are supplied to the switching circuits 130a to 130c, respectively. The alarm indicator 105 for providing a notice of an abnormality is driven by the abnormality notice output ER.

The switching circuit 130a is turned on/off under control of the energization command output DR1 generated by the microprocessor 120A, and the circuit supplies the electrical load 103a with a load voltage proportionate to an energization duty that is the ratio of the on-time to the on/off period. Similarly, the switching circuits 130b and 130c are turned on/off under control of the energization command outputs DR2 and DR3, respectively, generated by the microprocessor 120A, and the circuits supply the electrical loads 103b and 103c with load voltages proportionate to energization duties that are the ratios of the on-times to the on/off periods thereof. The load currents through the electrical loads 103a to 103c are proportionate to the energization duties of the switching circuits 130a to 130c. Details of the switching circuit 130a will be described later with reference to FIG. 2.

The current detecting differential amplifier circuit 150a of the power supply state detection circuit PDETAa performs differential amplification of a voltage across the current detection resistor 141a and supplies a monitoring voltage Ef1 proportionate to a load current If1 flowing through the electrical load 103a to the analog input port of the microprocessor 120A. Similarly, the current detecting differential amplifier circuits 150b and 150c of the power supply state detection circuits PDETAb and PDETAc perform differential amplification of voltages across the current detection resistors 141b and 141c and supply monitoring voltages Ef2 and Ef3 proportionate to load currents If2 and If3 flowing through the electrical loads 103b and 103c to the analog input port of the microprocessor 120A. Details of the current detecting differential amplifier circuit 150a will be described with reference to FIG. 2.

Based on a program to serve as a negative feedback control means stored in the non-volatile program memory 121A, the microprocessor 120A exercises control to vary the energization duty of the energization command output DR1 such that the amount of supplied power thus detected, which is specifically the load current If1, agrees with the target amount of supplied power which is specifically a target load current Is1. Similarly, control is exercised to vary the energization duties of the energization command outputs DR2 and DR3 such that the detected load currents If2 and If3 agree with target load currents Is2 and Is3, respectively.

The load voltage monitoring circuit 170a monitors the voltage at the load output terminal LD1 to which the positive side wiring 103P of the electrical load 103a is connected, compares the voltage at the load output terminal LD1 with a predetermined threshold voltage, and supplies the alarm signals OV1 and SV1 to the microprocessor 120A. Similarly, the load voltage monitoring circuits 170b and 170c monitor the voltages at the load output terminals LD2 and LD3 to which the positive side wirings 103P of the respective electrical loads 103b and 103c are connected, compares the voltages at the load output terminals LD2 and LD3 with predetermined threshold voltages, and supplies the alarm signals OV1, OV3, SV2, and SV3 to the microprocessor 120A. Details of the load voltage monitoring circuit 170a will be described later with reference to FIG. 2.

The negative line breakage abnormality detection circuit 160A detects breakage of the external common negative line 104 and breakage of the negative line attributable to a contact failure of the common terminal COM and supplies an alarm signal MNT to the microprocessor 120A. Details of the negative line breakage abnormality detection circuit 160A will be described later with reference to FIG. 3.

Figure 2:
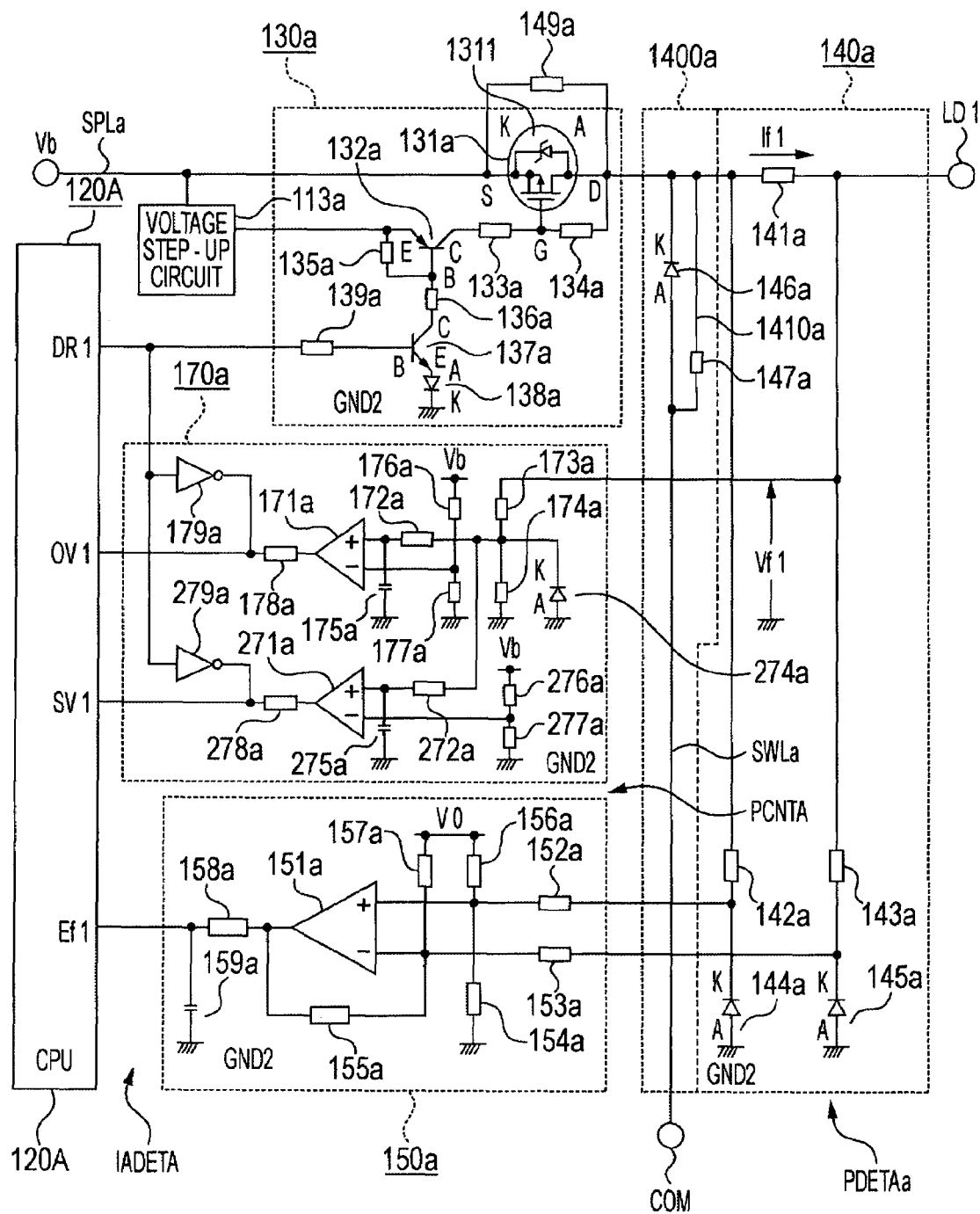
FIG. 2 is a detailed circuit diagram of a major part of Embodiment 1.

FIG. 2 shows details of major parts of the power supply control unit 101A in FIG. 1. Specifically, FIG. 2 shows the load power supply circuit SPLa, the load commutation circuit SWLa, the switching circuit 130a, the commutation circuit 1400a, the current detection circuit 140a, the current detecting differential amplifier circuit 150a, and the load voltage monitoring circuit 170a which are associated with the electrical load 103a. The switching circuits 130b and 130c, the commutation circuits 1400b and 1400c, the current detection circuits 140b and 140c, the current detecting differential amplifier circuits 150b and 150c, and the load voltage monitoring circuits 170b and 170c associated with the electrical loads 103b and 103c are configured similarly to the switching circuit 130a, the commutation circuit 1400a, the current detection circuit 140a, the current detecting differential amplifier circuit 150a, and the load voltage monitoring circuit 170a, respectively.

Referring to FIG. 2, the switching circuit 130a comprises the switching element 131a as a primary element. In addition to the switching element 131a, the switching circuit 130a includes a PNP transistor 132a, various resistors 133a, 134a, 135a, 136a, and 139a, an NPN transistor 137a, and a block diode 138a. The switching element 131a is a power transistor, and it is specifically constituted by a P-channel field effect CMOS transistor. The driving power supply voltage Vb is applied to a source terminal S of the switching element 131a, and a drain terminal D of the element is connected to the load output terminal LD1 through the current detection resistor 141a. A voltage clamping diode 1311 is connected between the source terminal S and the drain terminal D of the switching element 131a. The voltage clamping diode 1311 is a constant voltage diode whose anode terminal A is connected to the drain terminal D of the switching element 131a and whose cathode terminal K is connected to the source terminal S of the switching element 131a, the diode suppressing the voltage at the switching element 131a when the element is off. A leakage resistor 149a having a high resistance is further connected between the source terminal S and the drain terminal D of the switching element 131a. The leakage resistor 149a supplies the electrical load 103a with such a very small load current that the electrical load 103a is not activated when the switching element 131a is off.

An emitter terminal E of the PNP transistor 132a is connected to an output terminal of a voltage step-up circuit 113a including a charge-pump circuit which is supplied with driving power supply voltage Vb. A collector terminal C of the transistor is connected to a gate terminal G of the switching element 131a through a collector resistor 133a. A gate resistor 134a is connected between the gate terminal G and the drain terminal D of the switching element 131a. A stabilizing resistor 135a for off-state is connected between the emitter terminal E and a base terminal B of the PNP transistor 132a. The base terminal B is connected to a collector terminal C of the NPN transistor 137a through a base resistor 136a.

An emitter terminal E of the NPN transistor 137a is connected to the internal ground terminal GND2 of the power supply control unit 100A through the block diode 138a. The energization command output DR1 from the microprocessor 120A is supplied to a base terminal B of the NPN transistor 137a through the driving resistor 139a. When the energization command output DR1 becomes a logical level "H", the NPN transistor 137a, the PNP transistor 132a, and the switching element 131a are turned on. When the energization command output DR1 becomes a logical level "L", those elements are turned off. A leakage resistor 149a having a high resistance is parallel-connected between the source terminal S and the drain terminal D of the switching element 131a to supply a very small load current to the electrical load 103a even when the switching element 131a is off.

A bypass resistor 147a is connected in parallel with the commutation diode 146a of the commutation circuit 1400a. The bypass resistor 147a forms a load voltage dividing circuit 1410a in combination with the leakage resistor 149a connected between the source terminal S and the drain terminal D of the switching element 131a.

The current detection circuit 140a includes the current detection resistor 141a as a primary element. In addition to the current detection resistor 141a, the current detection circuit 140a includes a first series resistor 142a, a third series resistor 143a, and first and second negative voltage suppressing diodes 144a and 145a. A positive potential side of the current detection resistor 141a is connected to the internal ground circuit GND2 through a series circuit formed by the first series resistor 142a and the first negative voltage suppressing diode 144a. A negative potential side of the current detection resistor 141a is connected to the internal ground circuit GND2 through a series circuit formed by the third series resistor 143a and the second negative voltage suppressing diode 145a. The first and second negative voltage suppressing diodes 144a and 145a are connected to the internal ground circuit GND2 at respective anode terminals A and are connected to the first series resistor 142a and the third series resistor 143a at respective cathode terminals K. The cathode terminal K of the commutation diode 146a is connected to the positive potential side of the current detection resistor 141a, and the anode terminal A of the commutation diode 146a is connected to the common terminal COM.

The current detecting differential amplifier circuit 150a includes a differential amplifier 151a as a primary element, the differential amplifier operating on the control power supply voltage Vcc output from the control power supply circuit 110 as a power supply voltage of the same. In addition to the differential amplifier 151a, the differential amplifier circuit 150a includes various resistors 152a, 153a, 154a, 155a, 156a, 157a, and 158a, and a smoothing capacitor 159a. A non-inverting input of the differential amplifier 151a is connected to the positive potential side of the current detection resistor 141a through the second series resistor 152a and the first series resistor 142a of the current detection circuit 140a. An inverting input of the differential amplifier 151a is connected to the negative potential side of the current detection resistor 141a through a fourth series resistor 153a and the third series resistor 143a of the current detection circuit 140a.

A combined resistance R2 provided by the first series resistor 142a and the second series resistor 152a connected in series with each other and a combined resistance R3 provided by the third series resistor 143a and the fourth series resistor 153a connected in series with each other are designed to have theoretical design values that satisfy R2=R3. The non-inverting input of the differential amplifier 151a is connected to the internal ground circuit GND2 through the voltage dividing resistor 154a which has a resistance R4, and the inverting input of the differential amplifier 151a is connected to an output terminal of the differential amplifier 151a through the negative feedback resistor 155a which has a resistance R5. The resistances R4 and R5 have theoretical design values that satisfy R4=R5.

A bias voltage V0 is applied to the non-inverting input of the differential amplifier 151a through the bias resistor 156a which has a resistance R6, and the bias voltage V0 is applied to the inverting input of the differential amplifier 151a through the bias resistor 157a which has a resistance R7. The resistances R6 and R7 have theoretical design values that satisfy R6=R7. The bias voltage V0 is a predetermined positive voltage applied to each input terminal of the differential amplifier 151a to offset a negative voltage of about 1 volt applied by the commutation diode 146a to each input terminal of the differential amplifier 151a. The output terminal of the differential amplifier 151a is connected to the analog input port of the microprocessor 120A through the output terminal 158a. The smoothing capacitor 159a is charged from the output resistor 158a to form a smoothing circuit.

The value of the monitoring voltage Ef1 that is an output voltage from the differential amplifier circuit 150a having such a configuration and the value of the load current If1 satisfy the relationship expressed by Expression (1) shown below. Similarly to the current detecting differential amplifier circuit 150a shown in FIG. 2, the current detecting differential amplifier circuits 150b and 150c generates monitoring voltages Ef2 and Ef3 as expressed by Expressions (2) and (3) below and input them to the microprocessor 120A.

$$Ef1 = R1 \times (R5/R3) \times If1 \quad (1)$$

$$Ef2 = R1 \times (R5/R3) \times If2 \quad (2)$$

$$Ef3 = R1 \times (R5/R3) \times If3 \quad (3)$$

where R1 represents the resistance of the current detection resistors 141a, 141b, and 141c; R5 represents the resistance of the negative feedback resistor 155a; and R3 represents the combined series resistance of the third and fourth series resistors 143a and 153a.

The load voltage monitoring circuit 170a includes the first and second comparison/determination circuit 171a and 271a as primary elements. In addition to the first and second comparison/determination circuits 171a and 271a, the load voltage monitoring circuit 170a includes various resistors 172a, 173a, 174a, 176a, 177a, 178a, 272a, 276a, 277a, and 278a, inverting logic elements 179a and 279a, a clip diode 274a, and smoothing capacitors 175a and 275a. A non-inverting input of the first comparison/determination circuit 171a is connected to a point of connection between the voltage dividing resistors 173a and 174a through the input resistor 172a, and the clip diode 274a is connected in parallel with the resistor 174a of the voltage dividing resistors 173a and 174a which are series-connected with each other. An anode terminal A of the clip diode 274a is connected to the internal ground circuit GND2, and a cathode terminal K of the diode is connected to the point of connection between the voltage dividing resistors 173a and 174a. The other of the pair of voltage dividing resistors 173a and 174a, i.e., the voltage dividing resistor 173a is connected to the load output terminal LD1, and a voltage proportionate to the load voltage Vf1 applied to the electrical load 103a is applied to the voltage dividing resistor 174a. The smoothing capacitor 175a is connected to the non-inverting input of the first comparison/determination circuit 171a. An inverting input of the first comparison/determination circuit 171a is connected to a point of connection between the voltage dividing resistors 176a and 177a for setting a first threshold voltage proportionate to the driving power supply voltage Vb.

A design satisfying Expression (4) shown below is employed where R173 and R174 represent the resistances of the voltage dividing resistors 173a and 174a, respectively; R176 and R177 represent the resistances of the voltage dividing resistors 176a and 177a, respectively; R149 represents the resistance of the leakage resistor 149a; and R147 represents the resistance of the bypass resistor 147a.

$$[R147/(R147+R149)] \times [R174/(R174+R173)] > R177/(R177+R176) \quad (4)$$

Therefore, when the switching element 131a is off due to a breakage at the electrical load 103a, the first comparison/determination circuit 171a has an output logical level "H" at which the alarm signal OV1 for a breakage abnormality is generated. An output terminal of the first comparison/determination circuit 171a is connected to an alarm input terminal OV1 of the microprocessor 120A through the output resistor 178a. The inverting logic element 179a is driven by the energization command output DR1 from the microprocessor 120A, and a logic inversion output of the element is connected to the alarm input terminal OV1.

When there is no breakage at the electrical load 103a connected to the load output terminal LD1, the load voltage during an off-time of the switching element 131a is very small, and the output of the first comparison/determination circuit 171a is at the logical level "L". However, in case there is a breakage at the electrical load 103a or in case there is a breakage at the positive side wiring 103P or negative side wiring 103N of the electrical load 103a, the driving power supply voltage Vb divided by the load dividing circuit 1410a or the leakage resistor 149a and the bypass resistor 147a is applied to the load output terminal LD1. As a result, the output logical level of the first comparison/determination circuit 171a becomes "H", and the alarm signal OV1 inputs the occurrence of the breakage abnormality to the microprocessor 120A. When the logical level of the energization command output DR1 is "H" and the switching element 131a is on, the logical level of the alarm signal OV1 does not become "H" because of the inverting logic element 179a.

A non-inverting input of the second comparison/determination circuit 271a is connected to the point of connection between the voltage dividing resistors 173a and 174a through the input resistor 272a, and the smoothing capacitor 275a is connected to the non-inverting input of the second comparison/determination circuit 271a. An inverting input of the second comparison/determination circuit 271a is connected to the point of connection between the voltage dividing resistors 276a and 277a which set a second threshold voltage proportionate to the driving power supply voltage Vb.

A design satisfying Expression (5) shown below is employed where R276 and R277 represent the resistances of the voltage dividing resistors 276a and 277a.

$$[R174/(R174+R173)]>R277/(R277+R276) \quad (5)$$

Therefore, when a shorting abnormality occurs at the switching element 131a or when the positive side wiring 103P is in contact with a power supply line connected to the positive terminal of DC driving power supply 101, the second comparison/determination circuit 271a has an output logical level "H" at which the alarm signal SV1 for a shorting abnormality is generated.

An output terminal of the second comparison/determination circuit 271a is connected to an alarm input terminal SV1 of the microprocessor 120A through the output resistor 278a. The inverting logic element 279a is driven by the energization command output DR1 from the microprocessor 120A, and a logic inversion output of the element is connected to the alarm input terminal SV1.

When there is no breakage at the electrical load 103a connected to the load output terminal LD1, the load voltage during an off-time of the switching element 131a is very small, and the output of the second comparison/determination circuit 271a is at the logical level "L". However, in case there is a power line shorting that the positive side wiring 103P of the electrical load 103a is contacted to the power supply line connected to the positive terminal of the driving power supply 101 and in case the switching element 131a has a shorting abnormality, a voltage substantially equal to the driving power supply voltage Vb is applied to the load output terminal LD1. As a result, the output logical level of the second comparison/determination circuit 271a becomes "H", and the alarm signal SV1 inputs the occurrence of the power line shorting or the shorting abnormality of the switching element 131a to the microprocessor 120A. However, when the logical level of the energization command output DR1 is "H" and the switching element 131a is on, the logical level of the alarm signal SV1 does not become "H" because of the inverting logic element 279a.

Figure 3:
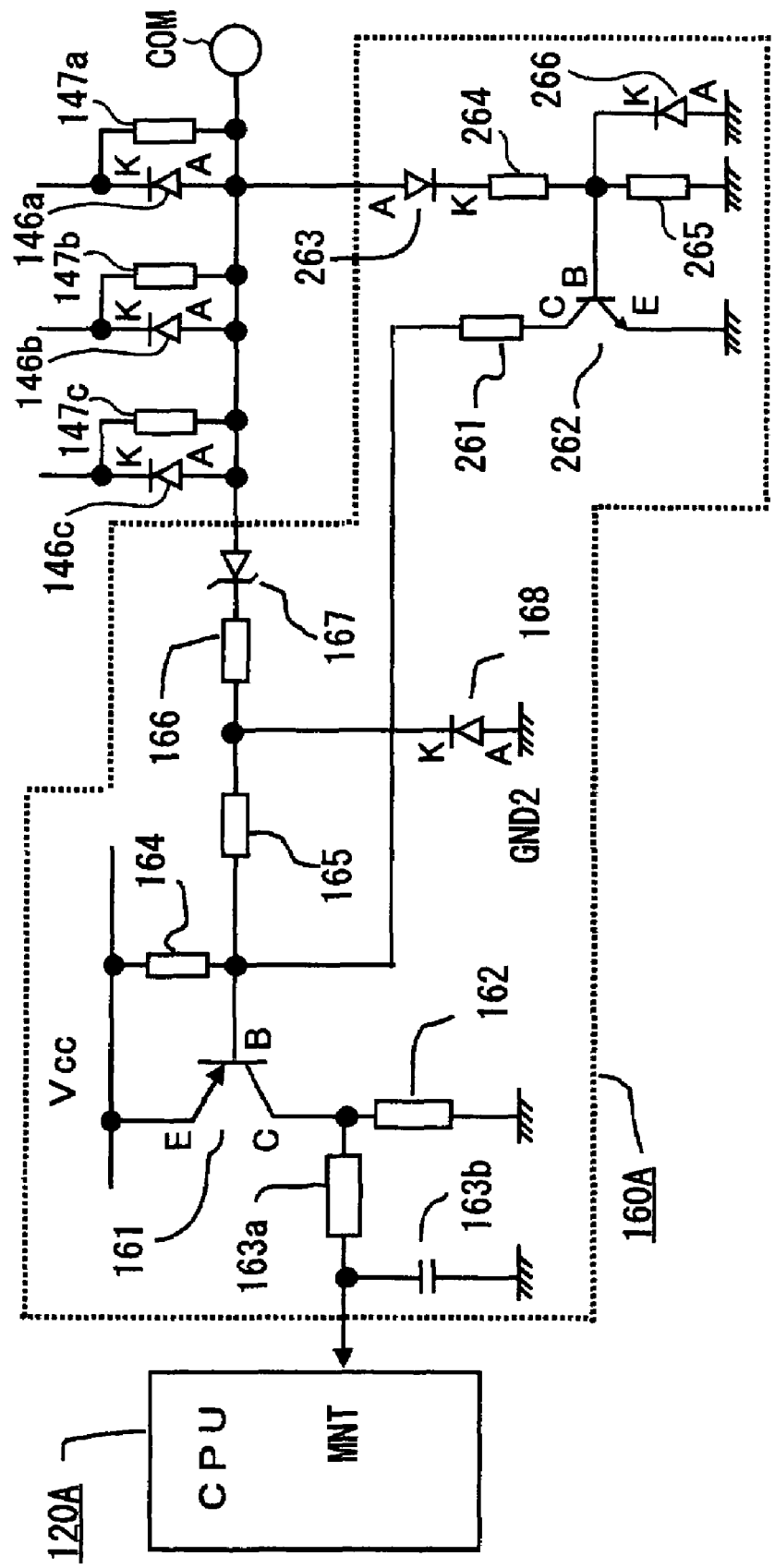
FIG. 3 is a detailed circuit diagram of a negative line breakage abnormality detection circuit in Embodiment 1.

The negative line breakage abnormality detection circuit 160A in FIG. 1 will now be described with reference to FIG. 3. Referring to FIG. 3, the negative line breakage abnormality detection circuit 160A includes a determination element 161 constituted by a PNP transistor which is supplied with the control power supply voltage Vcc. A collector terminal C of the determination element 161 is connected to the internal ground circuit GND2 through a collector resistor 162 and connected to the alarm signal terminal MNT of the microprocessor 120A through an output resistor 163a. An integrating capacitor 163b is charged from the output resistor 163a to form a smoothing circuit. A stabilizing resistor 164 for off-state is connected between an emitter terminal E and a base terminal B of the determination element. The base terminal B of the determination element 161 is connected to the common terminal COM through a base resistor 165 and, a current-limiting resistor 166, and a constant voltage diode 167, and the anode terminals A of commutation diodes 146a, 146b, and 146c are connected to the common terminal COM.

An energization operating voltage of the constant voltage diode 167 is a voltage which is lower than the suppressed voltage of the switching elements 131a, 131b, and 131c during an off-time thereof attributable to the voltage clamping diodes 1311 and which is higher than the control power supply voltage Vcc. An anode terminal A of a clip diode 168 is connected to the internal ground circuit GND2, and a cathode terminal K of the diode is connected to a point of connection between the base resistor 165 and the current-limiting resistor 166.

When there is a breakage at the external common negative line 104 connected to the common terminal COM, e.g., when the switching element 131a changes from on to off, the determination element 161 is caused to be conducting by a surge current which flows from the power supply line of the control power supply voltage Vcc to the load output terminal LD1 via an emitter/base circuit of the determination element 161, the base resistor 165, the current-limiting resistor 166, the constant voltage diode 167, the commutation diode 146a, and the current detection resistor 141a. The element thus changes the logical level of the alarm signal MNT to "H" to input the occurrence of the negative line breakage abnormality.

A series circuit formed by a driving resistor 261 and a driving transistor 262 is connected to a base circuit of the determination element 161. The driving transistor 262 is an NPN transistor. A series circuit formed by a block diode 263 and a detection resistor 264 is connected to a base circuit of the driving transistor 262, and a stabilizing resistor 265 for off-state and a clip diode 266 are connected between a base terminal B and an emitter terminal E of the driving transistor 262. An anode terminal A of the block diode 263 is connected to the common terminal COM, and a cathode terminal K of the diode is connected to the detection resistor 264. An anode terminal A of the clip diode 266 is connected to the internal ground circuit GND2, and a cathode terminal K of the diode is connected to the base terminal B of the driving transistor 262.

When a breakage occurs at the external common negative line 104 connected to the common terminal COM with any of the switching elements 131a, 131b, and 131c in the on-state, the transistor 262 is turned on through any of the bypass resistors 147a, 147b, and 147c and the detection resistor 264, the determination element 161 is turned on accordingly to change the logical level of the alarm signal MNT to "H". Therefore, the determination element 161 generates the alarm signal MNT by detecting negative electric potentials generated at the anode terminals A of the commutation diodes 146a, 146b, and 146c when the load currents to the electrical loads 103a, 103b, and 103c are interrupted or detecting positive electric potentials generated at the anode terminals A of the commutation diodes 146a, 146b, and 146c by the bypass resistors 147a, 147b, and 147c during a period in which the switching elements 131a, 131b, and 131c are on. When the common terminal COM is properly connected to the vehicle body by the external common negative line 104, no electric potential is generated at the anode terminals A of the commutation diodes 146a, 146b, and 146c, and the logical level of the alarm signal MNT generated by the determination element 161 is "L" which indicates a normal state.

(12) Effects and Operations of Embodiment 1

Effects and operations of Embodiment 1 of the invention shown in FIGS. 1 to 3 will now be described.

Referring to FIG. 1, when a power supply switch which is not shown is turned on, the power supply switching relay contact 102a is turned on to apply the driving power supply voltage Vb to the control power supply circuit 110, and the control power supply circuit 110 generates the control power supply voltage Vcc and supplies it to the microprocessor 120A. When the microprocessor 120A starts operating, the load power supply relay contact 102b is turned on by an energization circuit which is not shown.

Based on an operation control program stored in the non-volatile program memory 121A, the microprocessor 120A determines which of the electrical loads in the electrical load circuit 103 is to be supplied with a load current and determines the amount of the load current and thereafter exercises control over the load current based on a control program to serve as a negative feedback control means stored in the non-volatile program memory 121A.

A description will now be made on an operation performed by the negative feedback control means to control the load current If1 at the electrical load 103a. Operations for controlling the load currents If2 and If3 at the electrical loads 103b and 103c are similar to the operation for controlling the load current at the electrical load 103a. The negative feedback control means controls the turning on/off of the switching element 131a by generating the energization command output DR1 having a variable duty γ1 in accordance with an integrated value of a deviation between the energization target current Is1 for the electrical load 103a and the load current If1 detected by the current detecting differential amplifier circuit 150a.

The load current If1 flows through the load power supply circuit SPLb when the switching element 131a is on. Specifically, the current starts from the positive terminal of the DC driving power supply 101 and arrives at the vehicle body through the load power supply relay contact 102b, power supply input terminal ES1, the switching element 131a, the current detection resistors 141a, the load output terminal LD1, the positive side wiring 103P, the electrical load 103a, the negative side wiring 103N and the load ground GND3, and then flows from the vehicle body to a path arriving at the negative terminal of the DC driving power supply 101 through the power supply ground GND0. In this case, the load current If1 does not flow to the internal ground circuit GND2 in the power supply control unit 100A at all.

The load current If1 flows through the load commutation circuit SWLa when the switching element 131a is off. Specifically, the current starts from the negative terminal of the electrical load 103a and circulates through a path formed by the negative side wiring 103N, the external common negative line 104, the common terminal COM, the commutation diode 146a, the current detection resistor 141a, the load output terminal LD1, and the positive side wiring 103P back to the positive terminal of the electrical load 103a. In this case again, the load current If1 does not flow to the internal ground circuit GND2 of the power supply control unit 100A at all. When the external common negative line is connected to the vehicle body at the position of the separated ground GND4 provided in the vicinity of the common terminal COM of the power supply control unit 100A instead of extending the line to the position of the load ground GND3, the vehicle body is used instead of the external common negative line 104 as a path for energization extending from the load ground GND3 up to the separated ground GND4. In this case again, the load current If1 does not flow to the internal ground circuit GND2 in the power supply control unit 100A at all.

Let us now assume that the common terminal COM and the external common negative line 104 are not provided and that the anode terminal A of the commutation diode 146a is connected to the internal ground circuit GND2 of the power supply control unit 100A. Referring to the path of circulation of the load current If1 commutated when the switching element 131a is off, the current starts from the negative terminal of the electrical load 103a and circulates through a path formed by the negative side wiring 103N, the load ground GND3, the unit ground terminal GND1, the internal ground circuit GND2, the commutation diode 146a, the current detection resistor 141a, the load output terminal LD1, and the positive side wiring 103P back to the positive terminal of the electrical load 103a. In this case, a problem arises in that a commutation surge current flows into the internal ground circuit GND2 of the power supply control unit 100A to cause fluctuations of the electric potential at the internal ground circuit GND2.

In Embodiment 1, the anode terminals A of the commutation diodes 146a to 146c of the commutation circuits 1400a to 1400c are connected to the common terminal COM, and the common terminal COM is connected to the vehicle body outside the power supply control unit 100A, which makes it possible to prevent the load currents If1, If2, and If3 from flowing into the internal ground circuit GND2 of the power supply control unit 100A. On the contrary, when there is a contact failure of the common terminal COM or a breakage abnormality at the external common negative line 104, the commutating function of the commutation diodes 146a, 146b, and 146c is deteriorated, which results in another problem in that an induced surge voltage is generated by inductive components of the electrical loads 103a, 103b, and 103c when the switching elements 131a, 131b, and 131c are turned off.

The induced surge voltage is suppressed to, for example, about 50 volts by the voltage clamping diodes 1311 for suppressing an off-voltage provided at the switching elements 131a, 131b, and 131c. However, the suppressed surge voltage will be applied to all internal circuits of the power supply control unit 100A which are connected between the internal ground circuit GND2 and the load output terminals LD1, LD2, and LD3.

In the switching circuit 130a shown in FIG. 2, the block diode 138a associated with the switching element 131a blocks a countercurrent attributable to the suppressed surge voltage. In the current detection circuit 140a, the first and second negative voltage suppressing diodes 144a and 145a suppress the input electric potentials of the differential amplifier 151a to negative electric potentials of, for example, about 1 volt that is the forward voltage of the first and second negative voltage suppressing diodes 144a and 145a. The first and third series resistors 142a and 143a suppress a surge current which circulates from the unit ground GND1 to the load output terminal LD1 via the internal ground circuit GND2 and the first or second negative voltage suppressing diode 144a or 145a, thereby suppressing fluctuations of the electric potential at the internal ground circuit GND2.

Similarly, in the load voltage monitoring circuit 170a shown in FIG. 2, the clip diode 274a suppresses the input electric potentials of the first and second comparison/determination circuits 171a and 271a to negative electric potentials of, for example, about 1 volt that is the forward voltage of the clip diode 274a. The voltage dividing resistor 173a suppresses a surge current which circulates, from the unit ground GND1 to the load output terminal LD1 via the internal ground circuit GND2 and the clip diode 274a, thereby suppressing fluctuations of the electric potential at the internal ground circuit GND2. Effects and operations of the elements associated with the electrical loads 103b and 103c are similar to those in the case of the electrical load 103a.

In the negative line breakage abnormality detection circuit 160A shown in FIG. 3, the clip diode 168 suppresses the negative side electric potential of the base resistor 165 to a negative electric potential of, for example, about 1 volt that is the forward voltage of the clip diode 168. The current-limiting resistor 166 and the constant voltage diode 167 suppress a surge current which circulates from the unit ground GND1 to the load output terminal LD1 via the internal ground circuit GND2 and the clip diode 168, thereby suppressing fluctuations of the electric potential at the internal ground circuit GND2. The block diode 263 blocks the circulation of a surge current via the detection resistor 264, whereas the clip diode 266 protects the driving transistor 262.

The operating voltage of the constant voltage diode 167 is a value lower than the surge voltage suppressed by the voltage clamping diode 1311 for suppressing an off-voltage provided at the switching elements 131a, 131b, and 131c and higher than the control power supply voltage Vcc. Therefore, in a normal state, a base current is prevented from flowing to the determination element 161 by the clip diode 168 or the constant voltage diode 167, and the logical level of the alarm signal MNT is therefore "L". However, when there is a breakage at the external common negative line 104 connected to the common terminal COM, the determination element 161 is caused to be conducting by a surge current which flows from the base resistor 165 up to the load output terminal LD1 through the current-limiting resistor 166, the constant voltage diode 167, the commutation diode 146a, and the current detection resistor 141a, and the logical level of the alarm signal MNT becomes "H" to input the occurrence of a breakage abnormality at the negative line. When the switching elements 131a, 131b, and 131c are in the on-state, the determination element 161 is caused to be conducting by the transistor 262 which is energized and driven from the bypass resistors 147a, 147b, and 147c through the block diode 263 and the detection resistor 264.

Figure 4:
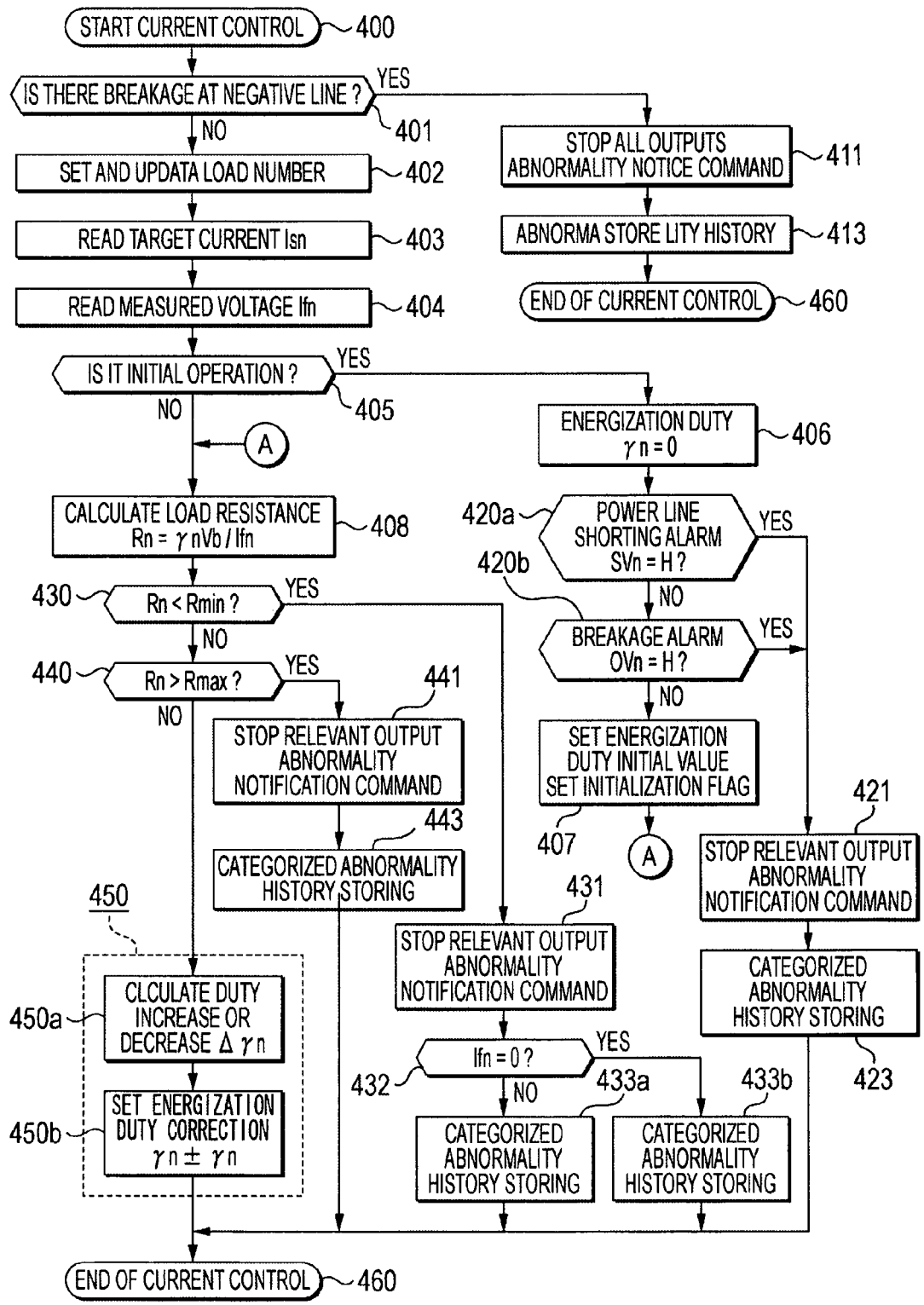
FIG. 4 is a flow chart for explaining operations of Embodiment 1.

FIG. 4 is a flow chart for explaining operations of Embodiment 1. The operations will now be described with reference to FIG. 4. In FIG. 4, step 400 is a step at which load current control forming a part of various control flows of the microprocessor 120A is started. The subsequent step 401 is a step which constitutes a negative line breakage abnormality determination means for determining a breakage abnormality at the negative line, and it is determined at step 401 whether the negative line breakage abnormality detection circuit 160A has detected a breakage abnormality at the negative line by monitoring the state of input of the alarm signal MNT. When a breakage abnormality has occurred at the negative line and the result of the determination at step 401 is therefore YES, the process proceeds to step 411. If the result of the determination at step 401 is NO, the process proceeds to step 402.

Step 411 is a step which constitutes an abnormality processing means and, more specifically, an all output stopping means and an abnormality notification command means. At step 411, all of the energization command outputs DR1, DR2, and DR3 are stopped, and the alarm output ER is generated to activate the alarm indicator 105. The subsequent step 413 is a step which constitutes an abnormality history storing means. Step 413 writes and stores the information of the occurrence of a breakage abnormality at the negative line in the data memory 123. The subsequent step 460 is a current control operation ending step. At step 460, the microprocessor 120A executes control operations other than current control, and the operation starting step 400 is activated again after a predetermined time passes to repeat the series of control operations.

Step 402 is a step which constitutes a load number setting/updating means. At step 402, load numbers n (n=a, b, c, and so on) for a plurality of electrical loads 103a, 103b, 103c, and so on are specified and sequentially updated and specified. The subsequent step 403 is a step which constitutes a target current reading means. At step 403, a target current value Isn associated with an electrical load 103n having a load number n specified at step 402 is read. The target current value Isn is determined based on another control program which is not shown. The subsequent step 404 is a step which constitutes a load current reading means. At step 404, a load current value Ifn of the electrical load 103n detected by a differential amplifier 150n for current detection associated with the load number n specified at step 402 is read. The subsequent step 405 is a step which constitutes an initial operation determination means. At step 405, it is determined whether an initial operation is being performed based on a determination made at a subsequent step 407 on whether an initialization complete flag has been set. When an initial operation is being performed and the result of the determination at step 405 is therefore YES, the process proceeds to step 406. If the result of the determination at step 405 is NO, the process proceeds to step 408.

Step 406 is a step which constitutes a check starting means. At step 406, an energization duty γn of an energization command output DRn associated with the electrical load 103n is nullified to perform an initial check. The subsequent step 420a is a step which constitutes a power line shorting alarm determination means. At step 420a, it is determined by a load voltage monitoring circuit 170n associated with the electrical load 103n specified at step 402 whether an alarm signal SVn has been generated. When the alarm signal SVn has been generated and the result of the determination at step 420a is therefore YES, the process proceeds to step 421. If the result of the determination at step 420a is NO, the process proceeds to step 420b. Step 420b is a step which constitutes a breakage alarm determination means. At step 420b, it is determined by the load voltage monitoring circuit 170n whether an alarm signal OVn has been generated or not. When the alarm signal OVn has been generated and the result of the determination at step 420b is YES, the process proceeds to step 421. If the result of the determination at step 420b is NO, the process proceeds to step 407. Step 421 is a step which constitutes an abnormality processing means, more specifically, a relevant output stopping means and an abnormality notification command means. At step 421, the relevant energization command output DRn associated with the electrical load 103n is stopped, and an alarm output ER is generated to activate the alarm indicator 105. The subsequent step 423 is a step which constitutes an abnormality history storing means, more specifically, a categorized abnormality history storing means. Step 423 writes and stores the information of the generation of the alarm signal SVn or alarm signal OVn in the data memory 123. Specifically, step 423 stores a shorting abnormality at a switching element 131n and a power line shorting abnormality that any of the positive side wirings 103P of the electrical loads 103n is contacted to the power supply line connected to the positive terminal of the DC driving power supply 101 when the logical level of the alarm signal SVn is "H" with the energization command output DRn stopped. When the alarm signal OVn has been generated, a breakage abnormality at any of the electrical load 103n, the positive wiring 103P, and the negative wiring 103N is stored. Step 423 is followed by current control operation ending step 460.

Step 407 is a step which constitutes an initial setting means. At this step, the energization duty γn is set at an initial value γn0, and the initialization complete flag is set. The process then proceeds to step 408. The energization duty γn0 set at step 407 is a value given by Expression (6) shown below where Rc represents the resistance of the electrical load 103n at an average temperature and Vb represents the value of the driving power supply voltage calculated from a measured power supply voltage input Vd.

$$\gamma n0 = Rc \times Isn/Vb \qquad (6)$$

The initialization complete flag set at step 407 is reset when the target current value Isn read at step 403 is zero, and the result of the determination at step 405 is YES when the initialization complete flag has been reset.

Step 408 is a step constituting a load resistance estimation means. At step 408, a load resistance Rn of the electrical load 103n is calculated by Expression (7) shown below based on the current energization duty γn of the specified electrical load 103n, the driving power supply voltage Vb, and the load current value Ifn, the step being followed by step 430.

$$Rn = \gamma n \times Vb/Ifn \qquad (7)$$

Step 430 is a step which constitutes an under-resistance determination means. At step 430, it is determined whether the load resistance Rn calculated at step 408 is an abnormal value which is smaller than a minimum resistance Rmin of the electrical load 103n at low temperatures. When the resistance Rn is smaller than the minimum value Rmin and the result of the determination at step 430 is therefore YES, the process proceeds to step 431. If the result of the determination at step 430 is NO, the process proceeds to step 440. Step 431 is a step which constitutes an abnormality processing means, more specifically, a relevant output stopping means and an abnormality notification command means. At step 431, the relevant energization command output DRn is stopped, and the alarm output ER is generated to activate the alarm indicator 105. The subsequent step 432 is a step which constitutes a confirmative determination means. At step 432, it is determined whether the load current Ifn has become zero as a result of the stoppage of the energization command output DRn at step 431. When the load current Ifn has been properly restored to zero and the result of the determination at step 432 is therefore YES, the process proceeds to step 433b. If the result of the determination at step 432 is NO, the process proceeds to step 433a.

Steps 433a and 433b are steps which constitute an abnormality history storing means, more specifically, a categorized abnormality history storing means. At steps 433a and 433b, abnormality information based on the result of the confirmative determination at step 432 is written and stored in the data memory 123 when an under-resistance is determined at step 430. At step 433a, the occurrence of a shorting abnormality at the switching element 131n in the duration of an energization command to the switching element 131n is recorded as abnormality history information. Abnormality history information recorded at step 433b is the fact that either shorting abnormality at the electrical load 103n or grounding abnormality that is contact between the positive wiring 103P and the vehicle body has occurred and that no shorting abnormality has occurred at the switching element 131n in the duration of the energization command to the switching element 131n. Steps 433a and 433b are followed by current control operation ending step 460.

Step 440 is a step which constitutes an over-resistance determination means. At step 440, it is determined whether the load resistance Rn calculated at step 408 is an abnormal value which is greater than a maximum resistance Rmax of the electrical load 103n at high temperatures. When the resistance Rn is an abnormal value greater than the maximum value Rmax and the result of the determination at step 440 is therefore YES, the process proceeds to step 441. If the result of the determination at step 440 is NO, the process proceeds to step 450a. Step 441 is a step which constitutes an abnormality processing means, more specifically, a relevant output stopping means and an abnormality notification command means. At step 441, the relevant energization command output DRn is stopped, and the alarm output ER is generated to activate the alarm indicator 105. The subsequent step 443 is a step which constitutes an abnormality storing means, more specifically, a categorized abnormality history storing means. At step 443, information of the occurrence of an over-resistance abnormality detected at step 440 is written and stored in the data memory 123. The occurrence of an over-resistance abnormality means that a breakage abnormality at the electrical load 103n, a breakage abnormality at the positive side wiring 103P, a breakage abnormality at the negative side wiring 103N, a power line shorting abnormality at the positive side wiring 103P or a breakage abnormality at the switching element 131n has occurred in the duration of an energization command to the switching element 131n. The occurrence of any of those abnormalities is stored in the data memory 123 as abnormality history information. Step 443 is followed by current control operation ending step 460.

Step 450a is a step which constitutes a correction value calculation means for calculating a correction value Δγn for the current energization duty γn. Step 450a is executed when the resistance is determined to be proper at steps 430 and 440 and the results of the determinations at steps 430 and 440 are both YES. At step 450a, the correction value Δγn for correcting the current energization duty γn by increasing or decreasing the same is calculated according to the sign and magnitude of the deviation between the target current value Isn read at step 403 and the load current value Ifn read at step 404. The subsequent step 450b is a step which constitutes means for setting correction to be made to the current energization duty γn. At step 450b, the correction value Δγn is algebraically added to the current energization duty γn. Processing block 450 formed by steps 450a and 450b constitutes a negative feedback control means.

Step 450b is followed by current control operation ending step 460. At current control operation ending step 460, the microprocessor 120A executes control operations other than current control, and the operation starting step 400 is activated again after a predetermined time passes to repeat the series of control operations.

The control operation flow chart in FIG. 4 will now be schematically described. Step 401 is a step for monitoring the state of input of the alarm signal MNT to determine whether any negative breakage abnormality has been detected by the negative line breakage abnormality detection circuit 160A. The negative line breakage abnormality detection circuit 160A is enabled for abnormality detection when at least one of the plurality of electrical loads 103a to 103c is conducting. At step 413, a code number for a breakage abnormality at the negative line is stored, but no electrical load is specified.

Steps 420a and 420b monitor the state of input of the alarm signals SVn and OVn to determine whether any abnormality has been detected by the load voltage monitoring circuit 170n. The load voltage monitoring circuit 170n is enabled for abnormality detection when the energization command output DRn to the switching element 131n is stopped. At step 423, a code number for a shorting abnormality at the switching element 131n and a code number for a power line shorting abnormality at the positive side wiring 103P of the electrical load 103n are stored when the alarm signal SVn is at the logical level "H", but it can not be specified which of the abnormalities has occurred. At step 423, a code number for a breakage abnormality at the electrical load 103n and a breakage at either the positive side wiring 103P or negative side wiring 103N of the electrical load 103n is stored when the alarm signal OVn is generated but the alarm signal SVn is not generated. The position of the breakage cannot be identified.

Steps 430 and 440 execute abnormality determination using software by monitoring the resistance Rn of the electrical load 103n. Any under-resistance or over-resistance is determined by comparing the resistance Rn with the minimum resistance value Rmin or the maximum resistance value Rmax when the energization command output DRn is generated. A code number for a shorting abnormality at the switching element 131n is stored at step 433a, and a code number for a shorting abnormality at the electrical load 103n and a code number for a grounding abnormality at the positive side wiring 103P of the electrical load 103n are stored at step 433b. It cannot be specified which of a shorting abnormality at the electrical load 103n and a grounding abnormality at the positive side wiring 103P has occurred.

When there is a shorting abnormality at the switching element 131n which disallows the switching element 131n to be turned off, a current higher than the target current value Isn flows through the electrical load 103n. Although the microprocessor 120A decreases the energization duty γn in order to make the current closer to the target current value Isn, the load current Ifn stays at the maximum value instead of being decreased however the energization duty γn is decreased because of the shorting at the switching element 131n. As a result, the value of the estimated load resistance Rn calculated by Expression (7) becomes zero, and it is determined at step 430 that there is an under-resistance. When there is a shorting abnormality at the electrical load 103n or a grounding abnormality that is contact between the positive side wiring 103P and the vehicle body, since the load voltage applied to achieve the target current value Isn abruptly decreases, the microprocessor 120A decreases the energization duty γn. As a result, an abnormal decrease occurs in the value of the estimated load resistance Rn calculated by Expression (7), and it is determined at step 430 that there is an under-resistance.

At step 432 constituting a confirmative determination means, it is determined whether the switching element 131n can be turned off to check whether a shorting abnormality has occurred at the switching element 131n. At step 443, a code number for a breakage abnormality at either the electrical load 103n or the positive side wiring 103P or negative side wiring 103N of the electrical load 103n, a code number for a power line shorting abnormality at the positive side wiring 103P, and a code number for a breakage abnormality at the switching element 131n are stored, but it cannot be specified which of the abnormalities has occurred.

When there is a breakage abnormality as described above, the microprocessor 120A increases the energization duty γn in order to allow the predetermined target current Isn to flow. However, since the load current Ifn stays in the zero-state instead of being increased however the duty is increased, the estimated load resistance Rn given by Expression (7) becomes too large, and it is determined at step 440 that there is an over-resistance. When a power line shorting abnormality at the positive side wiring 103P is occurred, since the load current Ifn is undetectable, the microprocessor 120A increases the energization duty γn in order to the predetermined target current Isn to flow. Since the load current Ifn is undetected and kept in the zero-state however the duty is increased, the estimated load resistance Rn given by Expression (7) becomes too large, and it is determined at step 440 that there is an over-resistance.

Referring to the storage of abnormality history at steps 413, 423, 433a, 433b, and 443, the history is temporarily stored in the RAM memory 122 during the operation of the power supply control unit 100A. When the power supply switch which is not shown is turned off, the load power supply relay contact 102b is immediately turned off, whereas the power supply switching relay contact 102a is broken with a delay. The history data are collectively transferred to the non-volatile data memory 123 during this delayed conducting period.

(13) Summaries and Characteristics of Embodiment 1

Embodiment 1 can be summarized and characterized as follows.

As apparent from the above description, the power supply control device for on-vehicle electrical loads according to Embodiment 1 of the invention is a power supply control device comprising a power supply control unit 100A. The power supply control unit 100A includes a plurality of load power supply circuits SPLa to SPLc (hereinafter represented by SPLn) for supplying power from a DC driving power supply 101 to a plurality of electrical loads 103a to 103c (hereinafter represented by 103n), respectively, through switching elements 131a to 131c (hereinafter represented by 131n), a plurality of load commutation circuits SWLa to SWLc (hereinafter represented by SWLn) for commutating load currents to the electrical loads 103n, and a power supply control circuit PCNTA for supplying energization command outputs DRn to the switching elements 131n. The load power supply circuits SPLn, the load commutation circuits SWLn, and the power supply control circuit PCNTA are contained in a housing 100a of the power supply control unit 100A. The power supply control device is characterized as follows. Commutation diodes 146a to 146c (hereinafter represented by 146n) are provided in the load commutation circuits SWLn, respectively, and the commutation diodes 146n are connected in parallel with the respective electrical loads 103n to cause currents which have been flowing through the electrical loads 103n to flow back when the switching elements 131n of the load power supply circuits SPLn are turned off. The commutation diodes 146n are connected to a vehicle body outside the housing 100a separately from an internal ground circuit GND2 of the power supply control unit 100A by an external common negative line 104. The power supply control circuit PCNTA includes an individual abnormality detection circuit IADETA, a negative line breakage abnormality detection circuit 160A, abnormality processing means 411, 421, 431, and 441, and abnormality history storing means 413, 423, 443, 433a, and 433b. The power supply control circuit PCNTA configured by using a microprocessor 120A. The microprocessor 120A is configured to operate in conjunction with a non-volatile program memory 121A in which at least a control program serving as energization command means for the switching elements 131n is stored, a data memory 123, a RAM memory 122 for arithmetic processes, and a multi-channel A-D converter 124. The individual abnormality detection circuit IADETA includes a plurality of power supply state detection circuits PDETAa to PDETAc (hereinafter represented by PDETAn) for detecting amounts of power, specifically, load currents Ifn supplied to the electrical loads 103n and means for determining an individual abnormal state when the amount of power supplied to a certain electrical load among the electrical loads 103n deviates from a target amount of supplied power. The individual abnormal state is either breakage or shorting of at least one of the electrical load, the positive side wiring 103P of the electrical load, the negative side wiring 103N of the electrical load, and the switching element associated with the electrical load. The negative line breakage abnormality detection circuit 160A is a circuit for determining a breakage abnormality of the external common negative line 104 by detecting that an electric potential on an anode side of each commutation diode 146n is different from an electric potential at the internal ground circuit GND2 of the power supply control unit 100A. The abnormality processing means 411, 421, 431, and 441 are means for stopping the energization command output to the switching elements 131n when at least either an individual abnormality or a breakage abnormality at the external common negative line 104 is detected and for providing a notice of the abnormality. The abnormality history storing means 413, 423, 443, 433a, and 433b are means for discriminating history of occurrence of individual abnormalities and breakage abnormalities at the external common negative line 104 in the data memory 123, the abnormalities being discriminated from each other.

In the power supply control device for on-vehicle electrical loads in Embodiment 1, the commutation diodes 146n connected in parallel with the plurality of electrical loads 103n, respectively, supplied with power from the DC driving power supply 101 through the respective switching elements 131n are connected to the vehicle body outside the housing 100a of the power supply control unit 100A separately from the internal ground circuit GND2 of the power supply control unit 100A by the external common negative line 104. Therefore, neither load current nor commutation current flows to the internal ground circuit GND2 of the power supply control unit 100A, which is advantageous in that the electric potential at the internal ground circuit GND2 can be stabilized to allow the power supply control circuit PCNTA of the power supply control unit 100A to be operated with stability. Breakage abnormalities and shorting abnormalities at the electrical loads 103n, the positive side wirings 103P thereof, the negative side wirings 103N thereof, and the switching elements 131n are detected by the individual abnormality detection circuit IADETA, and breakages at the external common negative line 104 associated with the commutation diodes 146n are detected by the negative line breakage abnormality detection circuit 160A. Measures are taken against those abnormalities, and the abnormalities are identified and stored by the abnormality history storing means 413, 423, 443, 433a, and 433b. Therefore, the efficiency of maintenance and inspection can be advantageously improved by reading history information at the time of maintenance and inspection.

In Embodiment 1, voltage clamping diodes 1311 are connected to the respective switching elements 131n to suppress off-voltages thereof. The negative line breakage abnormality detection circuit 160A includes a series circuit including a constant voltage diode 167 which starts conducting at a voltage lower than the clamping voltage of the voltage clamping diodes 1311, a current limiting resistor 166 connected in series with the constant voltage diode 167, and a clip diode 168 whose anode is connected to the internal ground circuit GND2 of the power supply control unit 100A and a determination element 161 operating in accordance with the state of energization of the series circuit. The series circuit is connected between the internal ground circuit GND2 of the power supply control unit 100A and anode terminals A of the commutation diodes 146n. The determination element 161 detects a breakage at the external common negative line 104 according to an induced surge voltage at the electrical load generated when there is a breakage at the external common negative line 104 by detecting an electric potential at the cathode of the clip diode 168 and supplies an alarm signal MNT to the microprocessor 120A. This configuration is characterized in that a surge current superimposed on the internal ground circuit GND2 of the power supply control unit 100A when there is a breakage at the external common negative line 104 can be suppressed by the current limiting resistor 166 to a very small value to prevent the application of an excessively high surge voltage to the negative line breakage abnormality detection circuit 160A.

In Embodiment 1, bypass resistors 147a to 147c (hereinafter represented by 147n) are connected in parallel with the commutation diodes 146n. The negative line breakage abnormality detection circuit 160A includes a detection resistor 264 which is supplied with power from each of the bypass resistors 147n through a block diode 263 when there is a breakage at the external common negative line 104 with the switching element 131n in an on-state, and the circuit further includes the determination element 161. The determination element 161 determines that a breakage has occurred at the external common negative line 104 based on the fact that the detection resistor 264 has been energized and supplies an alarm signal MNT to the microprocessor 120A. This configuration is characterized in that no excessively high surge voltage is applied to the negative line breakage abnormality detection circuit 160A because a surge current superimposed on the internal ground circuit GND2 of the power supply control unit 100A when there is a breakage at the external common negative line 104 is blocked by the block diode 263.

In Embodiment 1, the anode terminals A of the commutation diodes 146n are connected to the vehicle body outside the housing 100a through the external common negative line 104. A separated ground GND4 connecting the external common negative line 104 to the vehicle body is separated from at least a unit ground GND1 which connects the internal ground circuit GND2 of the power supply control unit 100A to the vehicle body. The distance between a load ground GND3 connecting negative terminals of the electrical loads 103n to the vehicle body and the separated ground GND4 is smaller than the distance between the unit ground GND1 and the separated ground GND4. This configuration is characterized in that the section of the vehicle body through which a commutation surge current attributable to a commutation diode 146n flows can be made short to suppress electric potential fluctuations at the vehicle body.

In Embodiment 1, the power supply state detection circuits PDETAn have current detecting differential amplifier circuits 150a to 150c (hereinafter represented by 150n), respectively. The current detecting differential amplifier circuit 150n is a circuit for amplifying a differential voltage across a current detection resistor 141n connected between a switching element 131n and an electrical load 103n with a differential amplifier 151n to generate a monitoring voltage Efn proportionate to a load current Ifn at the electrical load 103n. A non-inverting input terminal of the differential amplifier 151n is connected to a point of connection between the switching element 131n and the current detection resistor 141n through first and second series resistors 142n and 152n. A first negative voltage suppressing diode 144n is connected between a point of connection between the first and second series resistors 142n and 152n and the internal ground circuit GND2 of the power supply control unit 100A. An inverting input terminal of the differential amplifier 151n is connected to a point of connection between the current detection resistor 141n and the electrical load 103n through third and fourth series resistors 143n and 153n. A second negative voltage suppressing diode 145n is connected between a point of connection between the third and fourth series resistors 143n and 153n and the internal ground circuit GND2 of the power supply control unit 100A. Thus, an excessively high negative voltage applied to the differential amplifier 151n when there is a breakage at the external common negative line 104 for the commutation diodes 146n is suppressed by the first and second negative voltage suppressing diodes 144n and 145n. This configuration is characterized in that damage to the differential amplifier 151n by a surge voltage generated by the electrical load 103n can be prevented when there is a breakage at the external common negative line 104. The configuration is also characterized in that a surge current superimposed on the internal ground circuit GND2 of the power supply control unit 100A when a breakage occurs at the external common negative line 104 can be suppressed to a very small value by the first and third series resistors 142n and 143n.

In Embodiment 1, the power supply state detection circuits PDETAn have load voltage monitoring circuits 170a to 170c (hereinafter represented by 170n), respectively. The load voltage monitoring circuit 170n includes a comparison/determination logic circuit which compares a voltage proportionate to the load voltage Vfn applied to one resistor 174n of a couple of voltage dividing resistors 173n and 174n connected between a point of connection between the current detection resistor 141n and the electrical load 103n and the internal ground circuit GND2 of the power supply control unit 100A with a predetermined threshold and inputs the result of a determination based on the comparison to the microprocessor 120A. A clip diode 274n connected to the internal ground circuit GND2 at an anode terminal thereof is connected in parallel with the resistor 174n of the couple of voltage dividing resistors 173n and 174n. The clip diode 274n suppresses an excessively high negative voltage applied to the load voltage monitoring circuit 170n when there is a breakage at the external common negative line 104 for the commutation diodes 146n. This configuration is characterized in that damage to the load voltage monitoring circuit 170n attributable to a surge voltage generated by the electrical load 103n can be prevented when there is a breakage at the external common negative line 104. The configuration is also characterized in that a surge current superimposed on the internal ground circuit GND2 of the power supply control unit 100A when a breakage abnormality occurs at the external common negative line 104 can be suppressed to a very small value by the other resistor 173n of the couple of voltage dividing resistors 173n and 174n.

In Embodiment 1, the microprocessor 120A receives the input of analog signals which are monitoring voltages Efn supplied from the current detecting differential amplifiers 150n and the input of an analog signal which is a power supply voltage measurement signal Vd supplied from a power supply voltage measuring circuit 115. Each power supply state detection circuit PDETAn includes comparison/determination circuits 171n and 271n forming a load voltage monitoring circuit 170n. The non-volatile program memory 121A includes a control program including negative feedback control means 450 which forms the energization command means. The negative feedback control means 450 controls the turning on/off of the switching elements 131n by generating the energization command outputs DRn having variable duties γn in accordance with integrated values of deviations between energization target currents Isn for the electrical loads 103n and load currents Ifn detected by current detecting differential amplifier circuits 150n. The power supply voltage measuring circuit 115 includes voltage dividing resistors 111 and 112 for dividing a driving power supply voltage Vb provided by the DC driving power supply 101 and inputting the resultant voltage to the microprocessor 120A. A load voltage monitoring circuit 170n includes comparison/determination circuits 171n and 271n which provide the microprocessor 120A with an input of a determination made by comparing a voltage proportionate to a load voltage Vfn applied to one resistor 174n of a couple of voltage dividing resistors 173n and 174n connected between a point connecting the current detection resistor 141n and the electrical load 103n and the internal ground circuit GND2 of the power supply control unit 100A with a predetermined threshold. This configuration is characterized in that hardware for negative feedback control can be simplified and in that a need for analog inputs for monitoring load voltages can be eliminated to provide a compact and inexpensive power supply control device.

In Embodiment 1, the power supply control circuit PCNTA includes leakage resistors 149n having a high resistance connected in parallel with the switching elements 131n and load voltage dividing circuits 1410n provided on the output side of the switching elements 131n. The comparison/determination circuits include first and second comparison/determination circuits 171n and 271n for comparing a voltage applied to one resistor 174n of a couple of voltage dividing resistors 173n and 174n of a load voltage monitoring circuit 170n with each of first and second threshold voltages proportionate to the driving power supply voltage Vb. A leakage resistor 149n supplies such a very small load current that the electrical load 103n will not be activated when the switching element 131n is off. The respective load voltage dividing circuit 1410n includes a bypass resistor 147n connected between a point of connection between the switching element 131n and the current detection resistor 141n and the anode terminal A of the commutation diode 146n. The first threshold voltage is proportionate to a voltage applied to the bypass resistor 147n through the leakage resistor 149n at the time of occurrence of a breakage abnormality including a breakage at either the electrical load 103n, or positive side wiring 103P or negative side wiring 103N of the electrical load 103n. The second threshold voltage is proportionate to a voltage applied to the bypass resistor 147n at the time of occurrence of a shorting abnormality at the switching element 131n and a power line shorting that the positive side wiring 103P of the electrical load 103n is contacted to the power supply line. When a breakage abnormality occurs, the output logic of the first comparison/determination circuit 171n is inverted to supply an alarm signal OVn indicating the breakage abnormality to the microprocessor 120A. When either of a shorting abnormality at the switching element 131n or a power line shorting abnormality at the positive side wiring 103P of the electrical load 103n is occurred, the output logic of the second comparison/determination circuit 271n is inverted to supply an alarm signal SVn indicating either of the shorting abnormality at the switching element or power line shorting abnormality at the positive side wiring to the microprocessor 120A. This configuration is characterized in that identification or determination can be made before energization is started with a simple detection circuit on whether there is a breakage abnormality at an electrical load 103n or a breakage abnormality at the positive side wiring 103P or negative side wiring 103N thereof or whether there is a power line shorting abnormality at the positive side wiring 103P or a shorting abnormality at the switching element 131n.

In Embodiment 1, the non-volatile program memory 121A includes a control program including load resistance estimation means 408 and at least either under-resistance determination means 430 or over-resistance determination means 440. The load resistance estimation means 408 performs a calculation to estimate a current resistance value Rn of an electrical load 103*n*, which is equivalent to γn Vn/Ifn, based on an energization duty γn of an energization command output DRn output by the negative feedback control means 450, a driving power supply voltage Vb measured by the power supply voltage measuring circuit 115, and a load current Ifn for the electrical load detected by the current detecting differential amplifier circuit 150*n*. The under-resistance determination means 430 generates an abnormality determination output when the load resistance Rn estimated by the load resistance estimation means 408 is smaller than a minimum load resistance Rmin in a low temperature environment, thereby providing a notice of the occurrence of any of a shorting abnormality at the electrical load 103*n*, a grounding abnormality that is contact between the positive side wiring 103P and the vehicle body, and a shorting abnormality at the switching element 131*n* in the duration of the energization command for the switching element 131*n*. The over-resistance determination means 440 generates an abnormality determination output when the load resistance Rn estimated by the load resistance estimation means 408 is greater than a maximum load resistance Rmax in a high temperature environment, thereby providing a notice of the occurrence of any of a breakage abnormality at the electrical load 103*n*, a breakage abnormality at the positive side wiring 103P, a breakage abnormality at the negative side wiring 103N, a power line shorting abnormality at the positive side wiring 103P, and a breakage abnormality at the switching element 131*n* in the duration of the energization command for the switching element 131*n*. This configuration is characterized in that it is possible to detect abnormal states using inexpensive means without relying on hardware, the abnormal states including breakage abnormalities at the electrical loads 103*n*, power line shorting abnormalities at the positive side wirings 103P, shorting abnormalities at the electrical loads 103*n*, grounding abnormalities at the positive side wirings 103P, breakage abnormalities at the switching elements 131*n*, and shorting abnormalities at the switching elements 131*n*.

In Embodiment 1, the under-resistance determination means 440 further includes a confirmative determination means 432. When the under-resistance determination means 430 determines that there is a state of under-resistance, the confirmative determination means 432 stores the fact that no shorting abnormality has occurred at a switching element 131*n* as abnormality history information if the load current Ifn has become zero after the energization command output DRn to the switching element 131*n* was stopped. This configuration is characterized in that the efficiency of maintenance and inspection operations can be improved by identifying and storing the cause of the state of under-resistance as a grounding abnormality at the positive side wiring 103P, a shorting abnormality, a shorting abnormality at the electrical load 103*n* or a shorting abnormality at the switching element 131*n*.

In Embodiment 1, the abnormality processing means 411, 421, 431, and 441 provide an abnormality notice by stopping the energization command to an electrical load 103*n* not only when a breakage abnormality is detected at the negative line but also when either of a shorting abnormality at the electrical load 103*n* or a grounding abnormality at the positive side wiring 103P of the electrical load 103*n* is detected. The abnormality history storing means 413, 423, 443, 433*a*, and 433*b* stores and saves information on shorting abnormalities at the electrical loads 103*n* and grounding abnormalities at the positive side wirings 103P in the data memory 123 in addition to the history of occurrence of breakage abnormalities. This configuration is characterized in that comprehensive history information can be stored in accordance with the contents of abnormalities to facilitate maintenance and inspections because an energization command to an electrical load 103*n* is stopped and an abnormality notice is provided not only when there is a breakage abnormality but also when there is a shorting abnormality at the electrical load 103*n* or a grounding abnormality at the positive side wiring 103P thereof.

Embodiment 2

(21) Configuration of Embodiment 2

Figure 5:
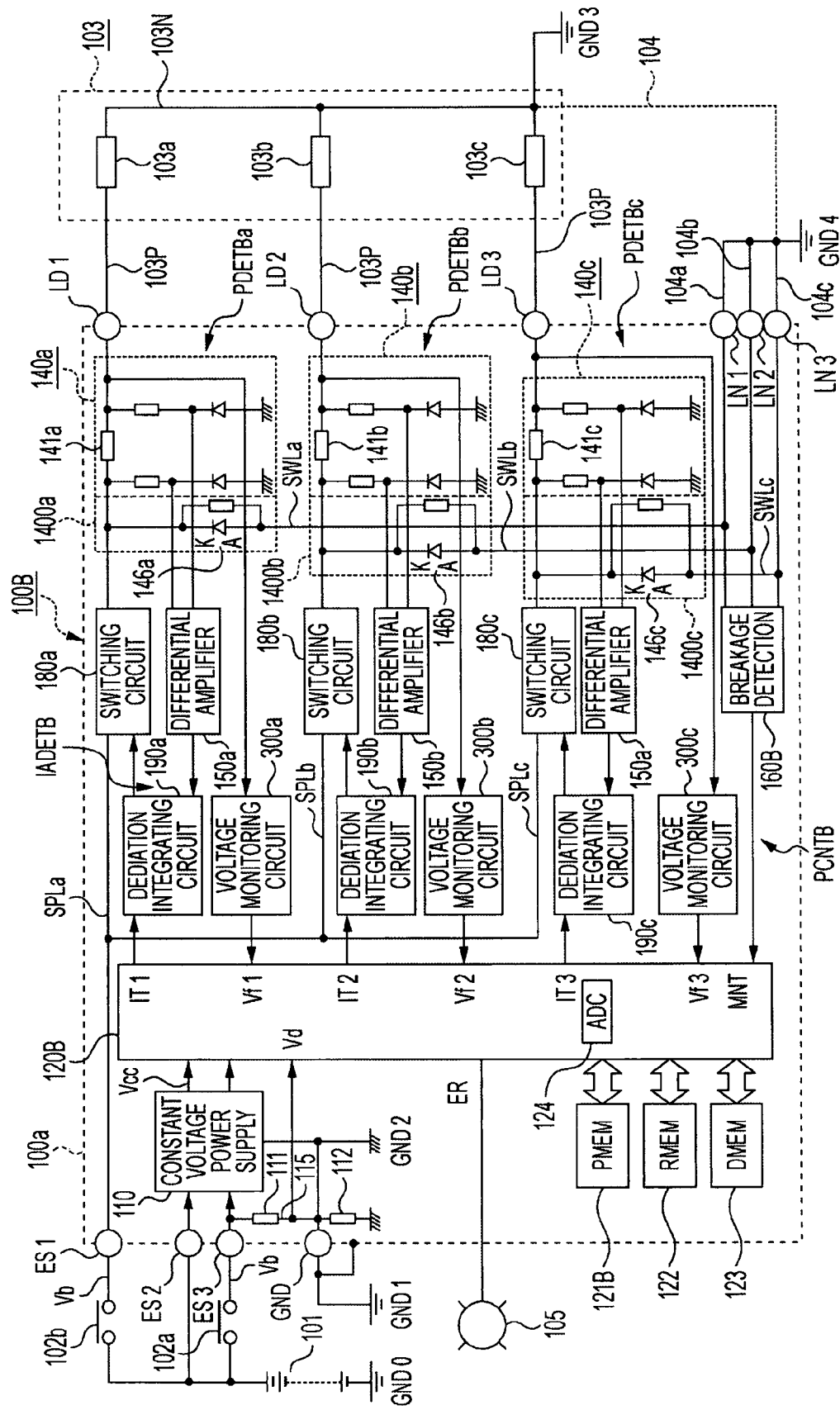
FIG. 5 is a general circuit diagram of Embodiment 2 of a power supply control device for on-vehicle electrical loads according to the invention.

FIG. 5 is a general circuit diagram of Embodiment 2 of a power supply control device for on-vehicle electrical loads according to the invention. The configuration of Embodiment 2 will be described with reference to FIG. 5 with the focus of the description put on differences from the embodiment shown in FIG. 1, and parts identical or equivalent to those in FIG. 1 are indicated by like reference numerals and signs.

In Embodiment 2, as shown in FIG. 5, a power supply control unit 100B is used instead of the power supply unit 101A used in Embodiment 1. Specifically, the power supply control unit 100B constitutes, for example, a transmission control device for an automobile similarly to the power supply control unit 101A in Embodiment 1. The power supply control unit 100B is supplied with power from a DC driving power supply 101 through a power supply switching relay contact 102*a* similarly to the power supply control unit 100A in Embodiment 1, and it is also fed through a load power supply relay contact 102*b*. Similarly to the power supply control unit 101A in Embodiment 1, the power supply control unit 100B controls load currents to electrical loads 103*a* to 103*c*, e.g., linear solenoids, included in a load circuit 103.

The power supply control unit 100B is contained in a sealed housing 100*a*. The power supply control unit 100B includes a power supply input terminals ES1, ES2, and ES3, a unit ground terminal GND, load output terminals LD1, LD2, and LD3, and three connector terminals LN1, LN2, and LN3. Each of the terminals is disposed in the housing 100*a* and electrically insulated from the housing 100*a*. The power supply input terminals ES1, ES2, and ES3, the unit ground terminal GND, and the load output terminals LD1, LD2, and LD3 are configured similarly to those in Embodiment 1. The unit ground terminal GND is connected to a vehicle body at a unit ground GND1 along with an internal ground circuit GND2 just as in Embodiment 1.

The connector terminals LN1, LN2, and LN3 of the power supply control unit 100B are connected to the vehicle body at a separated ground GND4 in the vicinity of the connector terminals LN1, LN2, and LN3 through external individual negative lines 104*a*, 104*b*, and 104*c*. The terminals are connected to a load ground GND3 through the vehicle body and connected to negative side wirings 103N of the electrical loads 103*a* to 103*c*. The distance between the separated ground GND4 and the load ground GND3 is smaller than the distance between the separated ground GND4 and the unit ground GND1. As a result, resistance between the separated ground GND4 and the load ground GND3 is smaller than resistance between the separated ground GND4 and the unit ground GND1, and fluctuations of an electric potential at the vehicle body attributable to commutation at the electrical loads 103*a* to 103*c* can therefore be kept small. As indicated by the dotted line in FIG. 5, the external individual negative lines 104*a*, 104*b*, and 104*c* may be connected to the negative side wirings 103N of the electrical loads 103*a* to 103*c* through an external common negative line 104.

The power supply control unit 100B incorporates a power supply control circuit PCNTB along with load power supply circuits SPLa to SPLc and load commutation circuits SWLa to SWLc. The power supply control circuit PCNTB is primarily constituted by a microprocessor 120B. The power supply control circuit PCNTB includes a control power supply circuit 110, switching circuits 180a to 180c, commutation circuits 1400a to 1400c, an individual abnormality detection circuit IADETB, and a negative line breakage abnormality detection circuit 160B. The individual abnormality detection circuit IADETB detects individual abnormalities at the electrical loads 103a to 103c, and the negative line breakage abnormality detection circuit 160B detects abnormalities at the external individual negative lines 104a to 104c.

The switching circuits 180a to 180c are disposed at the load power supply circuits SPLa to SPLc, respectively. The switching circuit 180a is connected in series with the electrical load 103a to the load power supply circuit SPLa provided between the power supply input terminal ES1 and the load output terminal LD1 to control a load current at the electrical load 103a. The switching circuit 180b is connected in series with the electrical load 103b to the load power supply circuit SPLb provided between the power supply input terminal ES1 and the load output terminal LD2 to control a load current at the electrical load 103b. The switching circuit 180c is connected in series with the electrical load 103c to the load power supply circuit SPLc provided between the power supply input terminal ES1 and the load output terminal LD3 to control a load current at the electrical load 103c.

The individual abnormality detection circuit IADETB is constituted by power supply state detection circuits PDETBa to PDETBc provided in association with the electrical loads 103a to 103c, respectively, and the microprocessor 120B. The power supply state detection circuit PDETBa associated with the electrical load 103a includes a current detection circuit 140a, a current detecting differential amplifier circuit 150a, a negative feedback control circuit 190a, and a load voltage monitoring circuit 300a. Similarly, the power supply state detection circuits PDETBb and PDETBc associated with the electrical loads 103b and 103c include current detection circuits 140b and 140c, current detecting differential amplifier circuits 150b and 150c, negative feedback control circuits 190b and 190c, and load voltage monitoring circuits 300b and 300c, respectively.

The commutation circuits 1400a to 1400c, the current detection circuits 140a to 140c, and differential amplifiers 150a to 150c for current detection are configured similarly to those in Embodiment 1. The microprocessor 120B is used instead of the microprocessor 120A in Embodiment 1. The switching circuits 180a to 180c are used instead of the switching circuits 130a to 130c in Embodiment 1. The negative feedback control circuits 190a to 190c are additional elements provided in Embodiment 2 of the power supply control unit 100B to control the switching circuits 180a to 180c. The negative line breakage abnormality detection circuit 160B is used instead of the negative line breakage abnormality detection circuit 160A in Embodiment 1. The load voltage monitoring circuits 300a to 300c are used instead of the load voltage monitoring circuits 170a to 170c in Embodiment 1.

The load power supply circuits SPLa to SPLc are formed between the power supply input terminal ES1 and the load output terminals LD1, LD2, and LD3 in the same way as in Embodiment 1. The load commutation circuit SWLa of the power supply control unit 100B is formed between the connector terminal LN1 and the load power supply circuit SPLa. Similarly, the load commutation circuits SWLb and SWLc are formed between the connector terminals LN2 and LN3 and the load power supply circuits SPLb and SPLc, respectively. Specifically, the load commutation circuit SWLa is connected to the connector terminal LN1 at one end thereof and connected to the load power supply circuit SPLa between the switching circuit 180a and the current detection circuit 140a at another end thereof. Similarly, the load commutation circuits SWLb and SWLc are connected to the connector terminals LN2 and LN3, respectively, at one end thereof. The circuits are also connected to the load power supply circuit SPLb between the switching circuit 180b and the current detection circuit 140b and to the load power supply circuit SPLc between the switching circuit 180c and the current detection circuit 140c, respectively, at another end thereof. The commutation circuits 1400a to 1400c are disposed at the load commutation circuits SWLa to SWLc, respectively.

The microprocessor 120B, which is a major constituent part of the power supply control circuit PCNTB, is bus-connected to a non-volatile program memory 121B constituted by, for example, a non-volatile flash memory which can be electrically erased at once to allow writing and which can be read, a RAM memory 122 for arithmetic processes, a data memory 123 constituted by a non-volatile EEPROM which can be electrically written and read byte by byte, and a multi-channel A-D converter 124. The microprocessor is configured for mutual cooperation with those elements. Similarly to the microprocessor 120A in Embodiment 1, the microprocessor 120B is supplied with a control power supply voltage Vcc from the control power supply circuit 110. A power supply voltage measuring circuit 115 is connected to the power supply input terminal ES2 connected to the DC driving power supply 101 through the power supply switching relay contact 102a, and a driving power supply voltage Vd measured by the same is input to the microprocessor 120B.

The switching circuit 180a is disposed at the load power supply circuit SPLa and connected in series with the current detection circuit 140a. Similarly, the switching circuits 180b and 180c are disposed at the load power supply circuits SPLb and SPLc, respectively, and connected in series with the current detection circuits 140b and 140c. The switching circuits 180a to 180c are supplied with power from the DC driving power supply 101 through the load power supply relay contact 102b and the power supply input terminal ES1. The circuits 180a to 180c supply power to the electrical loads 103a to 103c associated therewith through current detection resistors 141a to 141c of the current detection circuits 140a to 140c and the load output terminals LD1 to LD3, respectively. The switching circuits 180a to 180c are turned on/off under the control of energization command outputs DR1 to DR3 generated by the negative feedback control circuits 190a to 190c to supply the electrical loads 103a to 103c with load currents proportionate to energization duties which are ratios of on-times to on/off periods. Details of the switching circuit 180a will be described later with reference to FIG. 6.

Commutation diodes 146a to 146c of the commutation circuits 1400a to 1400c are provided in the load commutation circuits SWLa to SWLc, respectively. The commutation diode 146a is connected in parallel with a series circuit formed by the current detection resistor 141a and the electrical load 103a. Similarly, the commutation diodes 146b and 146c are connected in parallel with a series circuit formed by the current detection resistor 141b and the electrical load 103b and a series circuit formed by the current detection resistor 141c and the electrical load 103c, respectively. Anode terminals A of the commutation diodes 146a to 146c are connected to the connector terminals LN1 to LN3, respectively, and connected to the vehicle body through the external individual negative lines 104a to 104c. The current detecting differential amplifier circuits 150a to 150c perform differential amplification of voltages across the current detection resistors 141a to 141c, respectively to supply monitoring voltages Ef1 to Ef3 proportionate to load currents If1 to If3 flowing through the electrical loads 103a to 103c to inputs of the negative feedback control circuits 190a to 190c on one side thereof.

Based on a program serving as a target current command means stored in the non-volatile program memory 121B, the microprocessor 120B generates outputs IT1 to IT3 commanding setting of energization duties α1 to α3 proportionate to target current values Is1 to Is3, respectively, and supplies the setting command outputs IT1 to IT3 to other inputs of the feedback control circuits 190a to 190c. The negative feedback control circuit 190a generates the energization command output DR1 having a variable duty in accordance with an integrated value of a deviation between a set voltage Es1 which is proportionate to the target current value Is1 obtained by smoothing the setting command output IT1 and the monitoring voltage Ef1 which is proportionate to the load current value If1 detected by the current detecting differential amplifier circuit 150a. The circuit controls the turning on/off of the switching circuit 180a with the energization command output DR1. Similarly, the negative feedback control circuits 190b and 190c generate the energization command outputs DR2 and DR3 having variable duties in accordance with integrated values of deviations between set voltages Es2 and Es3 which are proportionate to the target current values Is2 and Is3 obtained by smoothing the setting command outputs IT2 and Is3, respectively, and the monitoring voltages Ef2 and Ef3 which are proportionate to the load current values If2 and If3 detected by the current detecting differential amplifier circuits 150b and 150c. The circuits control the turning on/off of the switching circuits 180b and 180c with the energization command outputs DR2 and DR3. Details of the negative feedback control circuit 190a will be described later with reference to FIG. 6.

The negative line breakage abnormality detection circuit 160B detects a breakage at the external individual negative lines 104a to 104c and a breakage at the negative lines attributable to a contact failure of the connector terminals LN1, LN2, and LN3 and supplies an alarm signal MNT to the microprocessor 120B. The negative line breakage abnormality detection circuit 160B will be described in detail later with reference to FIG. 7. The load voltage monitoring circuit 300a monitors a voltage at the load output terminal LD1 to which the positive side wiring 103P of the electrical load 103a is connected and supplies a load voltage measurement input Vf1, which is an analog signal, to the microprocessor 120B. Similarly, the load voltage monitoring circuits 300b and 300c monitor voltages at the load output terminals LD2 and LD3 to which the positive side wirings 103P of the electrical loads 103b and 103c are connected and supply load voltage measurement inputs Vf2 and Vf3, which are analog signals, to the microprocessor 120B. Details of the load voltage monitoring circuit 300a will be described later with reference to FIG. 6.

The switching circuits 180b and 180c, the current detection circuits 140b and 140c, the current detecting differential amplifier circuits 150b and 150c, the load voltage monitoring circuits 300b and 300c, and the negative feedback control circuits 190b and 190c associated with the electrical loads 103b and 103c are configured similarly to the switching circuit 180a, the current detection circuit 140a, the current detecting differential amplifier circuit 150a, the load voltage monitoring circuit 300a, and the negative feedback control circuit 190a associated with the electrical load 103a, respectively. The microprocessor 120B generates the setting command outputs IT1 to IT3 and operates on the load voltage measurement inputs Vf1 to Vf3 and the power supply voltage measurement input Vd as analog inputs.

Figure 6:
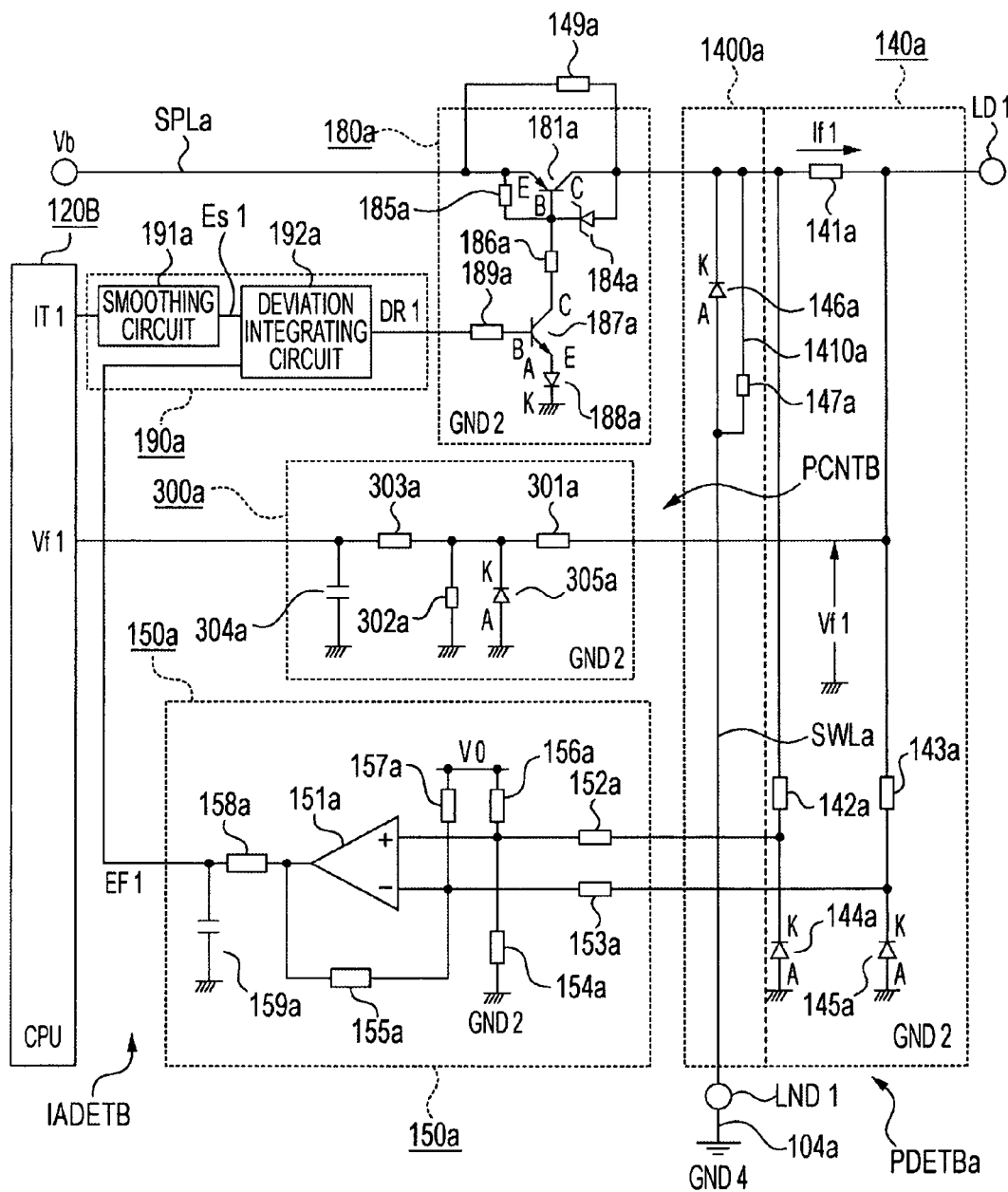
FIG. 6 is a detailed circuit diagram of a major part of Embodiment 2.

FIG. 6 is a detailed circuit diagram of a major part of Embodiment 2 shown in FIG. 5. FIG. 6 shows the microprocessor 120B constituting the power supply control circuit PCNTB along with the switching circuit 180a, the current detection circuit 140a, the commutation circuit 1400a, the negative feedback control circuit 190a, the differential amplifier 150a for current detection, and load voltage monitoring circuit 300a associated with the electrical load 103a. The description will be made with reference to FIG. 6 and will be focused on differences from what is shown in FIG. 2. The switching circuits 180b and 180c, the current detection circuits 140b and 140c, the commutation circuits 1400b and 1400c, the negative feedback control circuits 190b and 190c, the differential amplifiers 150b and 150c for current detection, and load voltage monitoring circuits 300b and 300c associated with the electrical loads 103b and 103c are configured similarly to the switching circuit 180a, the current detection circuit 140a, the commutation circuit 1400a, the negative feedback control circuit 190a, the differential amplifier 150a for current detection, and load voltage monitoring circuit 300a associated with the electrical load 103a, respectively.

Referring to FIG. 6, the switching circuit 180a comprises the switching element 181a as a primary element. The switching circuit 180a includes the switching element 181a, various resistors 185a, 186a, and 189a, a voltage clamping diode 184d, an NPN transistor 187a, and a block diode 188a. The switching element 181a is a power transistor, specifically, a PNP type bipolar transistor. The driving power supply voltage Vb is applied to an emitter terminal E of the switching element 181a, and a collector terminal C of the element is connected to the load output terminal LD1 through the current detection resistor 141a. A base terminal B of the switching element 181a is connected to the collector terminal C through the voltage clamping diode 184a, and a stabilizing resistor 185a for an off-state of the switching element 181a is connected between the emitter terminal E and the base terminal B.

The base terminal B of the switching element 181a is connected to a collector terminal C of the NPN transistor 187a through the base resistor 186a, and en emitter terminal E of the NPN transistor 187a is connected to the internal ground circuit GND2 of the power supply control unit 100B through the block diode 188a. A cathode terminal K of the block diode 188a is connected to the internal ground circuit GND2, and an anode terminal A of the same is connected to an emitter terminal E of the NPN transistor 187a. The energization command output DR1 is supplied from the negative feedback control circuit 190a to a base terminal B of the NPN transistor 187a through the driving resistor 189a, and the NPN transistor 187a and the switching element 181a are turned on when the logical level of the energization command output DR1 becomes "H". The commutation circuit 1400a is similar to that in Embodiment 1, and it has a commutation diode 146a and a bypass resistor 147a. The bypass resistor 147a forms a load voltage dividing circuit 1410a in combination with a leakage resistor 149a connected between the emitter terminal E and the collector terminal C of the switching element 181a. The load voltage dividing circuit 1410a has the same function as that of the load voltage dividing circuit 1410a shown in FIG. 2.

The current detection circuit 140a and the current detecting differential amplifier circuit 150a are configured similarly to those in FIG. 2, but the monitoring voltage Ef1 proportionate to the load current If1 detected by the current detecting differential amplifier circuit 150a is input to the negative feedback control circuit 190a. The negative feedback control circuit 190a includes a smoothing circuit 191a and a deviation integrating circuit 192a. The smoothing circuit 191a smoothes the setting command output IT1 from the microprocessor 120B to generate a set voltage Es1 proportionate to a target current value Is1. The set voltage Es1 from the smoothing circuit 191a and the monitoring voltage Ef1 proportionate to the load current If1 detected by the current detecting differential amplifier circuit 150a are input to the deviation integrating circuit 192a. The deviation integrating circuit 192a generates an energization command output DR1 having a variable duty γ1 in accordance with an integrated value of a deviation between the set voltage Es1 and the monitoring voltage Ef1 to control the turning on/off of the switching element 181a.

The load voltage monitoring circuit 300a includes voltage dividing resistors 301a and 302a connected between the load output terminal LD1 and the internal ground circuit GND2 and a clip diode 305a connected in parallel with the resistor 302a. An anode terminal of the clip diode 305a is connected to the internal ground circuit GND2, and a cathode terminal K of the diode is connected to a point of connection between the voltage dividing resistors 301a and 302a. The load voltage monitoring circuit 300a further includes an integration resistor 303a and a smoothing capacitor 304a forming a smoothing circuit. A voltage across the voltage dividing resistor 302a is smoothed by the integration resistor 303a and the smoothing capacitor 304a and input to the microprocessor 120B, whereby a load voltage measurement input Vf1 proportionate to the load voltage is supplied as an analog signal.

Figure 7:
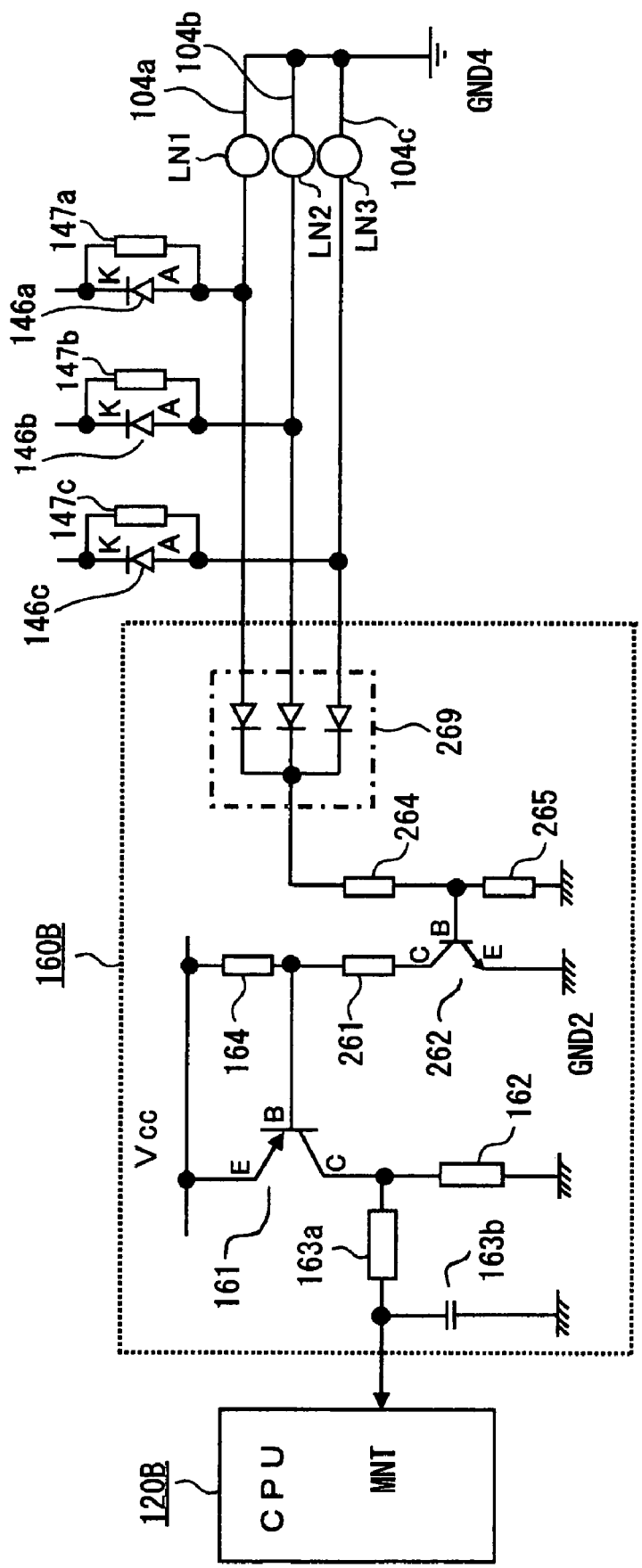
FIG. 7 is a detailed circuit diagram of a negative line breakage abnormality detection circuit in Embodiment 2.

FIG. 7 shows the negative line breakage abnormality detection circuit 160B of Embodiment 2. The negative line breakage abnormality detection circuit 160B will be described with reference to FIG. 7 with the focus of the description put on differences from the circuit shown in FIG. 3. Referring to FIG. 7, the negative line breakage abnormality detection circuit 160B includes a determination element 161 constituted by a PNP transistor which is supplied with the control power supply voltage Vcc, a collector resistor 162, an output resistor 163a, an integrating capacitor 163b and a stabilizing resistor 164 for an off-state of the determination element 161. The circuit supplied an alarm signal MNT to the microprocessor 120B.

A series circuit formed by a driving resistor 261 and a driving transistor 262 is connected to a base circuit of the determination element 161. A series circuit formed by a combined block diode 269 and a detection resistor 264 is connected to a base circuit of the driving transistor 262. A stabilizing transistor 265 for an off state of the driving transistor 262 is connected between a base terminal B and an emitter terminal E of the driving transistor 262.

When there is a breakage at the external individual negative lines 104a to 104c connected to the connector terminals LN1, LN2, and LN3 with any of the switching elements 181a to 181c in the on-state, the transistor 262 is energized and driven through any of the bypass resistors 147a to 147c and the detection resistor 264, and the determination element 161 is thereby turned on to change the logical level of the alarm signal MNT to "H".

Thus, the determination element 161 generates an alarm signal MNT by detecting a positive electric potential generated at the anode terminals A of the commutation diodes 146a to 146c by the bypass resistors 147a to 147c during a period in which the switching elements 181a to 181c are on. When the connector terminals LN1, LN2, and LN3 are properly connected to the vehicle body by the external individual negative lines 104a to 104c, no electric potential is generated at the anode terminals A of the commutation diodes 146a to 146c, and the logical level of the alarm signal generated by the determination element 161 is therefore "L" which indicates a normal state. The external individual negative lines 104a to 104c may be bundled together outside the power supply control unit 100B and connected to the vehicle body in the position of the load ground GND3 as a single common negative line.

(22) Effects and Operations of Embodiment 2

Effects and operations of Embodiment 2 of the invention shown in FIGS. 5 to 7 will now be described. Referring to FIG. 5, when a power supply switch which is not shown is turned on, the power supply switching relay contact 102a is turned on to apply the driving power supply voltage Vb to the control power supply circuit 110, and the control power supply circuit 110 generates the control power supply voltage Vcc and supplies it to the microprocessor 120B. When the microprocessor 120B starts operating, the load power supply relay contact 102b is turned on by an energization circuit which is not shown. Based on an operation control program stored in the non-volatile program memory 121B, the microprocessor 120B determines which of the plurality of electrical loads 103a to 103c is to be supplied with a load current and determines the amount of the load current. The microprocessor thereafter generates the setting command outputs IT1 to IT3 which are pulse outputs of the energization duties α1 to α3 proportionate to the target load current values Is1 to Is3 based on a control program to serve as a target current command means stored in the non-volatile program memory 121B.

The negative feedback control circuit 190a controls the turning on/off of the switching element 181a by generating the energization command output DR1 having a variable duty γ1 in accordance with an integrated value of a deviation between the set voltage Es1 which is proportionate to the target load current value Is1 for the electrical load 103a obtained by smoothing the setting command output IT1 and the monitoring voltage Ef1 which is proportionate to the load current If1 detected by the current detecting differential amplifier circuit 150a. When the switching element 181a is on, the load current If1 flows from the positive terminal of the DC driving power supply 101 and circulates through a path formed by the load power supply relay contact 102b, the power supply input terminal ES1, the switching element 181a, the current detection resistor 141a, the positive side wiring 103P, the electrical load 103a, the negative side wiring 103N, the load ground GND3, the vehicle body, and a power supply ground GND0 back to the negative terminal of the DC driving power supply 101. No load current flows to the internal ground circuit GND2 of the power supply control unit 100B at all. When the switching elements 181b and 181c are turned on, the load currents If2 and If3 flowing through the electrical loads 103b and 103c follow similar paths, and no load current flows to the internal ground circuit GND2 of the power supply control unit 100B at all.

When the switching element 181a is turned off, the load current If1 flows from the negative terminal of the electrical load 103a and circulates through a path formed by the negative side wiring 103N, the load ground GND3, the vehicle body, the separated ground GND4, the external individual negative line 104a, the connector terminal LN1, the commutation diode 146a, the current detection resistor 141a, the load output terminal LD1, and the positive side wiring 103P back to the positive terminal of the electrical load 103a. In this case again, no load current flows to the internal ground circuit GND2 of the power supply control unit 100B at all. When the switching elements 181b and 181c are turned off, the load currents If2 and If3 commutated from the electrical loads 103b and 103c follow similar paths, and no load current flows to the internal ground circuit GND2 of the power supply control unit 100B at all.

Let us now assume that the external individual negative lines 104a to 104c are not provided and that the anode terminal A of the commutation diode 146a is connected to the internal ground circuit GND2 of the power supply control unit 100B. In this case, when the switching element 181a is turned off, the load current If1 flows from the negative terminal of the electrical load 103a and circulates through a path formed by the negative side wiring 103N, the load ground GND3, the unit ground GND1 of the power supply control unit 100B, the unit ground terminal GND, the internal ground circuit GND2, the commutation diode 146a, the current detection resistor 141a, the load output terminal LD1, and the positive side wiring 103P back to the positive terminal of the electrical load 103a. A problem arises in that a commutation surge current flows into the internal ground circuit GND2 of the power supply control unit 100B to cause fluctuations of the electric potential at the internal ground circuit GND2.

In Embodiment 2, the anode terminals A of the commutation diodes 146a to 146c are connected to the vehicle body at the separated ground GND4 outside the power supply control unit 100B through the external individual negative lines 104a to 104c, which makes it possible to prevent the load currents If1, If2, and If3 from flowing into the internal ground circuit GND2 of the power supply control unit 100B. On the contrary, when there is a contact failure at the connector terminals LN1, LN2, and LN3 or a breakage abnormality at the external individual negative lines 104a to 104c, the commutating function of the commutation diodes 146a to 146c is deteriorated, which results in another problem in that an induced surge voltage is generated by inductive components of the electrical loads 103a, 103b, and 103c when the switching elements 181a to 181c are turned off.

The surge voltage is suppressed to, for example, about 50 volts by the voltage clamping diodes 184a for suppressing an off-voltage provided at the switching elements 181a to 181c. However, the suppressed surge voltage will be applied to all circuits in the power supply control circuit PCNTB of the power supply control unit 100B which are connected between the internal ground circuit GND2 and the load output terminals LD1, LD2, and LD3.

Referring to FIG. 6, the block diode 188a associated with the switching element 181a blocks a countercurrent attributable to the suppressed surge voltage. First and second negative voltage suppressing diodes 144a and 145a of the current detection circuit 140a suppress input electric potentials of a differential amplifier 151a to negative electric potentials of, for example, about 1 volt that is the forward voltage of the first and second negative voltage suppressing diodes 144a and 145a. The first and third series resistors 142a and 143a suppress a surge current which circulates from the unit ground GND1 to the load output terminal LD1 via the internal ground circuit GND2 and the first or second negative voltage suppressing diode 144a or 145a, thereby suppressing fluctuations of the electric potential at the internal ground circuit GND2.

Similarly, the clip diode 305a of the load voltage monitoring circuit 300a suppresses the input electric potential of the voltage dividing resistor 302a to a negative electric potential of, for example, about 1 volt that is the forward voltage of the clip diode 305a. The voltage dividing resistor 301a suppresses a surge current which circulates from the unit ground GND1 to the load output terminal LD1 via the internal ground circuit GND2 and the clip diode 305a, thereby suppressing fluctuations of the electric potential at the internal ground circuit GND2. Effects and operations of the switching elements 181b and 181c, the current detection circuits 141b and 141c, and the load voltage monitoring circuits 300b and 300c associated with the electrical loads 103b and 103c are similar to the effects and operations of the switching element 181a, the current detection circuit 141a, and the load voltage monitoring circuit 300a associated with the electrical load 103a.

Referring to FIG. 7, the combined block diode 269 of the negative line breakage abnormality detection circuit 160B prevents a commutation surge current from flowing from the detection resistor 264 to the load output terminals LD1 to LD3. However, when the switching elements 181a to 181c are on, the transistor 262 is turned on by the bypass resistors 147a to 147c, the combined block diode 269, and the detection resistor 264, and the determination element 161 is consequently turned on.

The external common negative line 104 is used in Embodiment 1 as shown in FIG. 3. In Embodiment 2, the external individual negative lines 104a to 104c are used as shown in FIG. 7, and the connector terminals LN1 to LN3 associated with the external individual negative lines 104a to 104c are used instead of the common terminal COM shown in FIG. 3. Thus, no concentration of currents commutated from the electrical loads 103a to 103c occurs at the connector terminals LN1 to LN3, and it is therefore possible to prevent an overcurrent from flowing to the connector terminals LN1 to LN3. Although it is desirable to extend the external individual negative lines 104a to 104c to the position of the load ground GND3, they are connected to the vehicle body in the position of the separated ground GND4 provided in the vicinity of the connector terminals LN1 to LN3 in order to keep the number of wirings small.

Figure 8:
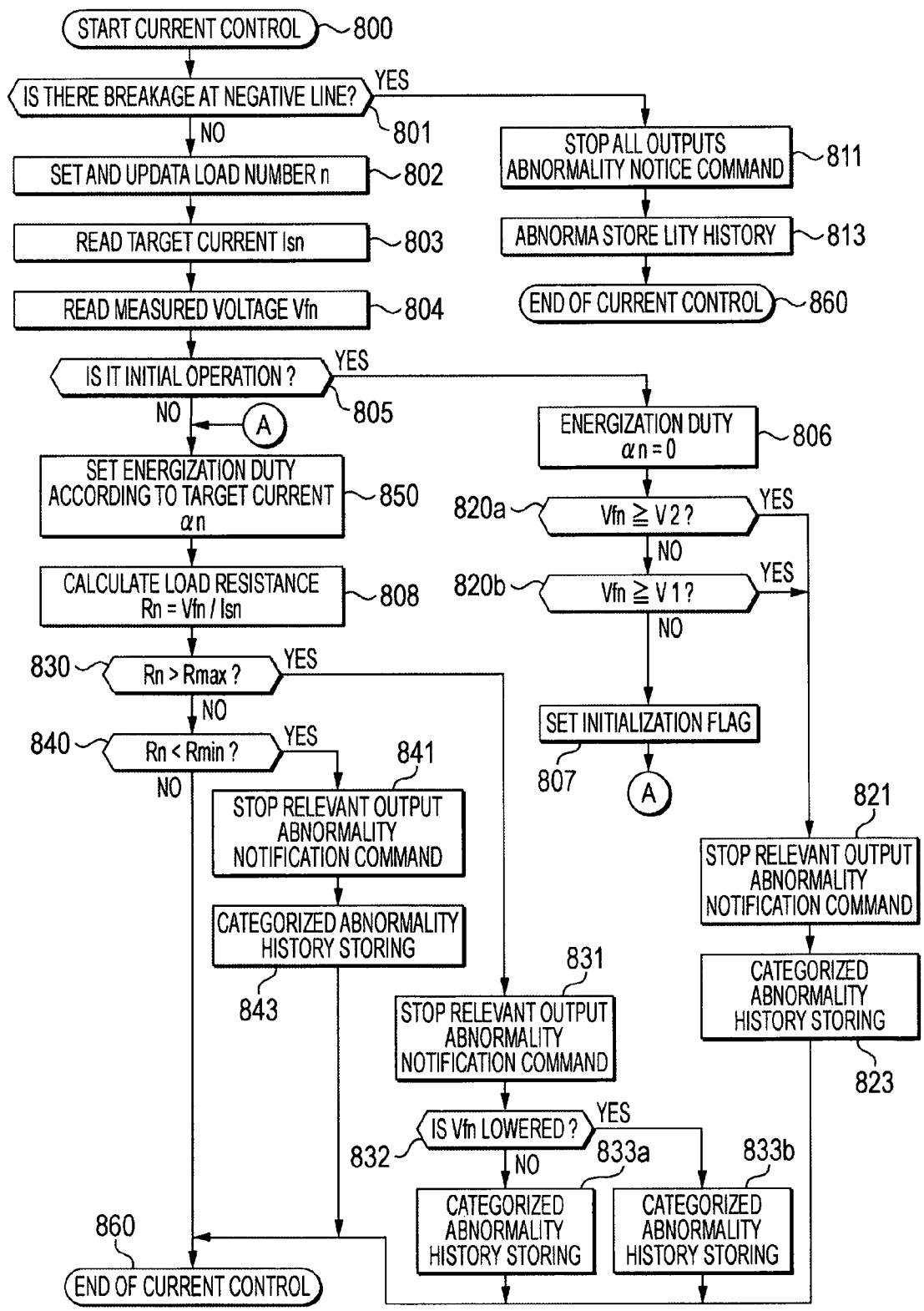
FIG. 8 is a flow chart for explaining operations of Embodiment 2.

FIG. 8 is a flow chart for explaining operations of Embodiment 2. The operations of Embodiment 2 will now be described with reference to FIG. 8. In FIG. 8, step 800 is a step at which load current control forming a part of various control flows of the microprocessor 120B is started. The subsequent step 801 is a step which constitutes a negative line breakage abnormality detection means. At step 801, the state of input of the alarm signal MNT is monitored to determine the negative line breakage abnormality detection circuit 160B has detected any breakage abnormality at the negative lines. When a breakage abnormality has occurred at the negative lines and the result of the determination at step 801 is therefore YES, the process proceeds to step 811. If the result of the determination at step 801 is NO, the process proceeds to step 802.

Step 811 is a step which constitutes an abnormality processing means and, more specifically, an all output stopping means and an abnormality notification means. At step 811, all of the setting command outputs IT1, IT2, and IT3 are stopped, and an alarm output ER is generated to activate an alarm indicator 105. The subsequent step 813 is a step which constitutes an abnormality history storing means and at which the information of the occurrence of a breakage abnormality at the negative lines is written and stored in a data memory 123. The subsequent step 860 is a current control operation ending step. At step 860, the microprocessor 120B executes control operations other than current control, and the operation starting step 800 is activated again after a predetermined time passes to repeat the series of control operations.

Step 802 is a step which constitutes a load number setting/updating means. At step 802, load numbers n (n=a, b, c, and so on) for a plurality of electrical loads 103a, 103b, 103c, and so on are specified and sequentially updated and specified. The subsequent step 803 is a step which constitutes a target current value reading means. At step 803, a target current value Isn associated with an electrical load 103n having a load number n specified at step 802 is read. The target current value Isn is determined based on another control program which is not shown. The subsequent step 804 is a step which constitutes a load voltage reading means. At step 804, a load voltage value Vfn of the electrical load 103n detected by a load voltage monitoring circuit 300n is read. The subsequent step 805 is a step which constitutes an initial operation determination means. At step 805, it is determined whether an initial operation is being performed based on a determination made at a subsequent step 807 on whether an initialization complete flag has been set. When an initial operation is being performed and the result of the determination at step 805 is therefore YES, the process proceeds to step 806. If the result of the determination at step 805 is NO, the process proceeds to step 850.

Step 806 is a step which constitutes an initial check starting means. At step 806, an energization duty γn of a setting command output ITn associated with the electrical load 103n specified at step 802 is nullified to perform an initial check. The subsequent step 820a is a step which constitutes a second comparison/determination means. At step 820a, it is determined whether the load voltage value Vfn read at step 804 is in an abnormal state in which it is equal to or higher than a second threshold voltage value V2. When the voltage is in the abnormal state and the result of the determination at step 820a is therefore YES, the process proceeds to step 821. If the result of the determination at step 820a is NO, the process proceeds to step 820b. The second threshold voltage value V2 is given by Expression (8) shown below where Vb represents the driving power supply voltage and R301n and R302n represent resistances of voltage dividing resistors 301n and 302n of the load voltage monitoring circuit 300n associated with the electrical load 103n.

$$V2 = Vb \times R302n / (R301n + R302n) \quad (8)$$

Step 820b is a step which constitutes a first comparison/determination means. At step 820b, it is determined whether the load voltage value Vfn read at step 804 is in an abnormal state in which it is equal to or higher than a first threshold voltage value V1. When the voltage is in the abnormal state and the result of the determination at step 820b is therefore YES, the process proceeds to step 821. If the result of the determination at step 820b is NO, the process proceeds to step 807. The first threshold voltage value V1 is given by Expression (9) shown below where R149n represents the resistance of a leakage resistor 149n connected between an emitter terminal E and a collector terminal C of the switching element 181n and R147n represents the resistance of a bypass resistor 147n.

$$V1 = V2 \times R147n / (R149n + R147n) \quad (9)$$

Step 821 is a step which constitutes an abnormality processing means, more specifically, a relevant output stopping means and an abnormality notification means. At step 821, the relevant setting command output ITn is stopped, and an alarm output ER is generated to activate the alarm indicator 105. The subsequent step 823 is a step which constitutes an abnormality history storing means, more specifically, a categorized abnormality history storing means. At step 823, the information of the occurrence of an abnormality associated with the second threshold voltage value V2 or the first threshold voltage value V1 is written and stored in the data memory 123. At this step 823, when an abnormality is determined at step 820a, a shorting abnormality at the switching element 181n or a power line shorting abnormality of the positive side wiring 103P with respect to the electrical load 103n is stored. When no abnormality is determined at step 820a but an abnormality is determined at step 820b, a breakage abnormality at any of the electrical load 103n, the positive side wiring 103P, and the negative side wiring 103N is stored. Step 823 is followed by current control operation ending step 860.

Step 807 is a step at which an initialization complete flag is set and which is followed by step 850. The initialization complete flag set at step 807 is reset when the target current value Isn read at step 803 is zero. The result of the determination at step 805 will be YES if the initialization complete flag has been reset. Step 850 is a step which constitutes a target current command means. At step 850, a setting command output ITn having an energization duty αn proportionate to the target current value Isn read at step 803 is generated. The subsequent step 808 is a step which constitutes a load resistance estimation means. At step 808, a load resistance Rn is calculated by Expression (10) shown below based on the current load voltage value Vfn read at step 804 and the target current value Isn read at step 803, and the step is followed by step 830.

$$Rn = Vfn / Isn \quad (10)$$

Step 830 is a step which constitutes an over-resistance determination means. At step 830, it is determined whether the load resistance Rn calculated at step 808 is an abnormal value which is greater than a maximum resistance Rmax of the electrical load 103n at high temperatures. When the result of the determination at step 830 is YES, the process proceeds to step 831. If the result of the determination at step 830 is NO, the process proceeds to step 840. Step 831 is a step which constitutes an abnormality processing means, more specifically, a relevant output stopping means and an abnormality notification means. At step 831, the relevant setting command output ITn is stopped, and the alarm output ER is generated to activate the alarm indicator 105. The subsequent step 832 is a step which constitutes a confirmative determination means. At step 832, it is determined whether the load voltage Vfn has become zero as a result of the stoppage of the setting command output ITn at step 831. When the load voltage Vfn has been properly restored to zero and the result of the determination at step 832 is therefore YES, the process proceeds to step 833b. If the result of the determination at step 832 is NO, the process proceeds to step 833a.

Steps 833a and 833b are steps which constitute an abnormality history storing means, more specifically, a categorized abnormality history storing means. At steps 833a and 833b, abnormality information based on the result of the confirmative determination at step 832 is written and stored in the data memory 123 when an over-resistance is determined at step 830. At step 833a, the occurrence of a shorting abnormality at the switching element 181n in the duration of an energization command to the switching element 181n is recorded as abnormality history information. Abnormality history information recorded at step 833b is the occurrence of any of a breakage abnormality at the electrical load 103n, a breakage abnormality at the positive side wiring 103P, a breakage abnormality at the negative side wiring 103N, and a power line shorting abnormality that the positive side wiring 103P is contacted to the power supply line connected to the positive terminal of the DC driving power supply 101 in the duration of an energization command for the switching element 181n. The abnormality history information also includes the fact that no shorting abnormality has occurred at the switching element 181*n*. Steps 833*a* and 833*b* are followed by current control operation ending step 860.

Step 840 is a step which constitutes an under-resistance determination means. At step 840, it is determined whether the load resistance Rn calculated at step 808 is an abnormal value which is smaller than a minimum resistance Rmin of the electrical load 103*n* at low temperatures. When the result of the determination at step 840 is YES, the process proceeds to step 841. If the result of the determination at step 840 is NO, the process proceeds to step 860. Step 841 is a step which constitutes an abnormality processing means, more specifically, a relevant output stopping means and an abnormality notification means. At step 841, the relevant setting command output ITn is stopped, and the alarm output ER is generated to activate the alarm indicator 105. The subsequent step 843 is a step which constitutes an abnormality history storing means, more specifically, a categorized abnormality history storing means. At step 843, information of the occurrence of an under-resistance abnormality detected at step 840 is written and stored in the data memory 123. The occurrence of an under-resistance abnormality means that a shorting abnormality at the electrical load 103*n*, a grounding abnormality that is contact between the positive side wiring 103P and the vehicle body, and a breakage abnormality at the switching element 181*n* has occurred in the duration of an energization command to the switching element 181*n*. The occurrence of those abnormalities is stored in the data memory 123. Step 843 is followed by current control operation ending step 860. At this current control operation ending step 860, the microprocessor 120B executes control operations other than current control. Operation starting step 800 is activated again after a predetermined time passes to repeat the series of control operations.

The control flow will now be summarized. Step 801 is a step for monitoring the state of input of the alarm signal MNT to determine whether any negative breakage abnormality has been detected by the negative line breakage abnormality detection circuit 160B. The negative line breakage abnormality detection circuit 160B is enabled for abnormality detection when at least one of the plurality of electrical loads 103*a* to 103*c* is conducting. At step 813, a code number for a breakage abnormality at the negative line is stored, but no electrical load is specified. At steps 820*a* and 820*b*, the load voltage value Vfn measured by the load voltage monitoring circuit 300*n* is compared with the first and second threshold voltage values V1 and V2. At step 823, a code number for a shorting abnormality at the switching element 181*n* and a code number for the power line shorting abnormality at the positive side wiring 103P of the electrical load 103*n* are stored when the occurrence of an abnormality has been determined at step 820*a*, but it can not be specified which of the abnormalities has occurred. At step 823, a code number for a breakage abnormality at the electrical load 103*n* or a code number for a breakage at either the positive side wiring 103P or negative side wiring 103N of the electrical load 103*n* is stored when no abnormality has been determined at step 820*a* whereas the occurrence of an abnormality has been determined at step 820*b*. However, the position of the breakage cannot be identified.

Steps 830 and 840 execute abnormality determination using software by monitoring the resistance of the electrical load 103*n*. Any over-resistance or under-resistance is determined at steps 830 and 840 when the setting command output is generated. A code number for a shorting abnormality at the switching element 181*n* is stored at step 833*a*. At step 833*b*, a code number for a shorting abnormality at the electrical load 103*n* and a code number for a power line shorting abnormality at the positive side wiring 103P of the electrical load 103*n* are stored, but it cannot be specified which of a load breakage and a power line showing abnormality has occurred.

When there is a shorting abnormality which disallows the switching element 181*n* to be turned off, a voltage higher than the load voltage according to the target current value ISn is applied to the electrical load 103*n*. Although the negative feedback control circuit 190*n* decreases the energization duty γn in order to obtain a current closer to the target current value Isn, the load voltage Vfn stays at the maximum value instead of being decreased however the energization duty γn is decreased because of the shorting at the switching element 181*n*. As a result, the value of the estimated load resistance Rn calculated by Expression (10) becomes excessively large, and it is determined at step 830 that there is an over-resistance. When there is a breakage abnormality at the electrical load 103*n* or a power line shorting abnormality at the positive side wiring 103P, since the load current Ifn detected by the differential amplifier 150*n* for current detection abruptly decreases, the negative feedback control circuit 190*n* continues to increase the energization duty γn. As a result, the load voltage to achieve the target current value Isn is maximized to cause an abnormal increase occurs in the value of the estimated load resistance Rn calculated by Expression (10), and it is determined at step 830 that there is an over-resistance.

At step 832 constituting a confirmative determination means, it is determined whether the switching element 181*n* can be turned off to check whether a shorting abnormality has occurred at the switching element 181*n*. At step 843, code numbers for a shorting abnormality at the electrical load 103*n*, a grounding abnormality at the positive side wiring 103P of the electrical load 103*n*, and a breakage abnormality at the switching element 181*n* are stored, but it cannot be specified which of those abnormalities has occurred. When a shorting abnormality at the electrical load 103*n*, a grounding abnormality at the positive side wiring 103P, or a breakage abnormality at the switching element 181*n* occurs, the load voltage measured by the load voltage monitoring circuit 300*n* becomes zero, and the estimated load resistance Rn given by Expression (10) becomes excessively small. It is therefore determined at step 840 that there is an under-resistance. Referring to the storage of abnormality history at steps 813, 823, 833*a*, 833*b*, and 843, the history is temporarily stored in the RAM memory 122 during the operation of the power supply control unit 100B. When the power supply switch which is not shown is turned off, the load power supply relay contact 102*b* is immediately turned off, whereas the power supply switching relay contact 102*a* is broken with a delay. The history data are collectively transferred to the non-volatile data memory 123 during this delayed conducting period.

(23) Summaries and Characteristics of Embodiment 2

Embodiment 2 can be summarized and characterized as follows.

As apparent from the above description, the power supply control device for on-vehicle electrical loads according to Embodiment 2 of the invention is a power supply control device comprising a power supply control unit 100B. The power supply control unit 100B includes a plurality of load power supply circuits SPLa to SPLc (hereinafter represented by SPLn) for supplying power from a DC driving power supply 101 to a plurality of electrical loads 103*a* to 103*c* (hereinafter represented by 103*n*), respectively, through switching elements 181*a* to 181*c* (hereinafter represented by 181*n*), a plurality of load commutation circuits SWLa to SWLc (hereinafter represented by SWLn) for commutating load currents to the electrical loads 103n, and a power supply control circuit PCNTB for supplying energization command outputs DRn to the switching elements (181n). The load power supply circuits SPLn, the load commutation circuits SWLn, and the power supply control circuit PCNTB are contained in a housing 100a of the power supply control unit 100B. Commutation diodes 146a to 146c (hereinafter represented by 146n) are provided in the load commutation circuits SWLn, respectively, and the commutation diodes 146n are connected in parallel with the respective electrical loads 103n to cause currents which have been flowing through the electrical loads 103n to flow back when the switching elements 181n of the load power supply circuits SPLn are turned off. The commutation diodes 146n are connected to a vehicle body outside the housing 100a separately from an internal ground circuit GND2 of the power supply control unit 100B by external individual negative lines 104a to 104c (hereinafter represented by 104n) constituting an external negative line. The power supply control circuit PCNTB includes an individual abnormality detection circuit IADETB, a negative line breakage abnormality detection circuit 160B, abnormality processing means 811, 821, 831, and 841, and abnormality history storing means 813, 823, 843, 833a, and 833b. The power supply control circuit PCNTB is configured by using a microprocessor 120B. The microprocessor 120B is configured to operate in conjunction with a non-volatile program memory 121B in which at least a control program serving as energization command means for the switching elements 181n is stored, a data memory 123, a RAM memory 122 for arithmetic processes, and a multi-channel A-D converter 124. The individual abnormality detection circuit IADETB includes a plurality of power supply state detection circuits PDETBa to PDETBc (hereinafter represented by PDETBn) for detecting amounts of power, specifically, load currents Ifn supplied to the electrical loads 103n and means for determining an individual abnormal state when the amount of power supplied to a certain electrical load among the electrical loads 103n deviates from a target amount of supplied power. The individual abnormal state is either breakage or shorting of at least one of the electrical load, the positive side wiring 103P of the electrical load, the negative side wiring 103N of the electrical load, and the switching element associated with the electrical load. The negative line breakage abnormality detection circuit 160B is a circuit for determining a line breakage abnormality at the external individual negative lines 104n by detecting that an electric potential on an anode side of each commutation diode 146n is different from an electric potential at the internal ground circuit GND2 of the power supply control unit 100B. The abnormality processing means 811, 821, 831, and 841 are means for stopping the energization command output to the switching elements when at least either an individual abnormality or a breakage abnormality at the external individual negative lines 104n is detected and for providing a notice of the abnormality. The abnormality history storing means 813, 823, 843, 833a, and 833b are means for storing and saving the history of occurrence of individual abnormalities and breakage abnormalities at the external individual negative line 104n in the data memory 123 with identification of the abnormalities.

In the power supply control device for on-vehicle electrical loads in Embodiment 2, the commutation diodes 146n connected in parallel with the plurality of electrical loads 103n, respectively, supplied with power from the DC driving power supply 101 through the respective switching elements 181n are connected to the vehicle body outside the housing 100a of the power supply control unit 100B separately from the internal ground circuit GND2 of the power supply control unit 100B by the external individual negative lines 104n. Therefore, neither load current nor commutation current flows to the internal ground circuit GND of the power supply control unit 100B, which is advantageous in that the electric potential at the internal ground circuit GND2 can be stabilized to allow the power supply control circuit PCNTB of the power supply control unit 100B to be operated with stability. Breakage abnormalities and shorting abnormalities at the electrical loads 103n, the positive side wirings 103P thereof, the negative side wirings 103N thereof, and the switching elements 181n are detected by the individual abnormality detection circuit IADETB, and breakages at the external individual negative lines 104n associated with the commutation diodes 146n are detected by the negative line breakage abnormality detection circuit 160B. Measures are taken against those abnormalities, and the abnormalities are identified and stored by the abnormality history storing means 813, 823, 843, 833a, and 833b. Therefore, the efficiency of maintenance and inspection can be advantageously improved by reading history information at the time of maintenance and inspection.

In Embodiment 2, bypass resistors 147a to 147c (hereinafter represented by 147n) are connected in parallel with the commutation diodes 146n. The negative line breakage abnormality detection circuit 160B includes a detection resistor 264 which is supplied with power from each of a bypass resistor 147n through a combined block diode 269 when there is a breakage at the external individual negative lines 104n with the switching element 181n in an on-state, and the circuit further includes the determination element 161. The determination element 161 determines that a breakage has occurred at the external individual negative lines 104n based on the fact that the detection resistor 264 has been energized and supplies an alarm signal MNT to the microprocessor 120B. This configuration is characterized in that no excessively high surge voltage is applied to the negative line breakage abnormality detection circuit 160B because a surge current superimposed on the internal ground circuit GND2 of the power supply control unit 100B when there is a breakage at the external individual negative lines 104n is blocked by the combined block diode 269.

In Embodiment 2, the anode terminals A of the commutation diodes 146n are connected to the vehicle body outside the housing 100a through the external individual negative lines 104n. A separated ground GND4 connecting the external individual negative lines 104n to the vehicle body is separated from at least a unit ground GND1 which connects the internal ground circuit GND2 of the power supply control unit 100B to the vehicle body. The distance between a load ground GND3 connecting negative terminals of the electrical loads 103n to the vehicle body and the separated ground GND4 is smaller than the distance between the unit ground GND1 and the separated ground GND4. This configuration is characterized in that the section of the vehicle body through which a commutation surge current attributable to a commutation diode 146n flows can be made short to suppress electric potential fluctuations at the vehicle body.

In Embodiment 2, the power supply state detection circuits PDETBn have current detecting differential amplifier circuits 150a to 150c (hereinafter represented by 150n), respectively. A current detecting differential amplifier circuit 150n is a circuit for amplifying a differential voltage across a current detection resistor 141n connected between a switching element 181n and an electrical load 103n with a differential amplifier 151n to generate a monitoring voltage Efn proportionate to a load current Ifn at the electrical load 103n. A non-inverting input terminal of the differential amplifier 151n is connected to a point of connection between the switching element 181n and the current detection resistor 141n through first and second series resistors 142n and 152n. A first negative voltage suppressing diode 144n is connected between a point of connection between the first and second series resistors 142n and 152n and the internal ground circuit GND2 of the power supply control unit 100B. An inverting input terminal of the differential amplifier 151n is connected to a point of connection between the current detection resistor 141n and the electrical load 103n through third and fourth series resistors 143n and 153n. A second negative voltage suppressing diode 145n is connected between a point of connection between the third and fourth series resistors 143n and 153n and the internal ground circuit GND2 of the power supply control unit 100B. Thus, an excessively high negative voltage applied to the differential amplifier 151n when there is a breakage at the external individual negative lines 104n for the commutation diodes 146n is suppressed by the first and second negative voltage suppressing diodes 144n and 145n. This configuration is characterized in that damage to the differential amplifier 151n by a surge voltage generated by the electrical load 103n can be prevented when there is a breakage at the external individual negative lines 104n. The configuration is also characterized in that a surge current superimposed on the internal ground circuit GND2 of the power supply control unit 100B when a breakage occurs at the external individual negative lines 104n can be suppressed to a very small value by the first and third series resistors 142n and 143n.

In Embodiment 2, the power supply state detection circuits PDETBn have load voltage monitoring circuits 300a to 300c (hereinafter represented by 300n), respectively. A load voltage monitoring circuit 300n includes an analog input circuit which inputs a voltage proportionate to the load voltage Vfn applied to one resistor 302n of a couple of voltage dividing resistors 301n and 302n connected between a point of connection between the current detection resistor 141n and the electrical load 103n and the internal ground circuit GND2 of the power supply control unit 100B to the microprocessor 120B. A clip diode 305n connected to the internal ground circuit GND2 at an anode terminal thereof is connected in parallel with the resistor 302n of the couple of voltage dividing resistors 301n and 302n. The clip diode 305n suppresses an excessively high negative voltage applied to the load voltage monitoring circuit 300n when there is a breakage at the external individual negative lines 104n associated with the commutation diodes 146n. This configuration is characterized in that damage to the load voltage monitoring circuit 300n attributable to a surge voltage generated by the electrical load 103n can be prevented when there is a breakage at the external individual negative lines 104n. The configuration is also characterized in that a surge current superimposed on the internal ground circuit GND2 of the power supply control unit 100B when a breakage abnormality occurs at the external individual negative lines 104n can be suppressed to a very small value by the other resistor 301n of the couple of voltage dividing resistors 301n and 302n.

In Embodiment 2, the power supply control circuit PCNTB includes negative feedback control circuits 190a to 190c (hereinafter represented by 190n). The non-volatile program memory 121B includes a control program including target current command means 850 which constitutes the energization command means. A power supply voltage measurement signal Vd which is an analog signal supplied by a power supply voltage measurement circuit 115 and a load voltage measurement signal Vfn which is an analog signal supplied by a load voltage monitoring circuit 300n are input to the microprocessor 120B. The target current command means 850 is means for generating a setting command output ITn having a variable duty an proportionate to an energization target current Isn for an electrical load 103n. The negative feedback control circuit 190n controls the turning on/off of the switching element 181n by generating the energization command output DRn having a variable duty γn in accordance with an integrated value of a deviation between a set voltage Esn proportionate to a target current Isn obtained by smoothing the setting command output ITn and a monitoring voltage Efn proportionate to the load current Ifn detected by the differential amplifier 150n for current detection. The power supply voltage measuring circuit 115 includes voltage dividing resistors 111 and 112 for dividing the driving power supply voltage Vb supplied by the DC driving power supply 101 and inputting the resultant voltage to the microprocessor 120B. The load voltage monitoring circuit 300n is an analog circuit which supplies the microprocessor 120B with a load voltage measurement input Vfn proportionate to the load voltage Vfn applied to one resistor 302n of the couple of voltage dividing resistors 301n and 302n connected between a point of connection between the current detection resistor 141n and the electrical load 103n and the internal ground circuit GND2 of the power supply control unit 100B. This configuration is characterized in that the control burden of the microprocessor 120B can be distributed between the plurality of electrical loads 103n to perform highly accurate current control. The configuration is also characterized in that various abnormalities can be determined by providing the microprocessor 120B with a feedback of monitoring signals in analog values representing load voltages Vfn.

In Embodiment 2, the power supply control circuit PCNTB includes leakage resistors 149n having a high resistance connected in parallel with the switching elements 181n and load voltage dividing circuits 1410n provided on the output side of the switching elements 181n. The non-volatile program memory 121B includes a program including first and second comparison/determination means 820b and 820a for comparing a load voltage Vfn obtained by a load voltage monitoring circuit 300n with each of first and second threshold voltages V1 and V2. A leakage resistor 149n supplies such a very small load current that the electrical load 103n will not be activated when the switching element 181n is off. The load voltage dividing circuit 1410n includes a bypass resistor 147n which is connected between either a point connecting the switching element 181n and the current detection resistor 141n or a point connecting the current detection resistor 141n and the electrical load 103n and either the anode terminal A of the commutation diode 146n or the internal ground circuit GND2 of the power supply control unit 100B. The first threshold voltage V1 is proportionate to a voltage applied to the bypass resistor 147n through the leakage resistor 149n at the time of occurrence of a breakage abnormality including a breakage at any of the electrical load 103n, the positive side wiring 103P of the electrical load 103n, and the negative side wiring 103N of the electrical load 103n. The second threshold voltage V2 is proportionate to a voltage applied to the bypass resistor 147n at the time of occurrence of either shorting abnormality at the switching element 181n or power line shorting that the positive side wiring 103P of the electrical load 103n is contacted to the power supply line. When the breakage abnormality occurs, the output logic of the first comparison/determination means 820b is inverted to provide a notice of the breakage abnormality. When there is either shorting abnormality at the switching element 181n or power line shorting abnormality at the positive side wiring 103P of the electrical load 103n, the output logic of the second comparison/determination means 820a is inverted to provide a notice of the abnormality. This configuration is characterized in that identification or determination can be made before energization is started with a simple detection circuit on whether there is a breakage abnormality at an electrical load 103n or a breakage abnormality at the positive side wiring 103P or negative side wiring 103N of the same or whether there is a power line shorting abnormality at the positive side wiring 103P or a shorting abnormality at the switching element 181n.

In Embodiment 2, the non-volatile program memory 121B includes a control program including load resistance estimation means 808 and at least either under-resistance determination means 840 or over-resistance determination means 830. The load resistance estimation means 808 performs a calculation to estimate a current resistance value Rn of an electrical load 103n, which is equivalent to Vfn/Isn, based on a load voltage Vfn measured by the load voltage monitoring circuit 300n and a target command current Isn instructed by a target current command means 850. The under-resistance determination means 840 generates an abnormality determination output when the load resistance Rn estimated by the load resistance estimation means 808 is smaller than a minimum load resistance Rmin in a low temperature environment, thereby providing a notice of the occurrence of any of a shorting abnormality at the electrical load 103n, a grounding abnormality that is contact between the positive side wiring 103P and the vehicle body, and a shorting abnormality at the switching element 181n in the duration of the energization command for the switching element 181n. The over-resistance determination means 830 generates an abnormality determination output when the load resistance Rn estimated by the load resistance estimation means 808 is greater than a maximum load resistance Rmax in a high temperature environment, thereby providing a notice of the occurrence of any of a breakage abnormality at the electrical load 103n, a breakage abnormality at the positive side wiring 103P, a breakage abnormality at the negative side wiring 103N, a power line shorting abnormality at the positive side wiring 103P, and a breakage abnormality at the switching element 181n in the duration of the energization command for the switching element 181n. This configuration is characterized in that it is possible to detect abnormal states using inexpensive means without relying on hardware, the abnormal states including breakage abnormalities at the electrical loads 103n, power line shorting abnormalities at the positive side wirings 103P, shorting abnormalities at the electrical loads 103n, grounding abnormalities at the positive side wirings 103P, breakage abnormalities at the switching elements 181n, and shorting abnormalities at the switching elements 181n.

In Embodiment 2, the over-resistance determination means 830 further includes a confirmative determination means 832. When the over-resistance determination means 830 determines that there is a state of over-resistance, the confirmative determination means 832 stores the fact that neither the shorting abnormality at the switching element 181n nor power line shorting abnormality at the positive side wiring 103P has occurred as abnormality history information if the load voltage Vfn has dropped after the setting command output ITn to the negative feedback control circuit 190n was stopped. This configuration is characterized in that the efficiency of maintenance and inspection operations can be improved by identifying and storing the cause of a state of over-resistance as a power line shorting abnormality at a positive side wiring 103P, a breakage abnormality at an electrical load 103n or a shorting abnormality at a switching element 181n.

In Embodiment 2, the abnormality processing means 811, 821, 831, and 841 provide an abnormality notice by stopping the energization command to an electrical load not only when a breakage abnormality is detected at the negative line but also when either of a shorting abnormality at an electrical load 103n or a grounding abnormality at the positive side wiring 103P of an electrical load 103n is detected. The abnormality history storing means 813, 823, 843, 833a, and 833b write and store information on a shorting abnormality at an electrical load 103n and a grounding abnormality at a positive side wiring 103P in the data memory 123 in addition to the history of occurrence of breakage abnormalities. This configuration is characterized in that comprehensive history information can be stored in accordance with the contents of abnormalities to facilitate maintenance and inspections because an energization command to an electrical load 103n is stopped and an abnormality notice is provided not only when there is a breakage abnormality but also when there is a shorting abnormality at the electrical load 103n or a grounding abnormality at the positive side wiring 103P thereof.

Embodiment 3

(31) Configuration of Embodiment 3

Figure 9:
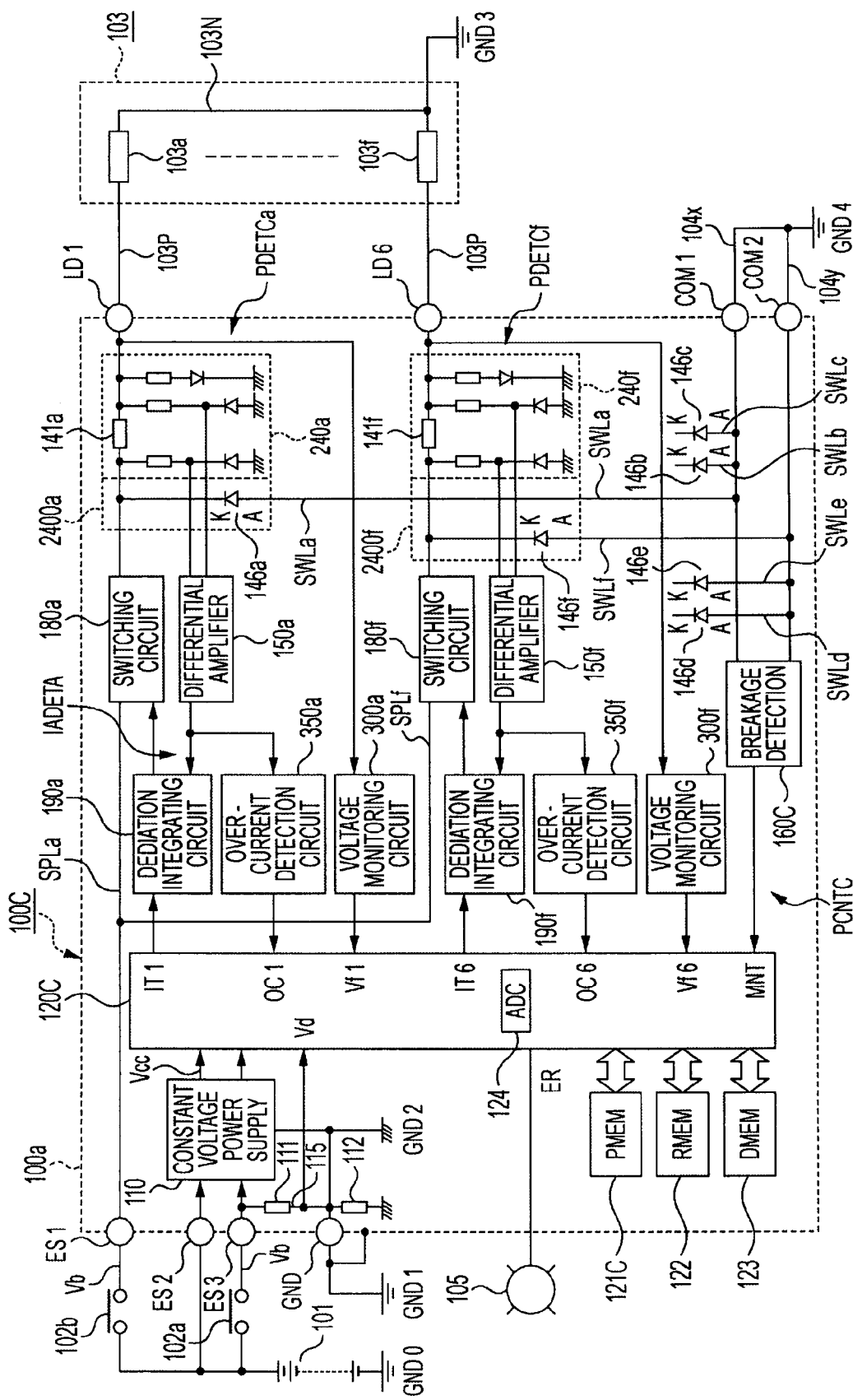
FIG. 9 is a general circuit diagram of Embodiment 3 of a power supply control device for on-vehicle electrical loads according to the invention.

FIG. 9 is a general circuit diagram of Embodiment 3 of a power supply control device for on-vehicle electrical loads according to the invention. The configuration of Embodiment 3 will be described with reference to FIG. 9 with the focus of the description put on differences from Embodiment 1 shown in FIG. 1 and Embodiment 2 shown in FIG. 5, and parts identical or equivalent to those in FIG. 1 are indicated by like reference numerals and signs.

In Embodiment 3, as shown in FIG. 9, a power supply control unit 100C is used instead of the power supply unit 100A used in Embodiment 1. The power supply control unit 100C controls supply of power from a DC driving power supply 101 to a group of on-vehicle electrical loads. The group of on-vehicle electrical loads includes a load circuit 103. The load circuit 103 includes a plurality of electrical loads which are, for example, six electrical loads 103a to 103f in FIG. 9. The electrical loads 103a to 103f are inductive on-vehicle electrical loads. A negative terminal of each of the electrical loads 103a to 103f is connected to the vehicle body at a load ground GND3. The control unit 100C controls supply of power from the DC driving power supply 101 to the electrical loads 103a to 103f.

The power supply control unit 100C is contained in a sealed housing 100a. The power supply control unit 100C includes a power supply input terminals ES1, ES2, and ES3, a unit ground terminal GND, load output terminals LD1 to LD6, and two common terminals COM1 and COM2. Each of the terminals is disposed in the housing 100a and electrically insulated from the housing 100a. The power supply input terminals ES1, ES2, and ES3 and the unit ground terminal GND are configured similarly to those in Embodiment 1. The load output terminals LD1 to LD6 are provided in association with the electrical loads 103a to 103f. The unit ground terminal GND is connected to a vehicle body at a unit ground GND1 along with an internal ground circuit GND2 just as in Embodiment 1.

The common terminals COM1 And COM2 of the power supply control unit 100C are connected to the vehicle body at a separated ground GND4 in the vicinity of the common terminals COM1 and COM2 through external common negative lines 104x and 104y, respectively. The terminals are connected to a load ground GND3 through the vehicle body and connected to negative side wirings 103N of the electrical loads 103a to 103f. The distance between the separated ground GND4 and the load ground GND3 is smaller than the distance between the separated ground GND4 and the unit ground GND1. As a result, resistance between the separated ground GND4 and the load ground GND3 is smaller than resistance between the separated ground GND4 and the unit ground GND1, and fluctuations of an electric potential at the vehicle body attributable to commutation at the electrical loads 103a to 103f can therefore be kept small.

The power supply control unit 100C incorporates load power supply circuits SPLa to SPLf associated with the electrical loads 103a to 103f, load commutation circuits SWLa to SWLf, and a power supply control circuit PCNTC. The power supply control circuit PCNTC is primarily constituted by a microprocessor 120C. The power supply control circuit PCNTC includes a control power supply circuit 110, switching circuits 180a to 180f, commutation circuits 2400a to 2400f, an individual abnormality detection circuit IADETC, and a negative line breakage abnormality detection circuit 160C. The individual abnormality detection circuit IADETC detects individual abnormalities at the electrical loads 103a to 103f, and the negative line breakage abnormality detection circuit 160C detects abnormalities at the external common negative lines 104x and 104y.

The individual abnormality detection circuit IADETC is constituted by power supply state detection circuits PDETCa to PDETCf provided in association with the electrical loads 103a to 103f, respectively, and the microprocessor 120C. The power supply state detection circuit PDETCa associated with the electrical load 103a includes a current detection circuit 240a, a current detecting differential amplifier circuit 150a, a negative feedback control circuit 190a, a load voltage monitoring circuit 300a, and an over-current detection circuit 350a. Similarly, the power supply state detection circuit PDETCf associated with the electrical load 103f includes a current detection circuits 240f, a current detecting differential amplifier circuit 150f, a negative feedback control circuit 190f, a load voltage monitoring circuit 300f, and an over-current detection circuit 350f.

The current detecting differential amplifier circuits 150a to 150f are configured similarly to those in Embodiment 1. The microprocessor 120C is used instead of the microprocessor 120A in Embodiment 1. The switching circuits 180a to 180f, the negative feedback control circuits 190a to 190f, and the load voltage monitoring circuits 300a to 300f are configured similarly to those in Embodiment 2. The commutation circuits 2400a to 2400f are provided by modifying the configuration of the commutation circuits 1400a to 1400c of Embodiment 1, and the current detection circuits 240a to 240f are provided by modifying the configuration of the current detection circuits 140a to 140c of Embodiment 1. The over-current detection circuits 350a to 350f are elements newly provided in the power supply control unit 100C of Embodiment 3. The negative line breakage abnormality detection circuit 160C is used instead of the negative line breakage abnormality detection circuit 160A in Embodiment 1.

The load power supply circuits SPLa to SPLf are formed between the power supply input terminal ES1 and the load output terminals LD1 to LD6 in the same way as in Embodiment 1. The load commutation circuits SWLa to SWLc of the power supply control unit 100C are formed between the common terminal COM1 and the load power supply circuits SPLa to SPLc, respectively. Similarly, the load commutation circuits SWLd to SWLf are formed between the common terminal COM2 and the load power supply circuits SPLd to and SPLf, respectively. Specifically, the load commutation circuits SWLa to SWLc are connected to the common terminal COM1 at one end thereof and connected to the load power supply circuits SPLa to SPLc between the switching circuits 180a to 180c and the current detection circuit 240a to 240c, respectively, at another end thereof. Similarly, the load commutation circuits SWLd to SWLf are connected to t common terminal COM2 at one end thereof and connected to the load power supply circuits SPLd to SPLf between the switching circuits 180d to 180f and the current detection circuit 240d to 240f, respectively, at another end thereof. The commutation circuits 2400a to 2400f are disposed at the load commutation circuits SWLa to SWLf, respectively.

The microprocessor 120C, which is a major constituent part of the power supply control circuit PCNTC, is bus-connected to a non-volatile program memory 121C constituted by, for example, a non-volatile flash memory which can be electrically erased at once to allow writing and which can be read, a RAM memory 122 for arithmetic processes, a data memory 123 constituted by a non-volatile EEPROM which can be electrically written and read byte by byte, and a multi-channel A-D converter 124. The microprocessor is configured for mutual cooperation with those elements.

The switching circuits 180a to 180f are supplied with power from the DC driving power supply 101 through a load power supply relay contact 102b and the power supply input terminal ES1. The circuits 180a to 180f supply power to the electrical loads 103a to 103f through current detection resistors 141a to 141f of the current detection circuits 240a to 240f and the load output terminals LD1 to LD6, respectively. The switching circuits 180a to 180f are turned on/off under the control of energization command outputs DR1 to DR6 generated by the negative feedback control circuits 190a to 190f to supply the electrical loads 103a to 103f with load voltages proportionate to energization duties which are ratios of on-times to on/off periods. Details of the current detection circuit 240a will be described later with reference to FIG. 10.

Commutation diodes 2400a to 2400f are provided in the load commutation circuits SWLa to SWLf, respectively. Commutation diodes 146a to 146f of the commutation circuits 2400a to 2400f are connected in parallel with series circuits formed by the current detection resistors 141a to 141f and the electrical loads 103a to 103f, respectively. Anode terminals A of the commutation diodes 146a to 146c associated with the electrical loads 103a to 103c are commonly connected to the common terminal COM1. Similarly, anode terminals A of the commutation diodes 146d to 146f associated with the electrical loads 103d to 103f are commonly connected to the common terminal COM2. Details of the commutation circuit 2400a will be described later with reference to FIG. 10.

The current detecting differential amplifier circuits 150a to 150f are configured similarly to the current detecting differential amplifier circuit 150a in Embodiment 1. The current detecting differential amplifier circuits 150a to 150f perform differential amplification of voltages across the current detection resistors 141a to 141f, respectively, to supply monitoring voltages Ef1 to Ef6 proportionate to load currents If1 to If6 flowing through the electrical loads 103a to 103f to inputs of the negative feedback control circuits 190a to 190f on one side thereof. The over-current detection circuits 350a to 350f are inputted to the micro processor 120C with generation of an alarm signals OC1 to OC6 when the output voltage of the corresponding current detecting differential amplifier circuits 150a to 150f exceeds the predetermined value.

Based on a program serving as a target current command means stored in the non-volatile program memory 121C, the microprocessor 120C generates outputs IT1 to IT6 commanding setting of energization duties α1 to α6 proportionate to target current values Is1 to Is6, respectively, and supplies the setting command outputs IT1 to IT6 to other inputs of the negative feedback control circuits 190a to 190f. The negative feedback control circuits 190a to 190f generate energization command outputs DR1 to DR6 having variable duties in accordance with integrated values of deviations between set voltages Es1 to Es6 which are proportionate to the target current values Is1 to Is6 obtained by smoothing the setting command outputs IT1 to IT6 and the monitoring voltages Ef1 to Ef6 which are proportionate to the load current values If1 to If6 detected by the current detecting differential amplifier circuits 150a to 150f, respectively. The circuits thus control the turning on/off the switching element 181a to 181f of the switching circuits 180a to 180f with the energization command outputs DR1 to DR6. The negative line breakage abnormality detection circuit 160C detects breakages at the external common negative lines 104x and 104y and breakages at the negative lines attributable to contact failures at the common terminals COM1 and COM2 and supplies the alarm signal MNT to the microprocessor 120C. Details of the negative line breakage abnormality detection circuit 160C will be described later with reference to FIG. 10.

The load voltage monitoring circuits 300a to 300f monitor voltages at the load output terminals LD1 to LD6 to which positive side wirings 103P of the electrical loads 103a to 103f are connected respectively and supplies load voltage measurement inputs Vf1, which are analog signals proportionate to load voltages Vf1 to Vf6, to the microprocessor 120C.

The switching circuits 180b to 180f, the current detection circuits 240b to 240f, the current detecting differential amplifier circuits 150b to 150f, the over-current detection circuits 350b to 350f, the load voltage monitoring circuits 300b to 300f, and the negative feedback control circuits 190b to 190f associated with the electrical loads 103b to 103f are configured similarly to the switching circuit 180a, the current detection circuit 240a, the current detecting differential amplifier circuit 150a, the over-current detection circuit 350a, the load voltage monitoring circuit 300a, and the negative feedback control circuit 190a associated with the electrical load 103a, respectively. The microprocessor 120C generates the setting command outputs IT1 to IT6 and operates on the load voltage measurement inputs Vf1 to Vf6 and the power supply voltage measurement input Vd as analog inputs and the alarm signals OC1 to OC6 as logical signal inputs.

Figure 10:
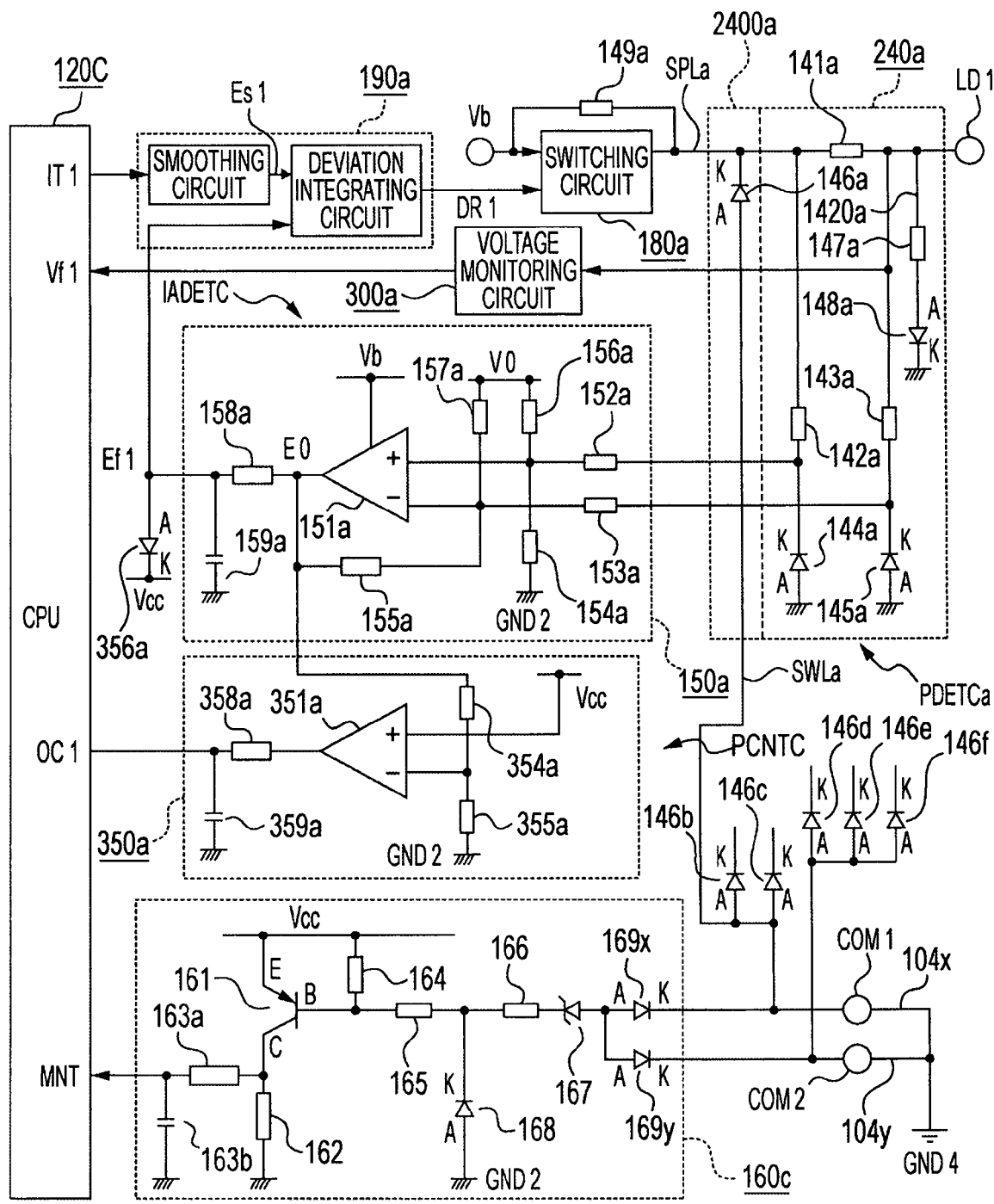
FIG. 10 is a detailed circuit diagram of a major part of Embodiment 3.

FIG. 10 is a detailed circuit diagram of a major part of Embodiment 3 shown in FIG. 9. FIG. 10 shows details of the current detection circuit 240a, the commutation circuit 2400a, the negative feedback control circuit 190a, the current detecting differential amplifier circuit 150a, the over-current detection circuit 350a, and the negative line breakage abnormality detection circuit 160C which are associated with the electrical load 103a. The description will be made with reference to FIG. 10 and will be focused on differences from what is shown in FIGS. 2 and 6. The current detection circuits 240b to 240f, the commutation circuits 2400b to 2400f, the negative feedback control circuits 190b to 190f, the current detecting differential amplifier circuits 150b to 150f, and the over-current detection circuits 350b to 350f associated with the other electrical loads 103b to 103f are configured similarly to the current detection circuit 240a, the commutation circuit 2400a, the negative feedback control circuit 190a, the current detecting differential amplifier circuit 150a, and the over-current detection circuit 350a shown in FIG. 10, respectively.

Referring to FIG. 10, the switching circuit 180a, the current detecting differential amplifier circuit 150a, the negative feedback control circuit 190a, and the load voltage monitoring circuit 300a are similar in configuration to those in FIG. 6. In the current detection circuit 240a, a bypass resistor 147a connected in parallel with the commutation diode 146a is incorporated in the current detection circuit 240a, and the bypass resistor 147a form a load voltage dividing circuit 1420a in combination with a leakage resistor 149a and a block diode 148a. One end of the bypass resistor 147a is connected to the load output terminal LD1, and another end of the resistor is connected to the internal ground circuit GND2 of the power supply control unit 100C. A cathode terminal K of the block diode 148a is connected to the internal ground circuit GND2, and an anode terminal A of the diode is connected to the bypass resistor 147a. One terminal of the bypass resistor 147a may be connected either side of the current detection resistor 141a, and another terminal of the resistor 147a may be connected to the anode terminal of the commutation diode 146a. The load voltage dividing circuit 1420a has a function similar to that of the load voltage dividing circuit 1410a in embodiments 1 and 2.

The over-current detection circuit 350a includes a comparison/detection circuit 351a, an output resistor 358a, a smoothing capacitor 359a, and voltage dividing resistors 354a and 355a. The output resistor 358a supplies the alarm signal OC1 to the microprocessor 120C. The voltage dividing resistors 354a and 355a divide an output voltage E0 of a differential amplifier 151a of the current detecting differential amplifier circuit 150a and supplies the resultant voltage to an inverting input terminal of the comparison/determination circuit 351a. The control power supply voltage Vcc is applied to an non-inverting input terminal of the comparison/determination circuit 351a.

In Embodiment 3, the output voltage E0 of the differential amplifier 151a of the current detecting differential amplifier circuit 150a is a voltage upstream of the monitoring voltage Ef1 input to the negative feedback control circuit 190a. The monitoring voltage Ef1 is clamped by a voltage clamping diode 356a such that will not equal or exceed the level of the control power supply voltage Vcc. An anode terminal A of the voltage clamping diode 356a is connected to the output resistor 158a of the current detecting differential amplifier circuit 150a, and a cathode terminal K of the diode is connected to the control power supply voltage Vcc. Since the differential amplifier 151a in Embodiment 3 operates on the driving power supply voltage Vb, the output voltage E0 normally varies within the range from 0 to Vcc (=5 volts) depending on the magnitude of the load current flowing through the electrical load 103a. However, the voltage E0 increases to equal the voltage Vb (=10 to 16V) when an abnormality such as a shorting fault of the switching element 181a of the switching circuit 180a occurs.

The negative line breakage abnormality detection circuit 160C has a determination element 161 constituted by a PNP transistor to which the control power supply voltage Vcc is supplied. A connector terminal C of the determination element 161 is connected to the internal ground circuit GND2 through a collector resistor 162 and is also connected to an alarm signal terminal of the microprocessor 120C through an output resistor 163a. The integrating capacitor 163b is charged from the output resistor 163a to form a smoothing circuit.

A stabilizing resistor 164 for an off-state of the determination element 161 is connected between an emitter terminal E and a base terminal B of the determination element 161. The base terminal B of the determination element 161 is connected to the common terminals COM1 and COM2 through a base resistor 165, a current limiting resistor 166, a constant voltage diode 167, and combined diodes 169x and 169y. An anode terminal A of a clip diode 168 is connected to the internal ground circuit GND2, and a cathode terminal of the diode is connected to a point of connection between the base resistor 165 and the current limiting resistor 166.

When any of the switching circuits 180a to 180c interrupts the load current while there is a breakage at the external common negative line 104x connected to the common terminal COM1, the determination element 161 is caused to be conducting by a surge current which flows from the base resistor 165 to the load output terminals LD1 to LD3 via the current limiting resistor 166, the constant voltage diode 167, the combined diode 169x, the commutation diodes 146a to 146c, and the current detection resistors 141a to 141c. The determination element thus changes the logical level of the alarm signal MNT to "H" to input the occurrence of the negative line breakage abnormality to the microprocessor 120C.

Similarly, when any of the switching circuits 180d to 180f interrupts the load current while there is a breakage at the external common negative line 104y connected to the common terminal COM2, the determination element 161 is caused to be conducting by a surge current which flows from the base resistor 165 to the load output terminals LD4 to LD6 via the current limiting resistor 166, the constant voltage diode 167, the combined diode 169y, the commutation diodes 146d to 146f, and the current detection resistors 141d to 141f. The determination element thus changes the logical level of the alarm signal MNT to "H" to input the occurrence of the negative line breakage abnormality to the microprocessor 120C.

The determination element 161 detects negative electric potentials generated at the anode terminals A of the commutation diodes 146a to 146f when the load currents to the electrical loads 103a to 103f are interrupted to generate the alarm signal MNT. When the common terminals COM1 and COM2 are properly connected to the vehicle body through the external common negative lines 104x and 104y, no electric potential is generated at the anode terminals A of the commutation diodes 146a to 146f, and the alarm signal MNT generated by the determination element 161 is at the logical level "L" which indicate a normal state.

(32) Effects and Operations of Embodiment 3

Effects and operations of Embodiment 3 of the invention shown in FIGS. 9 and 10 will now be described. Referring to FIG. 9, when a power supply switch which is not shown is turned on, the power supply switching relay contact 102a is turned on to apply the driving power supply voltage Vb to the control power supply circuit 110, and the control power supply circuit 110 generates the control power supply voltage Vcc and supplies it to the microprocessor 120C. When the microprocessor 120C starts operating, the load power supply relay contact 102b is turned on by an energization circuit which is not shown. Based on an operation control program stored in the non-volatile program memory 121C, the microprocessor 120C determines which of the plurality of electrical loads 103a to 103f is to be supplied with a load current and determines the amount of the load current. The microprocessor thereafter generates the setting command outputs IT1 to IT6 which are pulse outputs of the energization duties α1 to α6 proportionate to the target load current values Is1 to Is6 based on a control program to serve as a target current command means stored in the non-volatile program memory 121C.

The negative feedback control circuit 190a controls the turning on/off of the switching element 181a of the switching circuit 180a by generating the energization command output DR1 having a variable duty γ1 in accordance with an integrated value of a deviation between the set voltage Es1 which is proportionate to the target load current value Is1 for the electrical load 103a obtained by smoothing the setting command output IT1 and the monitoring voltage Ef1 which is proportionate to the load current If1 detected by the current detecting differential amplifier circuit 150a. The other negative feedback control circuits 190b to 190f operate in the same manner.

When the switching element 181a is on, the load current If1 flows from the positive terminal of the DC driving power supply 101 and circulates through a path formed by the load power supply relay contact 102b, the power supply input terminal ES1, the switching element 181a, the current detection resistor 141a, load output terminal LD1, the positive side wiring 103P, the electrical load 103a, the negative side wiring 103N, the load ground GND3, the vehicle body, and a power supply ground GND0 back to the negative terminal of the DC driving power supply 101. No load current flows to the internal ground circuit GND2 of the power supply control unit 100C at all. When the switching element 181a is turned off, the load current If1 flows from the negative terminal off the electrical load 103a and circulates through a path formed by the negative side wiring 103N, the load ground GND3, the vehicle body, the separated ground GND4, the external common negative line 104x, the common terminal COM1, the commutation diode 146a, the current detection resistor 141a, the load output terminal LD1, and the positive side wiring 103P back to the positive terminal of the electrical load 103a. In this case again, no load current flows to the internal ground circuit GND2 of the power supply control unit 100C at all. The load currents If2 to If6 of the electrical loads 103b to 103f flow similarly. The above description holds true when the external common negative lines 104x and 104y are extended to the position of the load ground GND3 instead of connecting them to the vehicle body at the separated ground GND4.

Let us now assume that the external common negative lines 104x to 104y are not provided and that the anode terminal A of the commutation diode 146a is connected to the internal ground circuit GND2 of the power supply control unit 100C. In this case, when the switching element 181a is turned off, the load current If1 flows from the negative terminal of the electrical load 103a and circulates through a path formed by the negative side wiring 103N, the load ground GND3, the unit ground GND1, the unit ground terminal GND, the internal ground circuit GND2, the commutation diode 146a, the current detection resistor 141a, the load output terminal LD1, and the positive side wiring 103P back to the positive terminal of the electrical load 103a. A problem arises in that a commutation surge current flows into the internal ground circuit GND2 to cause fluctuations of the electric potential at the internal ground circuit GND2.

In Embodiment 3, the anode terminals A of the commutation diodes 146a to 146f are connected to the vehicle body outside the power supply control unit 100C, which makes it possible to prevent the load currents If1 to If6 from flowing into the internal ground circuit GND2 of the power supply control unit 100C. On the contrary, when there is a contact failure at the common terminals COM1 and COM2 or a breakage abnormality at the external common negative lines 104x and 104y, the commutating function of the commutation diodes 146a to 146f is deteriorated, which results in another problem in that an induced surge voltage is generated by inductive components of the electrical loads 103a to 103f when the switching elements 181a to 181f are turned off. The surge voltage is suppressed to, for example, about 50 volts by voltage clamping diodes 184a (see FIG. 6) for suppressing an off-voltage provided at the switching elements 181a to 181f. However, the suppressed surge voltage will be applied to all circuits in the power supply control unit 100C which are connected between the internal ground circuit GND2 and the load output terminals LD1 to LD6.

Referring to FIG. 6, the block diode 148a of the current detection circuit 240a blocks a countercurrent attributable to the suppressed surge voltage. First and second negative voltage suppressing diodes 144a and 145a of the current detection circuit 240a suppress input electric potentials of the differential amplifier 151a of the current detecting differential amplifier 150a to negative electric potentials of, for example, about 1 volt that is the forward voltage of the first and second negative voltage suppressing diodes 144a and 145a. The first and third series resistors 142a and 143a of the current detection circuit 240a suppress a surge current which circulates from the unit ground GND1 to the load output terminal LD1 via the internal ground circuit GND2 and the first or second negative voltage suppressing diode 144a or 145a, thereby suppressing fluctuations of the electric potential at the internal ground circuit GND2. Effects and operations of the each part of the circuits corresponding to the electrical loads 103b to 103f (not shown) are similar to those described above with respect to the electrical load 103a.

The base resistor 165, the current limiting resistor 166, the constant voltage diode 167, and the clip diode 168 of the negative line breakage abnormality detection circuit 160C have effects similar to those shown in FIG. 3. When there is a breakage at the external common negative lines 104x and 104y connected to the common terminals COM1 and COM2, the determination element 161 is turned on by the commutation surge current, the logical level of the alarm signal MNT is changed to "H" to input the occurrence of the breakage abnormality at the negative lines to the microprocessor 120C.

While the external common negative line 104 is used in FIG. 3, the external common negative lines 104x and 104y are used in Embodiment 3 as shown in FIG. 9. The common terminal COM is also divided into the two common terminals COM1 and COM2. Thus, no concentration of currents commutated from the electrical loads 103a to 103f occurs at the common terminals COM1 and COM2, and it is therefore possible to prevent an over-current from flowing to the common terminals COM1 and COM2. Although it is desirable to extend the external common negative lines 104x and 104y to the position of the load ground GND3, they are connected to the vehicle body in the position of the separated ground GND4 provided in the vicinity of the common terminals COM1 and COM2 in order to keep the number of wirings small.

When the over-current detection circuits 350a to 350f generate the alarm signals OC1 to OC6, the microprocessor 120C stops the setting command outputs IT1 to IT6 using a control program which is not shown and stores the information of the occurrence of an over-current abnormality in the data memory 123 as abnormality history information. The operation of Embodiment 3 is otherwise similar to that shown in the flow chart in FIG. 8.

(33) Summaries and Characteristics of Embodiment 3

Embodiment 3 can be summarized and characterized as follows.

As apparent from the above description, the power supply control device for on-vehicle electrical loads according to Embodiment 3 of the invention is a power supply control device comprising a power supply control unit 100C. The power supply control unit 100C includes a plurality of load power supply circuits SPLa to SPLf (hereinafter represented by SPLn) for supplying power from a DC driving power supply 101 to a plurality of electrical loads 103a to 103f (hereinafter represented by 103n), respectively, through switching elements 181a to 181f (hereinafter represented by 181n), a plurality of load commutation circuits SWLa to SWLf (hereinafter represented by SWLn) for commutating load currents to the electrical loads 103n, and a power supply control circuit PCNTC for supplying energization command outputs DRn to the switching elements (181n). The load power supply circuits SPLn, the load commutation circuits SWLn, and the power supply control circuit PCNTC are contained in a housing 100a of the power supply control unit 100C. The power supply control device is characterized as follows. Commutation diodes 146a to 146f (hereinafter represented by 146n) are provided to the load commutation circuits SWLn, respectively, and the commutation diodes 146n are connected in parallel with the respective electrical loads 103n to cause currents which have been flowing through the electrical loads 103n to flow back when the switching elements 181n of the load power supply circuits SPLn are turned off. The commutation diodes 146n are connected to a vehicle body outside the housing 100a separately from an internal ground circuit GND2 of the power supply control unit 100C by external common negative lines 104x and 104y constituting an external negative line. The power supply control circuit PCNTC includes an individual abnormality detection circuit IADETC, a negative line breakage abnormality detection circuit 160C, abnormality processing means 811, 821, 831, and 841, and abnormality history storing means 813, 823, 843, 833a, and 833b. The power supply control circuit PCNTC is configured by using a microprocessor 120C. The microprocessor 120C is configured to operate in conjunction with a non-volatile program memory 121C in which at least a control program serving as an energization command means for the switching elements 181n is stored, a data memory 123, a RAM memory 122 for arithmetic processes, and a multi-channel A-D converter 124. The individual abnormality detection circuit IADETC includes a plurality of power supply state detection circuits PDETCa to PDETCf (hereinafter represented by PDETCn) for detecting amounts of power, specifically, load currents Ifn supplied to the electrical loads 103n and means for determining an individual abnormal state when the amount of power supplied to a certain electrical load among the electrical loads 103n deviates from a target amount of supplied power. The individual abnormal state is either breakage or shorting of at least one of the electrical load, the positive side wiring 103P of the electrical load, the negative side wiring 103N of the electrical load, and the switching element associated with the electrical load. The negative line breakage abnormality detection circuit 160C is a circuit for determining a breakage abnormality at the external common negative lines 104x and 104y by detecting that an electric potential on an anode side of each commutation diode 146n is different from an electric potential at the internal ground circuit GND2 of the power supply control unit 100C. The abnormality processing means 811, 821, 831, and 841 are means for stopping the energization command output to the switching elements when at least either an individual abnormality or a breakage abnormality at the external individual negative lines 104n is detected and for providing a notice of the abnormality. The abnormality history storing means 813, 823, 843, 833a, and 833b are means for storing and saving the history of occurrence of individual abnormalities and breakage abnormalities at the external common negative lines 104x and 104y in the data memory 123 with identification of the abnormalities.

In the power supply control device for on-vehicle electrical loads in Embodiment 3, the commutation diodes 146n connected in parallel with the plurality of electrical loads 103n, respectively, supplied with power from the DC driving power supply 101 through the respective switching elements 181n are connected to the vehicle body outside the housing 100a of the power supply control unit 100C separately from the internal ground circuit GND2 of the power supply control unit 100C by the external common negative lines 104x and 104y. Therefore, neither load current nor commutation current flows to the internal ground circuit GND2 of the power supply control unit 100C, which is advantageous in that the electric potential at the internal ground circuit GND2 can be stabilized to allow the power supply control circuit PCNTC of the power supply control unit 100C to be operated with stability. Breakage abnormalities and shorting abnormalities at the electrical loads 103n, the positive side wirings 103P thereof, the negative side wirings 103N thereof, and the switching elements 181n are detected by the individual abnormality detection circuit IADETC, and breakages at the external common negative lines 104x and 104y associated with the commutation diodes 146n are detected by the negative line breakage abnormality detection circuit 160C. Measures are taken against those abnormalities, and the abnormalities are identified and stored by the abnormality history storing means 813, 823, 843, 833a, and 833b. Therefore, the efficiency of maintenance and inspection can be advantageously improved by reading history information at the time of maintenance and inspection.

In Embodiment 3, the power supply state detection circuits PDETCn have current detecting differential amplifier circuits 150a to 150f (hereinafter represented by 150n), respectively. A current detecting differential amplifier circuit 150n is a circuit for amplifying a differential voltage across a current detection resistor 141n connected between a switching element 181n and an electrical load 103n with a differential amplifier 151n to generate a monitoring voltage Efn proportionate to a load current Ifn at the electrical load 103n. A non-inverting input terminal of the differential amplifier 151n is connected to a point of connection between the switching element 181n and the current detection resistor 141n through first and second series resistors 142n and 152n. A first negative voltage suppressing diode 144n is connected between a point of connection between the first and second series resistors 142n and 152n and the internal ground circuit GND2 of the power supply control unit 100C. An inverting input terminal of the differential amplifier 151n is connected to a point of connection between the current detection resistor 141n and the electrical load 103n through third and fourth series resistors 143n and 153n. A second negative voltage suppressing diode 145n is connected between a point of connection between the third and fourth series resistors 143n and 153n and the internal ground circuit GND2 of the power supply control unit 100C. Thus, an excessively high negative voltage applied to the differential amplifier 151n when there is a breakage at the external common negative lines 104x and 104y for the commutation diodes 146n is suppressed by the first and second negative voltage suppressing diodes 144n and 145n. This configuration is characterized in that damage to the differential amplifier 151n by a surge voltage generated by the electrical load 103n can be prevented when there is a breakage at the external common negative lines 104x and 104y. The configuration is also characterized in that a surge current superimposed on the internal ground circuit GND2 of the power supply control unit 100C when a breakage occurs at the external common negative lines 104x and 104y can be suppressed to a very small value by the first and third series resistors 142n and 143n.

In Embodiment 3, the power supply control circuit PCNTC includes a control power supply circuit 110 and over-current detection circuits 350a to 350f (hereinafter represented by 350n). The control power supply circuit 110 is configured to generate a stabilized control power supply voltage Vcc having a value lower than a driving power supply voltage Vb supplied by the DC driving power supply 101. The power supply voltage applied to a differential amplifier 151n is the driving power supply voltage Vb. The monitoring voltage Efn output by the differential amplifier 151n is clamped to the level of the control power supply voltage Vcc by the voltage clamping diode 356n. The over-current detection circuit 350n is provided in association with each of the plurality of electrical loads 103n to determine the presence of a shorting abnormality at the electrical load 103n and a grounding abnormality at the positive side wiring 103P of the same detecting whether the load current at the electronic load associated is excessively large beyond a predetermined value. The over-current detection circuit 350n includes a comparison circuit 351n which generates an over-current determination output when a voltage E0 upstream of the monitoring voltage Efn obtained by the current detecting differential amplifier circuit 150n exceeds a predetermined value equal to or higher than the control power supply voltage Vcc and provides the alarm signal OCn of the shorting abnormality generation to the microprocessor 120C. This configuration is characterized in that accurate current detection can be performed by clamping the monitoring voltage Ef to the control power supply voltage Vcc at a normal maximum value of the load current and in that the over-current detection circuit 350n can be activated using the upstream voltage E0 when an over-current occurs.

In Embodiment 3, the abnormality processing means 811, 821, 831, and 841 stop energization commands to the electrical loads and provide an abnormality notice not only when a breakage abnormality is detected at the negative lines but also when either of a shorting abnormality at an electrical load 103n or a grounding abnormality at the positive side wiring 103P of an electrical load 103n is detected. The abnormality history storing means 813, 823, 843, 833a, and 833b store and save information on shorting abnormalities at the electrical loads 103n and grounding abnormalities at the positive side wirings 103P in the data memory 123 in addition to the history of occurrence of breakage abnormalities. This configuration is characterized in that comprehensive history information can be stored in accordance with the contents of abnormalities to facilitate maintenance and inspections because an energization command to an electrical load 103n is stopped and an abnormality notice is provided not only when there is a breakage abnormality but also when there is a shorting abnormality at the electrical load 103n or a grounding abnormality at the positive side wiring 103P thereof.

OTHER EMBODIMENTS

In the above-described embodiments, the power supply state detection circuits providing inputs to the microprocessors 120A to 120C are categorized into two types, i.e., a load current state detecting circuit and a load voltage state detecting circuit. A load current state detecting circuit provides two types of signals, i.e., a monitoring voltage Efn having an analog value proportionate to a load current Ifn measured by a current detecting differential amplifier circuit 150n and an alarm signal OCn which is a logical signal obtained through compassion and determination at an over-current detection circuit 350n. A load voltage state detecting circuit provides two types of signals, i.e., a load voltage measurement input Vfn having an analog value proportionate to a load voltage detected by a load voltage monitoring circuit 300n and alarm signals OVn and SVn which are logical signals obtained through compassion and determination at a load voltage monitoring circuit 170n. Embodiments 1 to 3 represent proper use of such circuits in practical consideration to reduction of control burden on a microprocessor and reduction in the number of analog inputs. For example, in Embodiment 2 shown in FIG. 6, the load voltage monitoring circuits 300n of the analog signal type may be replaced with the load voltage monitoring circuits 170n of the comparison/determination type in Embodiment 1 shown in FIG. 2 to omit the determination of an over-resistance and the determination of an under-resistance which are determinations based on the software of a microprocessor.

A breakage abnormality can be detected using the over-resistance determination means constituted by step 440 in FIG. 4 or step 830 in FIG. 8 instead of using the negative line breakage abnormality detection circuits 160A to 160C. In the case of the over-resistance determination means, the commutating function of the commutation diodes 146a to 146f is lost when a breakage occurs at the negative line. Therefore, an excessively high load voltage is required to allow a target current Isn to be conducted. Consequently, there will be a state of over-resistance from which the breakage abnormality at the negative line will be detected.

However, a problem remains in that the detected breakage abnormality cannot be identified as none of a breakage at the electrical loads 103a to 103f, a breakage at the positive side wirings 103P or the negative side wirings 103N, and a breakage at the external common negative line 104, 104x, or 104y. For example, when a breakage abnormality has occurred at a particular electrical load, what is required is to stop the energization command output to the same electrical load to ensure safety, and there is no need for stopping the energization command outputs to all other electrical loads. In the case of a breakage at the external common negative line 104, 104x or 104y, it is required to stop the energixation command outputs to all electrical loads associated with the external common negative line to stop an induced surge voltage applied to the switching circuits 130n or 180n quickly. Therefore, abnormality types must be separately detected.

Various modification and changes may be easily made to the invention by those skipped in the art without departing from the scope and spirit of the invention, and it should be construed that the invention is not limited to the embodiments illustrated herein.

What is claimed is:

1. A power supply control device for on-vehicle electrical loads, comprising a power supply control unit including a plurality of load power supply circuits for supplying power from a DC driving power supply to a plurality of electrical loads respectively through switching elements, a plurality of load commutation circuits for commutating load currents to the electrical loads, and a power supply control circuit for supplying an energization command output to the switching elements, and the load power supply circuits, the load commutation circuits, and the power supply control circuit being contained in a housing of the power supply control unit, wherein:

commutation diodes are provided in the respective load commutation circuits, and the commutation diodes are connected in parallel with the respective electrical loads to cause currents which has been flowing through the electrical loads to flow back when the switching elements of the load power supply circuits are turned off, and the commutation diodes are connected to a vehicle body outside the housing separately from an internal ground circuit of the power supply control unit by an external common negative line;

the power supply control circuit includes an individual abnormality detection circuit, a negative line breakage abnormality detection circuit, abnormality processing means, and abnormality history storing means;

the power supply control circuit is configured by using a microprocessor, and the microprocessor is configured to operate in conjunction with a non-volatile program memory in which at least a control program serving as energization command means for the switching elements is stored, a data memory, a RAM memory for arithmetic processes, and a multi-channel A-D converter;

the individual abnormality detection circuit includes a plurality of power supply state detection circuits for detecting amounts of power supplied to the electrical loads and means for determining an individual abnormal state when the amount of power supplied to a certain electrical load among the electrical loads deviates from a target amount of supplied power, the individual abnormal state is either breakage or shorting of at least one of the certain electrical load, a positive side wiring of the certain electrical load, a negative side wiring of the certain electrical load, and the switching element associated with the certain electrical load;

the negative line breakage abnormality detection circuit is a circuit for determining a breakage abnormality of the external common negative line by detecting that an electric potential on an anode side of each commutation diode is different from an electric potential at the internal ground circuit of the power supply control unit;

the abnormality processing means is means for stopping the energization command output to the switching elements when at least either an individual abnormality or a breakage abnormality at the external common negative line is detected and for providing a notice of the abnormality; and the abnormality history storing means is means for storing and retaining history of occurrence of individual abnormalities and breakage abnormalities at the external common negative line in the data memory with identification of the abnormalities.

2. The power supply control device for on-vehicle electrical loads, according to claim 1, wherein:

voltage clamping diodes are connected to the respective switching elements to suppress an off-voltage thereof;

the negative line breakage abnormality detection circuit includes a series circuit including a constant voltage diode which starts conducting at a voltage lower than the clamping voltage of the voltage clamping diode, a current limiting resistor connected in series with the constant voltage diode, and a clip diode whose anode is connected to the internal ground circuit of the power supply control unit, and a determination element operating in accordance with the state of energization of the series circuit;

the series circuit is connected between the internal ground circuit of the power supply control unit and an anode terminal each of the commutation diodes; and the determination element detects a breakage at the external common negative line according to an induced surge voltage at the electrical load generated when there is a breakage at the external common negative line by detecting an electric potential at the cathode of the clip diode and supplies an alarm signal to the microprocessor.

3. The power supply control device for on-vehicle electrical loads, according to claim 1, wherein:
a bypass resistor is connected in parallel with each of the commutation diodes;
the negative line breakage abnormality detection circuit includes a detection resistor which is supplied with power from each of the bypass resistor through a block diode when there is a breakage at the external common negative line with the switching elements in an on-state, and a determination element; and
the determination element determines that a breakage has occurred at the external common negative line based on the fact that the detection resistor has been energized and supplies an alarm signal to the microprocessor.

4. The power supply control device for on-vehicle electrical loads, according to claim 1, wherein:
the anode terminals of the commutation diodes are connected to the vehicle body outside the housing through the external common negative line;
a separated ground connecting the external common negative line to the vehicle body is separated from at least a unit ground which connects the internal ground circuit of the power supply control unit to the vehicle body; and
the distance between a load ground connecting negative terminals of the electrical loads to the vehicle body and the separated ground is smaller than the distance between the unit ground and the separated ground.

5. The power supply control device for on-vehicle electrical loads, according to claim 1, wherein:
each of the power supply state detection circuits has a current detecting differential amplifier circuit, the current detecting differential amplifier circuit is a circuit for amplifying a differential voltage across a current detection resistor connected between the electrical load and the switching element associated with the same with a differential amplifier to generate a monitoring voltage Ef proportionate to a load current If at the electrical load;
a non-inverting input terminal of the differential amplifier is connected to a point of connection between the switching element and the current detection resistor through first and second series resistors, and a first negative voltage suppressing diode is connected between a point of connection between the first and second series resistors and the internal ground circuit of the power supply control unit;
an inverting input terminal of the differential amplifier is connected to a point of connection between the current detection resistor and the electrical load through third and fourth series resistors and, and a second negative voltage suppressing diode is connected between a point of connection between the third and fourth series resistors and the internal ground circuit of the power supply control unit; and
an excessively high negative voltage applied to the differential amplifier when there is a breakage at the external common negative line for the commutation diodes is suppressed by the first and second negative voltage suppressing diodes.

6. The power supply control device for on-vehicle electrical loads, according to claim 1, wherein:
each of the power supply state detection circuits has a load voltage monitoring circuit;
the load voltage monitoring circuit includes either an analog input circuit which provides the microprocessor with the input of a voltage proportionate to the load voltage applied to one of voltage dividing resistors connected between a point of connection between the electrical load and the current detection resistor associated therewith and the internal ground circuit of the power supply control unit or a comparison/determination circuit which provides the microprocessor with the input of the result of determination made by comparing the voltage proportionate to the load voltage applied to the one of the voltage dividing resistors with a predetermined threshold; and
a clip diode whose anode terminal is connected to the internal ground circuit is connected in parallel with the one of the voltage dividing resistors to suppress an excessively high negative voltage applied to the load voltage monitoring circuit when there is a breakage at the external common negative line for the commutation diodes.

7. The power supply control device for on-vehicle electrical loads, according to claim 5, wherein:
the microprocessor receives the input of an analog signal which is the monitoring voltage Ef supplied from the current detecting differential amplifier and the input of an analog signal which is a power supply voltage measurement signal supplied from a power supply voltage measuring circuit;
each of the power supply state detection circuits includes a comparison/determination circuit forming a load voltage monitoring circuit;
the non-volatile program memory includes a control program including negative feedback control means which forms the energization command means;
the negative feedback control means controls the turning on/off of the switching element by generating the energization command output having a variable duty in accordance with an integrated value of a deviation between an energization target current Is for the electrical load and the load current If detected by a current detecting differential amplifier circuit;
the power supply voltage measuring circuit includes a voltage dividing resistor for dividing a driving power supply voltage Vb provided by the DC driving power supply and inputting the resultant voltage to the microprocessor; and
the load voltage monitoring circuit includes a comparison/determination circuit which provides the microprocessor with the input of a determination made by comparing a voltage proportionate to a load voltage applied to one of voltage dividing resistors connected between a point of connection between the current detection resistor and the electrical load and the internal ground circuit of the power supply control unit with a predetermined threshold.

8. The power supply control device for on-vehicle electrical loads, according to claim 7, wherein:
the power supply control circuit includes leakage a resistor having a high resistance connected in parallel with the switching element and a load voltage dividing circuit provided on an output side of each of the switching elements;
the comparison/determination circuit includes first and second comparison/determination circuits for comparing a voltage applied to the one of the voltage dividing resistors of the load voltage monitoring circuit with each of first and second threshold voltages proportionate to the driving power supply voltage;
the leakage resistor supplies such a very small load current that the electrical load will not be activated when the switching element is off;

the load voltage dividing circuit includes a bypass resistor which is connected between either a point connecting the switching element and the current detection resistor or a point connecting the current detecting resistor and the electrical load and either the anode terminal of the commutation diode or the internal ground circuit of the power supply control unit;

the first threshold voltage is proportionate to a voltage applied to the bypass resistor through the leakage resistor at the time of occurrence of a breakage abnormality including a breakage at either the electrical load, or positive side wiring or negative side wiring of the electrical load;

the second threshold voltage is proportionate to a voltage applied to the bypass resistor at the time of occurrence of a shorting abnormality at the switching element and a power line shorting that the positive side wire of the electrical load is contacted to a power supply line;

when a breakage abnormality occurs, the output logic of the first comparison/determination circuit is inverted to supply an alarm signal indicating the breakage abnormality to the microprocessor; and when either of a shorting abnormality at the switching element or a power line shorting abnormality at the positive side wiring of the electrical load is occurred, the output logic of the second comparison/determination circuit is inverted to supply an alarm signal indicating either of the shorting abnormality at the switching element or the power line shorting abnormality at the positive side wiring to the microprocessor.

9. The power supply control device for on-vehicle electrical loads, according to claim 7, wherein:

the non-volatile program memory includes a control program including load resistance estimation means and at least either under-resistance determination means or over-resistance determination means;

the load resistance estimation means performs a calculation to estimate a current resistance value of the electrical load, which is equivalent to $\gamma Vb/If$, based on an energization duty $\gamma$ of the energization command output provided by the negative feedback control means, a driving power supply voltage Vb measured by the power supply measuring circuit, and a load current If for the electrical load detected by the current detecting differential amplifier circuit;

the under-resistance determination means generates an abnormality determination output when the load resistance estimated by the load resistance estimation means is smaller than a minimum load resistance in a low temperature environment, thereby providing a notice of the occurrence of any of a shorting abnormality at the electrical load, a grounding abnormality that is contact between the positive side wiring and the vehicle body, and a shorting abnormality at the switching element in the duration of the energization command for the switching element; and the over-resistance determination means generates an abnormality determination output when the load resistance estimated by the load resistance estimation means is greater than a maximum load resistance in a high temperature environment, thereby providing a notice of the occurrence of any of a breakage abnormality at the electrical load, a breakage abnormality at the positive side wiring, a breakage abnormality at the negative side wiring, a power line shorting abnormality that the positive side wiring of the electrical load is connected to a power supply line of the DC driving power supply, and a breakage abnormality at the switching element in the duration of the energization command for the switching element.

10. The power supply control device for on-vehicle electrical loads, according to claim 9, wherein:

the under-resistance determination means further includes confirmative determination means; and when the under-resistance determination means determines that there is a state of under-resistance, the confirmative determination means stores the fact that no shorting abnormality has occurred at the switching element as abnormality history information if the load current If has become zero after the energization command output to the switching element was stopped.

11. The power supply control device for on-vehicle electrical loads, according to claim 5, wherein:

the power supply control circuit includes negative feedback control circuit;

the non-volatile program memory includes a control program including target current command means which constitutes the energization command means;

a power supply voltage measurement signal which is an analog signal supplied by a power supply voltage measurement circuit and a load voltage measurement signal which is an analog signal supplied by a load voltage monitoring circuit are input to the microprocessor;

the target current command means is means for generating a setting command output having a variable duty proportionate to an energization target current Is for the electrical load;

the negative feedback control circuit controls the turning on/off of the switching element by generating the energization command output having a variable duty in accordance with an integrated value of a deviation between a set voltage Es proportionate to a target current Is obtained by smoothing the setting command output and a monitoring voltage Ef proportionate to the load current If detected by the current amplifying differential amplifier circuit;

the power supply voltage measuring circuit includes a voltage dividing resistor for dividing the driving power supply voltage Vb supplied by the DC driving power supply and inputting the resultant voltage to the microprocessor; and the load voltage monitoring circuit is an analog circuit which supplies the microprocessor with a load voltage measurement input proportionate to a load voltage applied to a voltage dividing resistor connected between a point connecting the current detection resistor and the electrical load and the internal ground circuit of the power supply control unit.

12. The power supply control device for on-vehicle electrical loads, according to claim 11, wherein:

the power supply control circuit includes a leakage resistors having a high resistance connected in parallel with the switching element and a load voltage dividing circuit provided on the output side of the switching element;

the non-volatile program memory includes a program including first and second comparison/determination means for comparing a load voltage obtained by the load voltage monitoring circuit with each of first and second threshold voltages;

the leakage resistor supplies such a very small load current that the electrical load will not be activated when the switching element is off;

the load voltage dividing circuit includes a bypass resistor which is connected between either a point connecting the switching element and the current detection resistor or a point connecting the current detection resistor and the electrical load and either the anode terminal of the commutation diode or the ground circuit of the power supply control unit;

the first threshold voltage is proportionate to a voltage applied to the bypass resistor through the leakage resistor at the time of occurrence of a breakage abnormality including a breakage at any of the electrical load, the positive side wiring of the electrical load, and the negative side wiring of the electrical load;

the second threshold voltage is proportionate to a voltage applied to the bypass resistor at the time of occurrence of either shorting abnormality at the switching element or the power line shorting that the positive wiring of the electrical load is contacted to a power supply line;

when the breakage abnormality occurs, the output logic of the first comparison/determination means is inverted to provide a notice of the breakage abnormality; and when there is either shorting abnormality at the switching element or the power line shorting abnormality at the positive side wiring of the electrical load, the output logic of the second comparison/determination means is inverted to provide a notice of the abnormality.

13. The power supply control device for on-vehicle electrical loads, according to claim 11, wherein:

the non-volatile program memory includes a control program including load resistance estimation means and at least either under-resistance determination means or over-resistance determination means;

the load resistance estimation means performs a calculation to estimate a current resistance value of the electrical load, which is equivalent to Vf/Is, based on a load voltage Vf measured by the load voltage monitoring circuit and a target command current Is instructed by a target current command means;

the under-resistance determination means generates an abnormality determination output when the load resistance estimated by the load resistance estimation means is smaller than a minimum load resistance in a low temperature environment, thereby providing a notice of the occurrence of any of a shorting abnormality at the electrical load, a grounding abnormality that is contact between the positive side wiring and the vehicle body, and a shorting abnormality at the switching element in the duration of the energization command for the switching element; and the over-resistance determination means generates an abnormality determination output when the load resistance estimated by the load resistance estimation means is greater than a maximum load resistance in a high temperature environment, thereby providing a notice of the occurrence of any of a breakage abnormality at the electrical load, a breakage abnormality at the positive side wiring, a breakage abnormality at the negative side wiring, a power line shorting abnormality that the positive side wiring of the electrical load is connected to a power supply line of the DC driving power supply, and a breakage abnormality at the switching element in the duration of the energization command for the switching element.

14. The power supply control device for on-vehicle electrical loads, according to claim 13, wherein:

the over-resistance determination means further includes confirmative determination means; and when the over-resistance determination means determines that there is a state of over-resistance, the confirmative determination means stores the fact that neither the shorting abnormality at the switching element nor the power line shorting abnormality at the positive side wiring has occurred as abnormality history information if the load voltage Vf has dropped after the setting command output to the negative feedback control circuit was stopped.

15. The power supply control device for on-vehicle electrical loads, according to claim 7, wherein:

the power supply control circuit includes a control power supply circuit and an over-current detection circuit;

the control power supply circuit is configured to generate a stabilized control power supply voltage Vcc having a value lower than the driving power supply voltage Vb supplied by the DC driving power supply;

the power supply voltage applied to the differential amplifier is the driving power supply voltage Vb, the monitoring voltage Ef output by the differential amplifier being limited to the level of the control power supply voltage Vcc by the voltage clamping diode;

the over-current detection circuit is provided in association with each of the plurality of electrical loads to determine the presence of a shorting abnormality at the electrical load and a grounding abnormality at the positive side wiring of the same by detecting whether the load current at the electrical load associated is excessively high beyond a predetermined value; and the over-current detection circuit includes a comparison circuit which generates an over-current determination output to supply an alarm signal indicating the occurrence of a shorting abnormality to the microprocessor when a voltage E0 upstream of the monitoring voltage Ef obtained by the current detecting differential amplifier circuit exceeds a predetermined value equal to or higher than the control power supply voltage Vcc.

16. The power supply control device for on-vehicle electrical loads, according to claim 11, wherein:

the power supply control circuit includes a control power supply circuit and an over-current detection circuit;

the control power supply circuit is configured to generate a stabilized control power supply voltage Vcc having a value lower than the driving power supply voltage Vb supplied by the DC driving power supply;

the power supply voltage applied to the differential amplifier is the driving power supply voltage Vb, the monitoring voltage Ef output by the differential amplifier being limited to the level of the control power supply voltage Vcc by the voltage clamping diode;

the over-current detection circuit is provided in association with each of the plurality of electrical loads to determine the presence of a shorting abnormality at the electrical load and a grounding abnormality at the positive side wiring of the same by detecting whether the load current at the electrical load associated is excessively high beyond a predetermined value; and the over-current detection circuit includes a comparison circuit which generates an over-current determination output to supply an alarm signal indicating the occurrence of a shorting abnormality to the microprocessor when a voltage E0 upstream of the monitoring voltage Ef obtained by the current detecting differential amplifier circuit exceeds a predetermined value equal to or higher than the control power supply voltage Vcc.

17. The power supply control device for on-vehicle electrical loads, according to claim 1, wherein:

the abnormality processing means stops energization commands to the electrical loads and provides an abnormality notice not only when a breakage abnormality is detected at the negative line but also when either of a shorting abnormality at each of the electrical loads or a grounding abnormality at the positive side wiring of each of the electrical loads is detected; and the abnormality history storing means stores and saves information on shorting abnormalities at the electrical loads and grounding abnormalities at the positive side wirings in the data memory in addition to the history of occurrence of breakage abnormalities.

* * * * *